(12) United States Patent
Sadeghi

(10) Patent No.: US 12,424,470 B2
(45) Date of Patent: Sep. 23, 2025

(54) SYSTEMS AND METHODS FOR AUTONOMOUS PROCESS CONTROL AND OPTIMIZATION OF SEMICONDUCTOR EQUIPMENT USING LIGHT INTERFEROMETRY AND REFLECTOMETRY

(71) Applicant: LAM RESEARCH CORPORATION, Fremont, CA (US)

(72) Inventor: Hossein Sadeghi, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 792 days.

(21) Appl. No.: 17/762,777

(22) PCT Filed: Sep. 21, 2020

(86) PCT No.: PCT/US2020/051726
§ 371 (c)(1),
(2) Date: Mar. 23, 2022

(87) PCT Pub. No.: WO2021/061541
PCT Pub. Date: Apr. 1, 2021

(65) Prior Publication Data
US 2022/0344184 A1 Oct. 27, 2022

Related U.S. Application Data

(60) Provisional application No. 62/905,738, filed on Sep. 25, 2019.

(51) Int. Cl.
*H01L 21/67* (2006.01)
*C23C 16/52* (2006.01)
(Continued)

(52) U.S. Cl.
CPC .. *H01L 21/67276* (2013.01); *H01J 37/32642* (2013.01); *H01L 21/67253* (2013.01); *H01L 21/68721* (2013.01); *C23C 16/52* (2013.01)

(58) Field of Classification Search
CPC ............ H01L 21/67276; H01J 37/32642
(Continued)

(56) References Cited

U.S. PATENT DOCUMENTS 9,972,478 B2 * 5/2018 Guha ................ H01L 21/67069
10,410,832 B2 * 9/2019 Zhang ............... H01J 37/32082
(Continued)

FOREIGN PATENT DOCUMENTS

JP   2003075123 A   3/2003
JP   2009534854 A   9/2009
(Continued)

OTHER PUBLICATIONS

Search Report for corresponding Japanese Application No. 2022-517747 dated Jun. 20, 2024.
(Continued)

*Primary Examiner* — Jack Chiang
*Assistant Examiner* — Suchin Parihar

(57) ABSTRACT

At least one laser sensor and a controller are embedded into a substrate processing system communicating with a remote big data and machine learning server receiving/sending data from/to a fleet of substrate processing systems for autonomous process control and optimization. The laser sensor is arranged proximate to a region of the substrate processing system and is configured to capture first data from at least one of an edge coupling ring and a semiconductor substrate transported from/to the processing chamber to/from the region. The controller is configured to receive the first data from the laser sensor, process the first data to generate second data, transmit the second data to a remote server via
(Continued)

a network, receive third data from the remote server via the network in response to sending the second data to the remote server, and operate the substrate processing system based on the third data for process optimization.

16 Claims, 28 Drawing Sheets

(51) Int. Cl.
   *H01J 37/32* (2006.01)
   *H01L 21/687* (2006.01)
(58) Field of Classification Search
   USPC .......................................................... 716/50
   See application file for complete search history.

(56) References Cited

U.S. PATENT DOCUMENTS

| | | | |
|---|---|---|---|
| 2005/0020073 A1 | 1/2005 | Perry | |
| 2007/0249071 A1 | 10/2007 | Lian et al. | |
| 2013/0105085 A1* | 5/2013 | Yousif | H01L 21/67103 |
| | | | 118/724 |
| 2016/0148850 A1 | 5/2016 | David | |
| 2016/0211165 A1 | 7/2016 | McChesney et al. | |
| 2017/0263478 A1* | 9/2017 | McChesney | H01J 37/20 |
| 2018/0010243 A1 | 1/2018 | Lee et al. | |
| 2018/0082826 A1 | 3/2018 | Guha et al. | |
| 2020/0110390 A1* | 4/2020 | Banna | G05B 19/41875 |
| 2022/0293442 A1* | 9/2022 | Kumar | C23C 16/45544 |

FOREIGN PATENT DOCUMENTS

| | | | |
|---|---|---|---|
| JP | 2019114612 A | 7/2019 | |
| JP | 2019537240 A | 12/2019 | |
| KR | 1020160053341 A | 5/2016 | |
| KR | 20160092940 A | 8/2016 | |
| WO | WO-2019130159 A1 | 7/2019 | |

OTHER PUBLICATIONS

International Search Report and Written Opinion of the ISA issued in PCT/US2020/051726, mailed Jan. 25, 2021; ISA/KR.
Notice of Reasons for Refusal for corresponding Japanese Application No. 2022-517747 dated Jun. 18, 2024.
Office Action for corresponding Taiwanese Application No. 109133080 dated Apr. 24, 2024.
Decision for Grant of Patent for Korean Application No. 10-2022-7013382 dated Feb. 4, 2025.

* cited by examiner

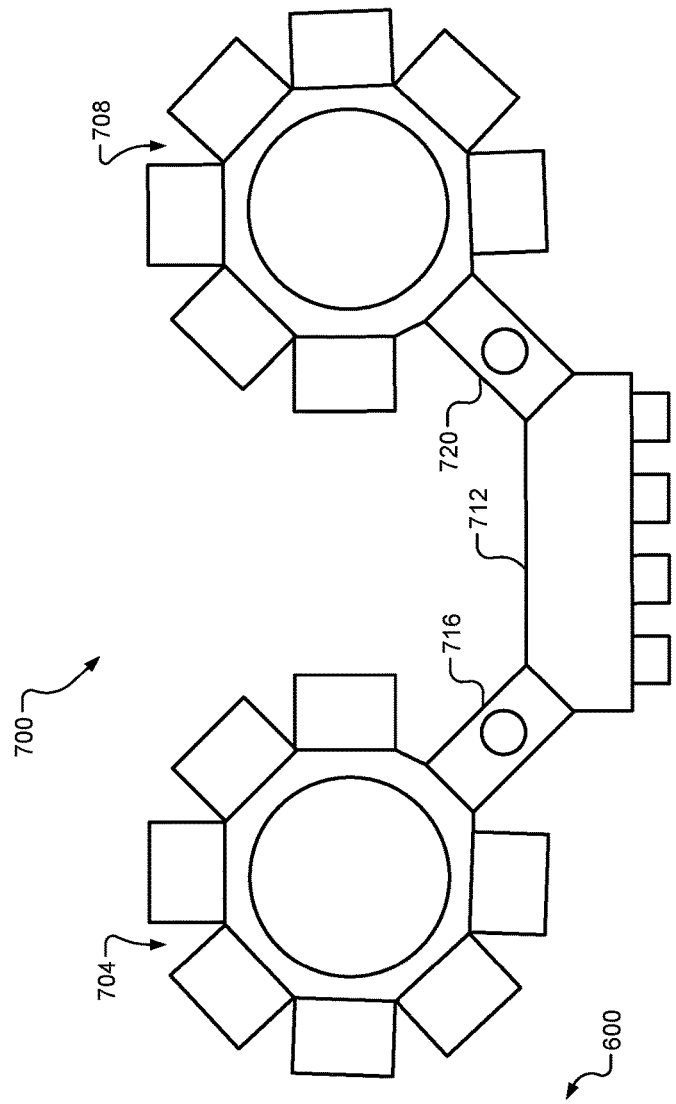
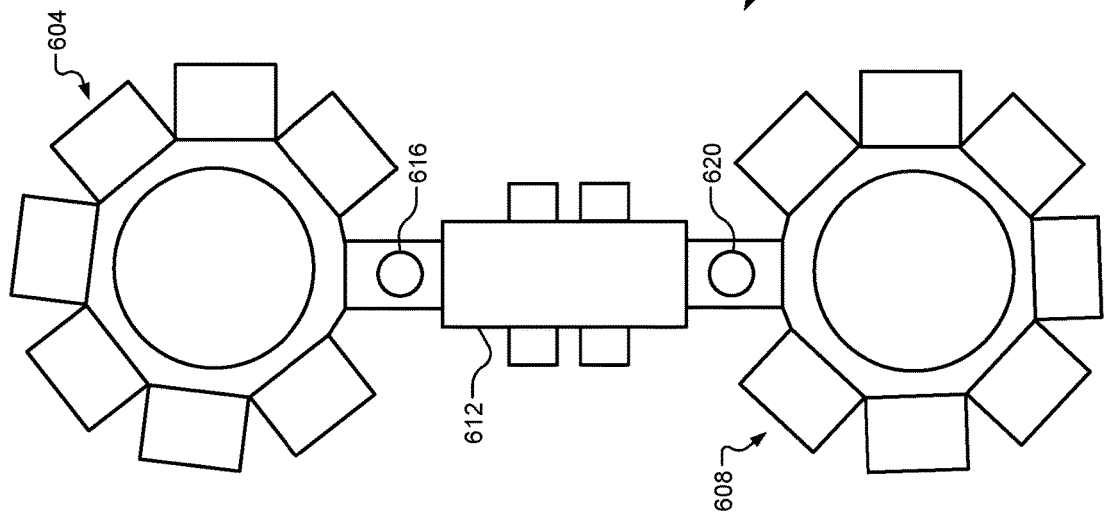

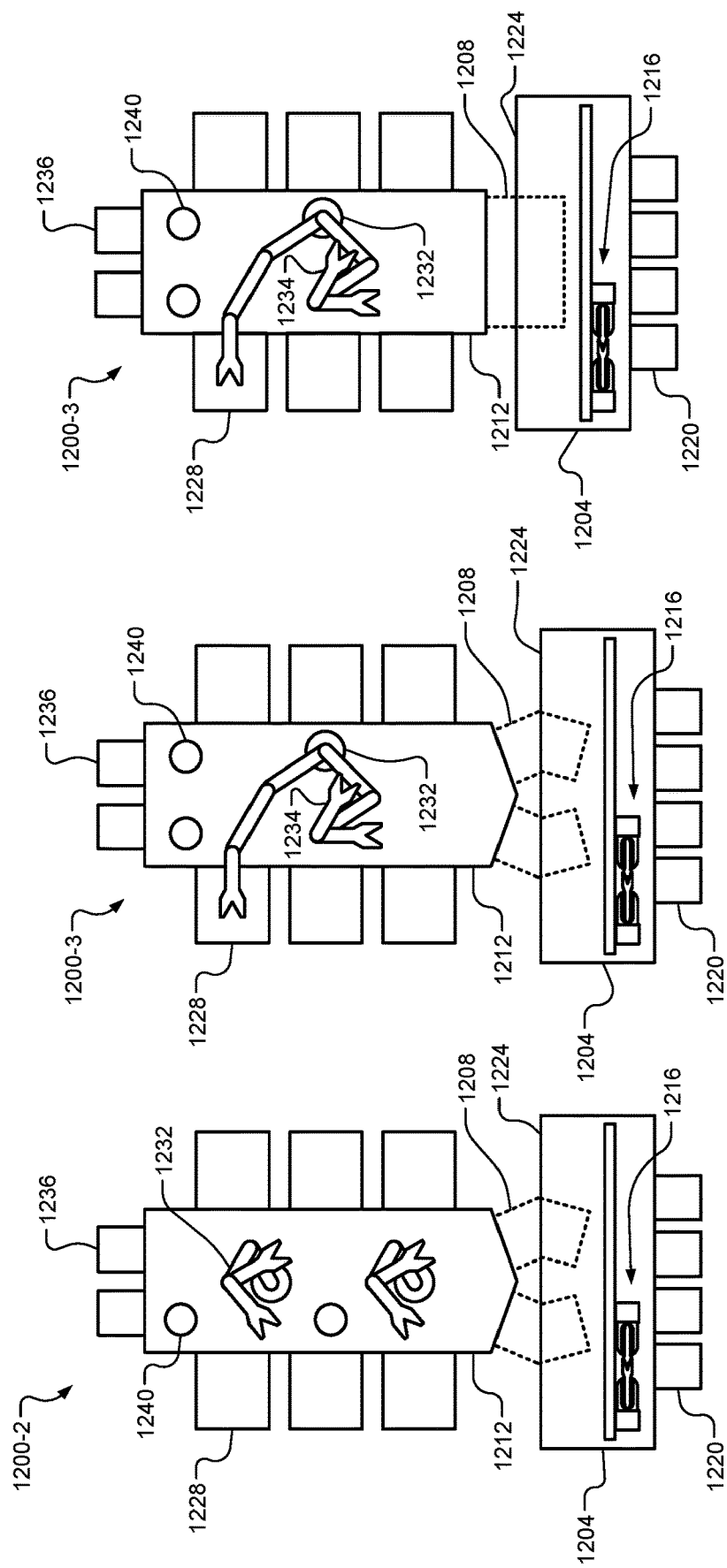

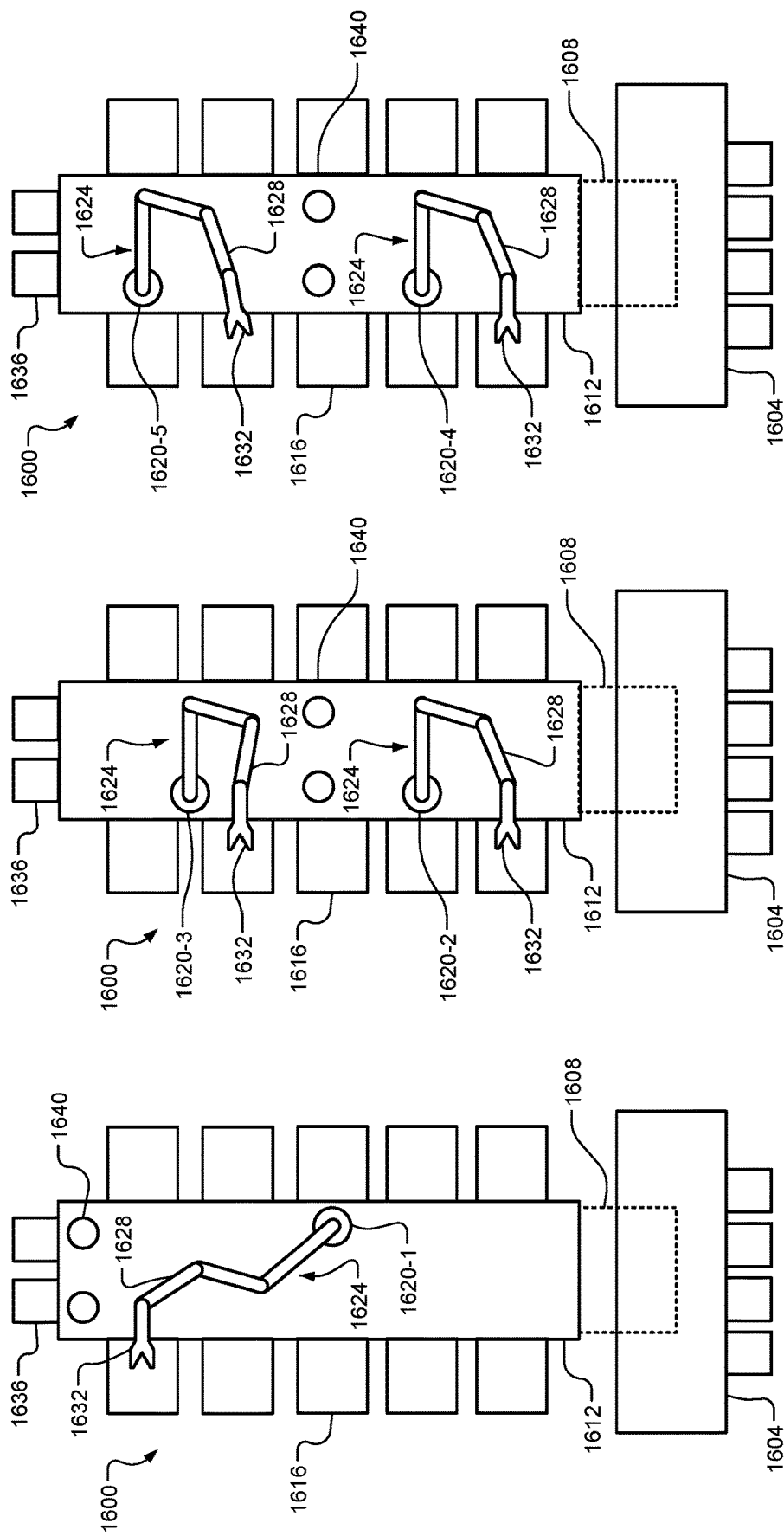

Wafer before etch

Wafer after etch

Wafer before deposition

Wafer after deposition

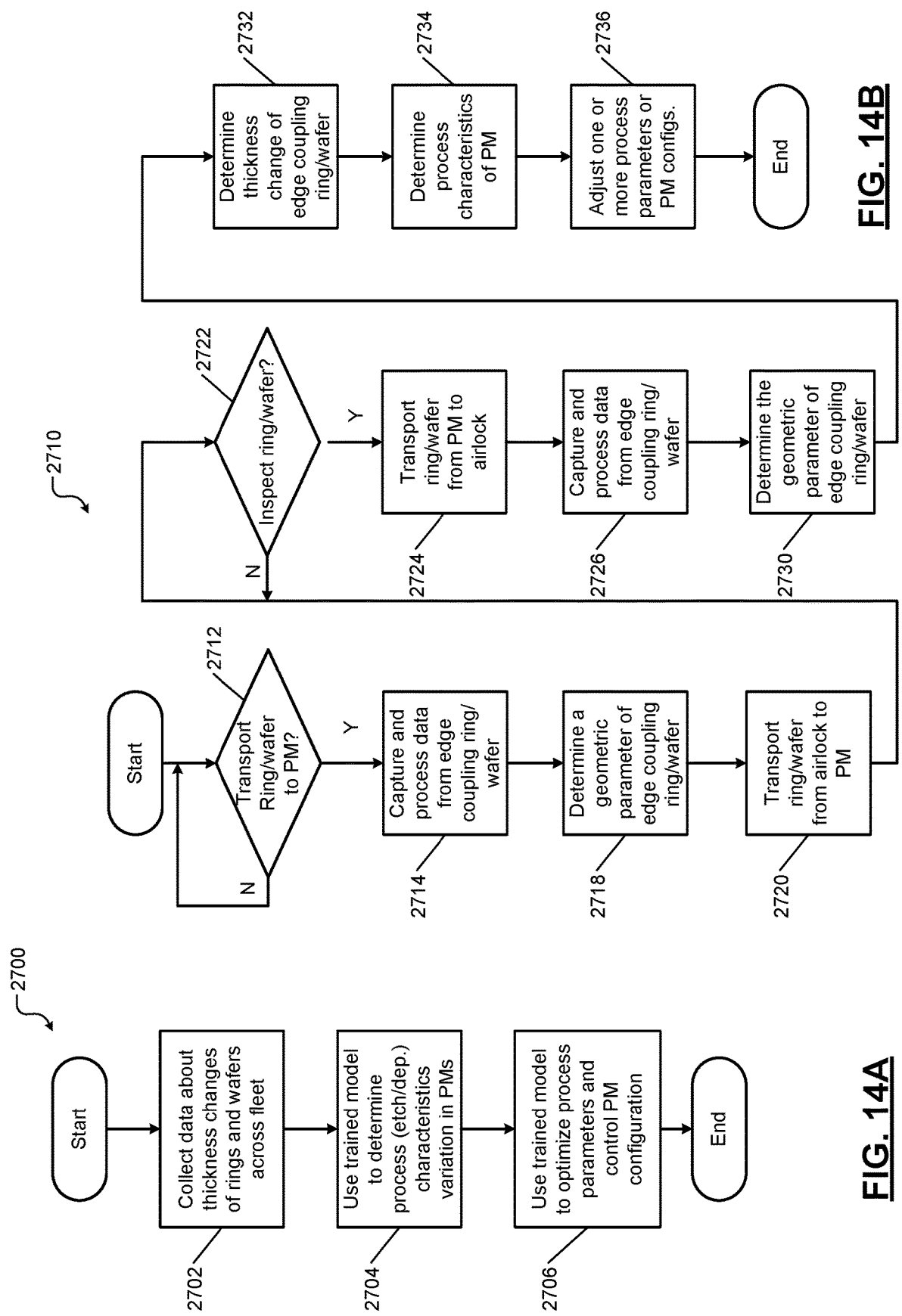

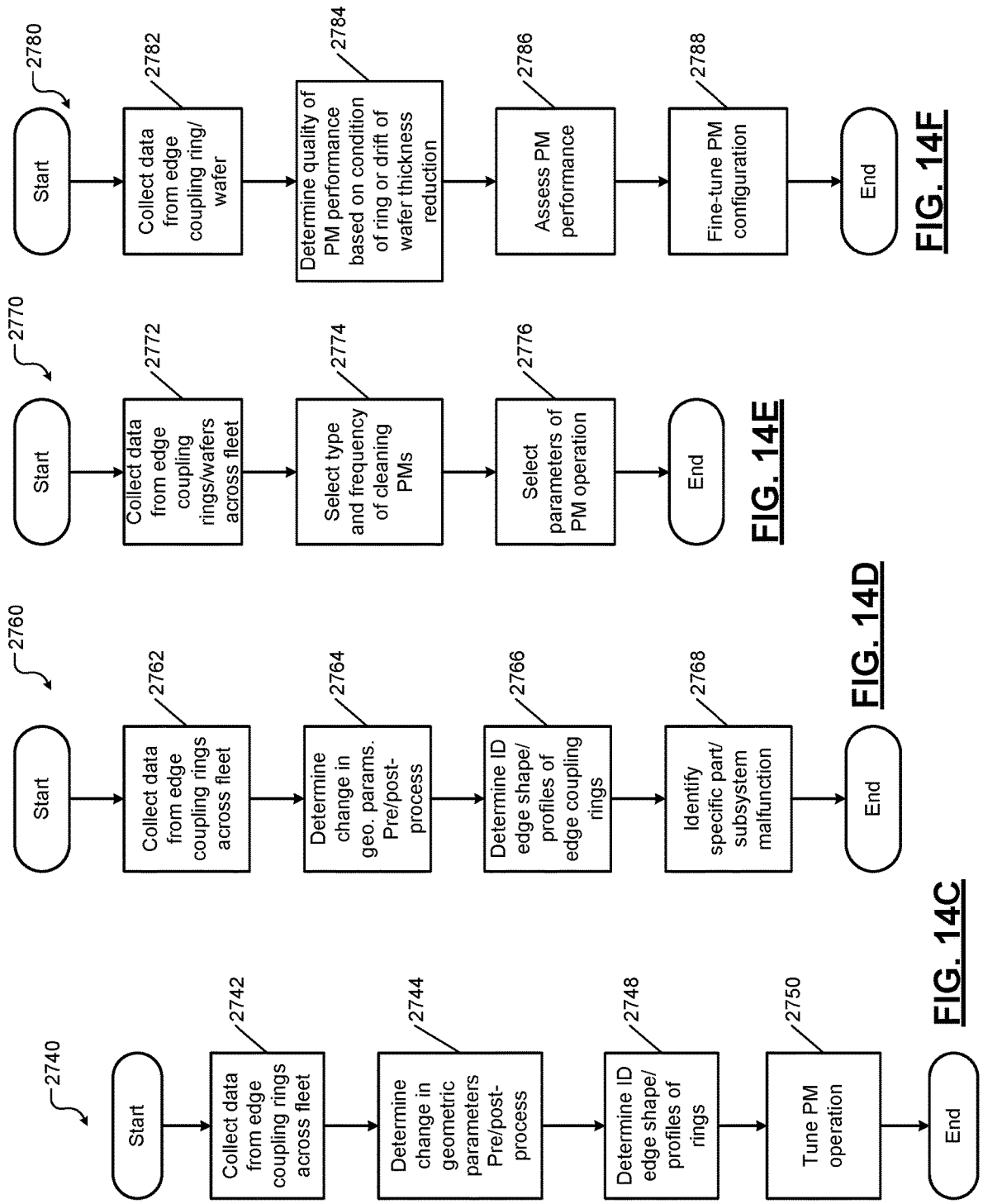

SYSTEMS AND METHODS FOR AUTONOMOUS PROCESS CONTROL AND OPTIMIZATION OF SEMICONDUCTOR EQUIPMENT USING LIGHT INTERFEROMETRY AND REFLECTOMETRY

CROSS-REFERENCE TO RELATED APPLICATIONS

This application is a U.S. National Phase Application under 35 U.S.C. 371 of International Application No. PCT/US2020/051726, filed on Sep. 21, 2020, which claims the benefit of U.S. Provisional Application No. 62/905,738, filed on Sep. 25, 2019. The entire disclosures of the applications referenced above are incorporated herein by reference.

FIELD

The present disclosure relates generally to substrate processing systems and more particularly to systems and methods for autonomous process optimization and matching of semiconductor equipment using light interferometry and reflectometry.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

Disclosed are systems and methods comprising at least one laser sensor and a controller embedded into a substrate processing system in communication with a remote big data and machine learning server receiving/sending data from/to a fleet of substrate processing systems for autonomous process control and process optimization. The laser sensor is arranged proximate to a region of the substrate processing system. The laser sensor is configured to capture first data from at least one of an edge coupling ring and a semiconductor substrate transported from/to the processing chamber to/from the region. The controller is configured to receive the first data from the laser sensor, process the first data to generate second data, transmit the second data to a remote server via a network, receive third data from the remote server via the network in response to sending the second data to the remote server, and operate the substrate processing system based on the third data for process optimization.

In another feature, the controller is configured to measure a change in a geometric parameter of at least one of the edge coupling ring and the semiconductor substrate based on the first data. The second data indicates the change in the geometric parameter.

In another feature, the controller is configured to measure a change in thickness of at least one of the edge coupling ring and the semiconductor substrate based on the first data. The second data indicates the change in the thickness.

In other features, the controller is configured to measure a change in flatness of the edge coupling ring based on the first data in at least one location. The flatness change is indicative of uniformity of etch rate of a process used for processing a substrate in the processing chamber using the edge coupling ring. The second data indicates the change in flatness. The controller is configured to adjust a parameter of at least one of the processing chamber and the process to control the etch rate based on the third data. The parameter includes a temperature distribution in a substrate support assembly of the processing chamber on which the substrate is processed. The parameter includes a height of the edge coupling ring above a substrate support assembly of the processing chamber on which the substrate is processed. The parameter includes a recipe parameter selected from a group consisting of gas flow, pressure, upper electrode temperature, substrate support temperature distribution, bias voltage, etch/deposition rate, and etch/deposition uniformity.

In other features, the controller is configured to measure the change in surface roughness of the edge coupling ring based on the first data. The surface roughness is indicative of variation in quality of a process used to clean the processing chamber. The second data indicates the change in surface roughness. The controller is configured to adjust a parameter to control a recipe of the process based on the third data. The parameter includes one or more of duration and a frequency of the cleaning process.

In other features, the controller is configured to determine a profile of an inner diameter of the edge coupling ring based on the first data. The profile is indicative of a malfunction of a component or an assembly of the processing chamber. The second data indicates the profile. The controller is configured to generate a message to service the component or assembly based on the third data.

In still other features, a system comprises a receiver and a controller. The receiver is configured to receive, via a network, first data captured by a laser sensor from at least one of an edge coupling ring and a semiconductor substrate in a substrate processing system. The controller is configured to process the first data to generate second data, input the second data to a model trained using machine learning to output third data useful for operating the substrate processing system in response to receiving the second data, and transmit the third data to the substrate processing system via the network.

In another feature, the third data includes an adjustment for at least one of a processing chamber configuration of the substrate processing system and a process performed in the processing chamber.

In another feature, the controller is configured to measure a change in a geometric parameter of the edge coupling ring based on the first data. The second data indicates the change in the geometric parameter.

In another feature, the controller is configured to measure a change in thickness or weight of at least one of the edge coupling ring and the semiconductor substrate based on the first data. The second data indicates the change in the thickness or weight.

In other features, the controller is configured to measure a flatness of the edge coupling ring based on the first data. The flatness variation at different locations is indicative of uniformity of etch rate of a process used for processing a substrate in a processing chamber of the substrate processing system. The second data indicates the flatness at different locations of the edge coupling ring. The third data includes an adjustment for a parameter of at least one of the processing chamber configuration and the process to optimize the etch rate based on the second data. The parameter includes a temperature distribution in a substrate support assembly of the processing chamber on which the substrate is processed. The parameter includes a height of the edge coupling ring above a substrate support assembly of the processing chamber on which the substrate is processed. The parameter includes a recipe parameter selected from a group consisting of gas flow, pressure, upper electrode temperature, substrate support temperature distribution, bias voltage, etch/deposition rate, and etch/deposition uniformity.

In other features, the controller is configured to measure a surface roughness of the edge coupling ring based on the first data. The surface roughness is indicative of variation in quality of a process used to clean a processing chamber of the substrate processing system. The second data indicates the change in surface roughness. The third data includes an adjustment for a parameter to control a recipe of the cleaning process based on the second data. The parameter includes one or more of a duration and a frequency of the process.

In other features, the controller is configured to determine a profile of an inner diameter of the edge coupling ring based on the first data. The profile is indicative of a malfunction of an assembly of a processing chamber of the substrate processing system. The second data indicates the profile. The third data includes a message to service the assembly based on the second data.

In still other features, a substrate processing system comprises a laser sensor and a controller. The laser sensor is arranged in the substrate processing system. The laser sensor is configured to capture first data and second data from a component used in a processing chamber of the substrate processing system at first and second times, respectively. The component includes at least one of a semiconductor substrate and an edge coupling ring used with the semiconductor substrate. The component is used in the processing chamber during a process performed in the processing chamber between the first and second times. The controller is configured to receive the first data and the second data from the laser sensor and to measure a change in a geometric parameter of the component based on the first data and the second data. The controller is configured to transmit the measured change to a remote server via a network. The remote server includes a model trained to recommend an adjustment to a parameter of at least one of the process and the processing chamber based on the measured change. The controller is configured to receive the adjustment to the parameter from the remote server via the network and to perform the adjustment to the parameter of the at least one of the process and the processing chamber.

In other features, the first data and the second data include a measurement performed at a point, along a line, or across an area of the component.

In other features, the geometric parameter includes thickness, flatness, or surface roughness of the component.

In other features, the controller is configured to determine a non-uniformity of at least one of an etch rate of the process and a deposition rate of the process based on the measured change. The adjustment minimizes the non-uniformity of the at least one of the etch rate of the process and the deposition rate of the process.

In other features, the controller is configured to initially adjust the parameter of the process and then adjust the parameter of the processing chamber.

In other features, the controller is configured to initially adjust the parameter of the processing chamber and then adjust the parameter of the process.

In other features, the parameter of the process is selected from a group consisting of gas flow, pressure, upper electrode temperature, substrate support temperature distribution, bias voltage, etch/deposition rate, and etch/deposition uniformity.

In other features, the parameter of the processing chamber is selected from a group consisting of a height of the edge coupling ring above a substrate support assembly in the processing chamber, tilt of the edge coupling ring, a gap between upper and lower electrodes of the processing chamber, alignment between the upper and lower electrodes, and tilt between the upper and lower electrodes.

In other features, the measured change indicates variation in quality of the process used to clean the processing chamber. The adjustment to the parameter of the process minimizes the variation. The parameter includes one or more of a duration and a frequency of the process.

In other features, the controller is configured to determine a profile of an inner diameter of the edge coupling ring based on the first data and the second data. The profile is indicative of a malfunction of an assembly of the processing chamber. The controller is configured to transmit the profile to the remote server, to receive an indication from the remote server to service the assembly based on the profile, and to generate a message to service the assembly based on the indication.

In still other features, a system comprises a processor and memory comprising instructions which when executed by the processor configure the processor to receive first data and second data captured by a laser sensor from a component used in a processing chamber of the substrate processing system at first and second times, respectively. The component includes at least one of a semiconductor substrate and an edge coupling ring used with the semiconductor substrate. The component is used in the processing chamber during a process performed in the processing chamber between the first and second times. The instructions cause the processor to measure a change in a geometric parameter of the component based on the first data and the second data. The instructions cause the processor to input the measured change to a model trained to recommend an adjustment to a parameter of at least one of the process and the processing chamber based on the measured change. The instructions cause the processor to receive the adjustment to the parameter from the model and to perform the adjustment to the parameter of the at least one of the process and the processing chamber.

In other features, the first data and the second data include a measurement performed at a point, along a line, or across an area of the component.

In other features, the geometric parameter includes thickness, flatness, or surface roughness of the component.

In other features, the instructions further configure the processor to determine a non-uniformity of at least one of an etch rate of the process and a deposition rate of the process based on the measured change. The adjustment minimizes the non-uniformity of the at least one of the etch rate of the process and the deposition rate of the process.

In other features, the instructions further configure the processor to initially adjust the parameter of the process and then adjust the parameter of the processing chamber.

In other features, the instructions further configure the processor to initially adjust the parameter of the processing chamber and then adjust the parameter of the process.

In other features, the instructions further configure the processor to select the parameter of the process from a group consisting of gas flow, pressure, upper electrode temperature, substrate support temperature distribution, bias voltage, etch/deposition rate, and etch/deposition uniformity.

In other features, the instructions further configure the processor to select the parameter of the process from a group consisting of a height of the edge coupling ring above a substrate support assembly in the processing chamber, tilt of the edge coupling ring, a gap between upper and lower electrodes of the processing chamber, alignment between the upper and lower electrodes, and tilt between the upper and lower electrodes.

In other features, the measured change indicates variation in quality of the process used to clean the processing chamber. The adjustment to the parameter of the process minimizes the variation. The parameter includes one or more of a duration and a frequency of the process.

In other features, the instructions further configure the processor to determine a profile of an inner diameter of the edge coupling ring based on the first data and the second data. The profile is indicative of a malfunction of an assembly of the processing chamber. The instructions further configure the processor to transmit the profile to the model, to receive an indication from the model to service the assembly based on the profile, and to generate a message to service the assembly based on the indication.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A-3I show various example configurations of the substrate processing tools;

FIGS. 5A through 5D show plan views of various example configurations of the substrate processing tools;

FIGS. 6A through 6C show plan views of additional example configurations of the substrate processing tools.

FIGS. 14A-14I are flowcharts of additional model-based methods performed for improving operations of tools using the measurement system;

In the drawings, reference numbers may be reused to identify similar and/or identical elements.

DETAILED DESCRIPTION

Figure 2:
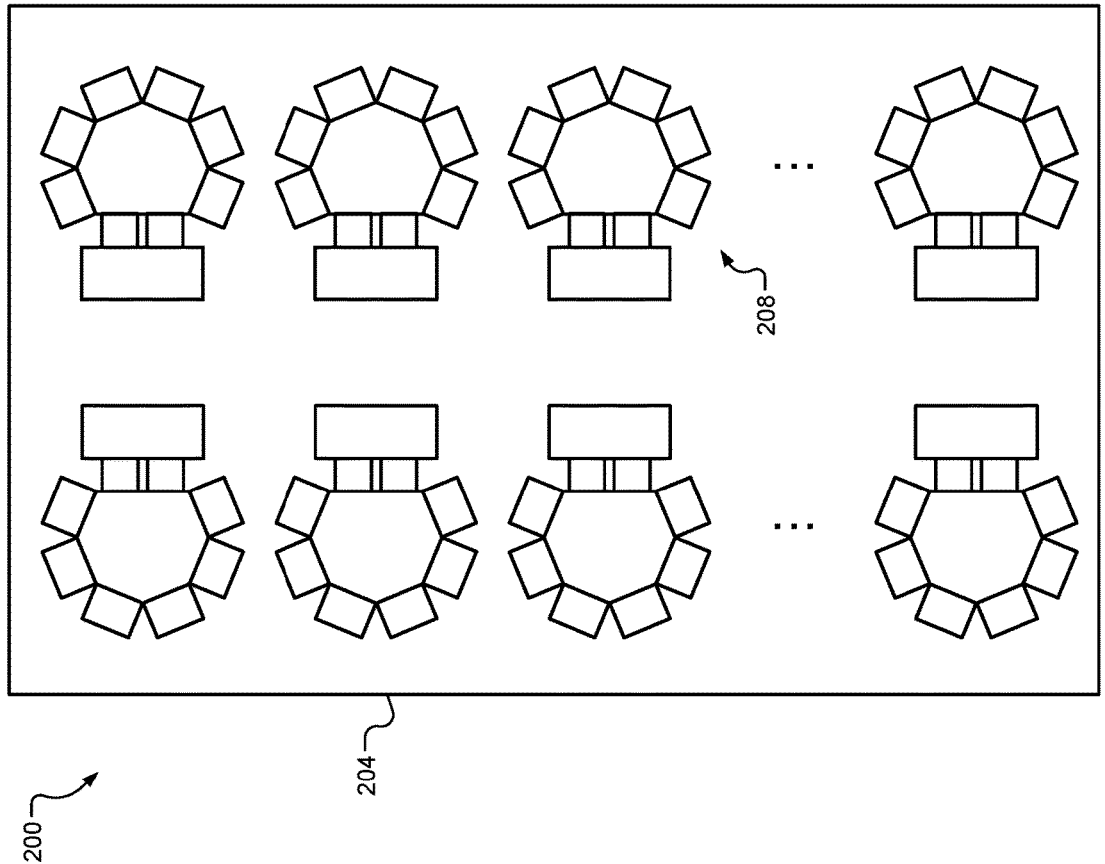
FIG. 2 shows an example arrangement of the substrate processing tools in a fabrication facility.

Edge coupling rings (an example of which is shown and described with reference to FIG. 7D below) are used with substrates such as semiconductor wafers (hereinafter wafers) during processing in process modules (PMs). The edge coupling rings allow for better control of plasma field in the PMs during etching processes to achieve optimized on-wafer process results. The edge coupling rings can be automatically transferred from an equipment front end module (EFEM) of a tool to the PMs of the tool via wafer handling robots in a vacuum transfer module (VTM). Due to differences in conditions of the PMs within a tool or between different tools, the on-wafer process results tend to vary. To achieve PM-to-PM matching (i.e., to achieve uniformity of on-wafer process results in PMs within a tool or between different tools), techniques are needed to quantify process characteristics (etch rates, etch uniformity, etc.) between different tools, monitor their drift over time, record their changes after maintenance (e.g., wet clean, etc.), and to create procedures to automatically adjust parameters of the etch processes in the PMs (e.g., recipe, ESC temperature, gas flow, time duration, pressure, etc.) to correct for such changes.

New (i.e., unused) edge coupling rings have non-uniform thickness in the radial direction. During processing performed in the PMs, the edge coupling rings erode and their thickness is reduced. The thickness reduction at points at an inner diameter (ID) of the edge coupling rings, close to a center of the edge coupling ring, is usually greater than that at points closer to an outer diameter (OD) of the edge coupling ring. Therefore, one of the objectives of the present disclosure is to determine a change in thickness profile of the edge coupling rings across the radial direction before and after process. The thickness measurement can be made using one or multiple laser sensor(s) arranged adjacent to an airlock chamber of a tool, for example. (Throughout the present disclosure, the phrases "a laser sensor" and "the laser sensor" are used to mean one or multiple laser sensors.) However, the laser sensor does not have to be placed in the airlock. A dedicated station can be designed in the VTM or the EFEM to perform the measurement. The motivation for arranging the laser sensor in the platform instead of in the PM is that the harsh environment in which the PMs operate (plasma, high temperature, vacuum, corrosion, etc.) is very challenging and can damage the laser sensor which results in increased cost of implementation of such sensing technologies inside the PM.

Currently there is no technique to measure the thickness changes between a new edge coupling ring going into a PM and the same edge coupling ring leaving the PM at the end of its life or at any time (e.g., daily) before the end of its life, and to automatically adjust process parameters of the PM (e.g., etch/deposition rate, etch/deposition uniformity, etc.) for process optimization and for PM-to-PM matching. The present disclosure proposes a technique that allows for automated measurement of in-/out-bound (new/used) edge coupling rings (and pre-/post-processed wafers) and associated information processing infrastructure for autonomous process optimization and PM-to-PM matching. Using this technique, the edge coupling ring can be removed in the middle of its life from the PM via robot and brought to airlock. After making the thickness profile measurement, the edge coupling ring can be returned to the PM and adjustments to system parameters can be made to optimize process results.

Further, the same techniques described for measuring changes in thickness profile of edge coupling rings can be applied to wafers as well. For example, in etch applications, the thickness of a wafer can be measured before and after processing using light reflectometry to determine the thickness of etched material. The thickness of the etched material can then be compared to expected thickness of the etched material. Based on the difference between actual and expected thickness of the etched material, process parameters (e.g., etch/deposition rate, etch/deposition uniformity, etc.) can be adjusted to optimize process results in PMs and across the fleet. Examples of parameters that can be adjusted in a PM include but are not limited to pressure, gas flow, ESC temperature, upper electrode temperature, process duration, bias voltage, and so on. For typical etch applications, the thickness of the etched material can be 0.1-10 µm. The laser sensors can measure the thickness of etched materials via light reflectometry and interferometry with repeatability down to 0.1 µm.

Furthermore, the same techniques can be applied to deposition tools for measuring thickness of films deposited on wafers and for adjusting process parameters (e.g., etch/deposition rate, etch/deposition uniformity, etc.) based thereon to optimize process results in PMs and across the fleet. Accordingly, throughout the present disclosure while the systems and methods are often described with reference to edge coupling rings for example only, it should be understood that the teachings of the present disclosure apply equally to wafers processed using etch and deposition processes regardless of a specific reference to wafers, unless specifically mentioned otherwise. For example, some measurements such as ID measurement will apply only to edge coupling rings and will not apply to wafers.

According to the present disclosure, a laser sensor that uses light reflectometry and interferometry is arranged, for example, in a transfer module (TM) in a location where new/used edge coupling rings and wafers will pass through (e.g., airlock, aligner, robot arm, etc.). The arrangement allows for accurate measurement of thickness profile changes in used edge coupling rings (thickness reduction) and in processed wafers (thickness reduction in etch processes and thickness increase in deposition processes). Knowing the usage history of an edge coupling ring (e.g., the number of RF hours the edge coupling ring has been used in a PM, the process parameters, chamber type, etc.) and its thickness reduction, process characteristics (e.g., etch/deposition rate, etch/deposition uniformity, etc.) of the PM can be determined, and processes in the PM can be optimized. The thickness reduction in an etched wafer can be used to adjust (optimize) parameters of etch processes in PMs. The thickness increase in a wafer using in a deposition process can be used to adjust (optimize) parameters of deposition processes in PMs. Both light reflectometry sensors, which make 1D (at a point) or 2D (across a line), as well as interferometry sensors, which make 3D (across a surface), height/thickness measurement can be made, which are explained with reference to FIGS. 9A-10C below, can be used.

Briefly, the laser sensor measures and sends changes in a geometric parameter such as thickness of an edge coupling ring (or a wafer) to a system computer of the tool. The system computer preprocesses the data and sends the pre/post-processed data to a host/cloud (e.g., in a data center). The host/cloud includes big data infrastructure and stores all incoming data. The host/cloud determines a process characteristics (e.g., etch/deposition rate, uniformity, etc.) of a PM based on changes in the thickness between incoming/outgoing edge coupling ring (and wafers). The host/cloud trains machine learning models (e.g., based on neural network, Tensor flow, etc.) using data from similar PMs that run the same recipe on regular (e.g., daily or weekly) basis using the data science infrastructure. The trained models are used with incoming data to recommend adjustments for PM process parameters (e.g., etch/deposition rate, etch/deposition uniformity, etc.) to achieve autonomous process optimization and PM-to-PM matching in a closed loop manner. The system controller automatically adjusts (optimizes) PM process parameters (e.g., etch/deposition rate, etch/deposition uniformity, etc.) to achieve autonomous process optimization and PM-to-PM matching in a closed loop manner.

Accordingly, the present disclosure relates to systems and methods that capture data from edge coupling rings and wafers when the edge coupling rings and wafers are temporarily parked in a station while being transported from/to the PMs (e.g., in airlocks). The captured data is processed and geometric characteristics of the edge ring and wafer are calculated via feature extraction. The data is captured and processed for a period of time to generate training data that is used to train various models using machine learning. The trained models are then used to quantify wear of the edge coupling rings and thickness changes in wafers over time and to automatically adjust (optimize) process parameters (e.g., etch/deposition rate, etch/deposition uniformity, etc.) for PM-to-PM matching to improve system throughput, process yield, and on-wafer process quality as explained below.

Additionally, the systems and methods can optionally complement various sensors, algorithms, and feedback mechanisms typically used to recommend measures to control the tools and improve throughput, yield, and on-wafer process quality. The systems and methods continue to learn from the data being captured from edge coupling rings and wafers on an ongoing basis during use or production. The systems and methods also automate performance of some of the preventive and corrective tasks (e.g., PM cleaning and signature based guided troubleshooting explained below) that typically require human intervention. The systems and methods oversee tool operations across the fleet in a semiconductor fab and provide feedback for autonomous control of the tools in a closed loop manner.

A measurement system of the present disclosure comprises detectors and/or sensors such as laser sensors (shown and described with reference to FIGS. 9A-10C below) and further comprises data processing algorithms, perception algorithms, sensor fusion algorithms, models trained using machine learning, and closed-loop control algorithms. Throughout the present disclosure, the laser sensors are used only as examples of detectors/sensors, and it is understood that any other suitable detectors/sensors may be used instead or in addition thereto. These and other features of the present disclosure are explained below in detail.

Organization

The present disclosure is organized as follows. Initially, numerous examples of substrate processing tools, their configurations, and processing chambers used therein are shown and described with reference to FIGS. 1-7D. These drawings and corresponding description are provided to illustrate various processes that can be performed on different wafers and various paths traveled by the wafers and associated edge coupling rings between different chambers and tools. Further, these figures are provided to illustrate the complexity, diversity, and expanse of data that is typically gathered from various sensors in the chambers and the tools. The data, which is used to diagnose, correct, and prevent problems, and to perform various adjustments, calibrations, and preventive maintenance procedures in the chambers and the tools, can be used in conjunction with the systems and methods of the present disclosure.

The systems and methods of the present disclosure can operate standalone or in conjunction with these sensors and the data collected therefrom and can significantly improve the diagnostic, corrective, and preventive procedures performed in the chambers and the tools. These figures provide insights into the operations of the chambers and the tools, which help in comprehending the scope of operations performed by the systems and methods of the present disclosure. Further, these figures help understand a variety of locations where the laser sensors of the measurement system of the present disclosure can be installed in different tools.

Figure 8A:
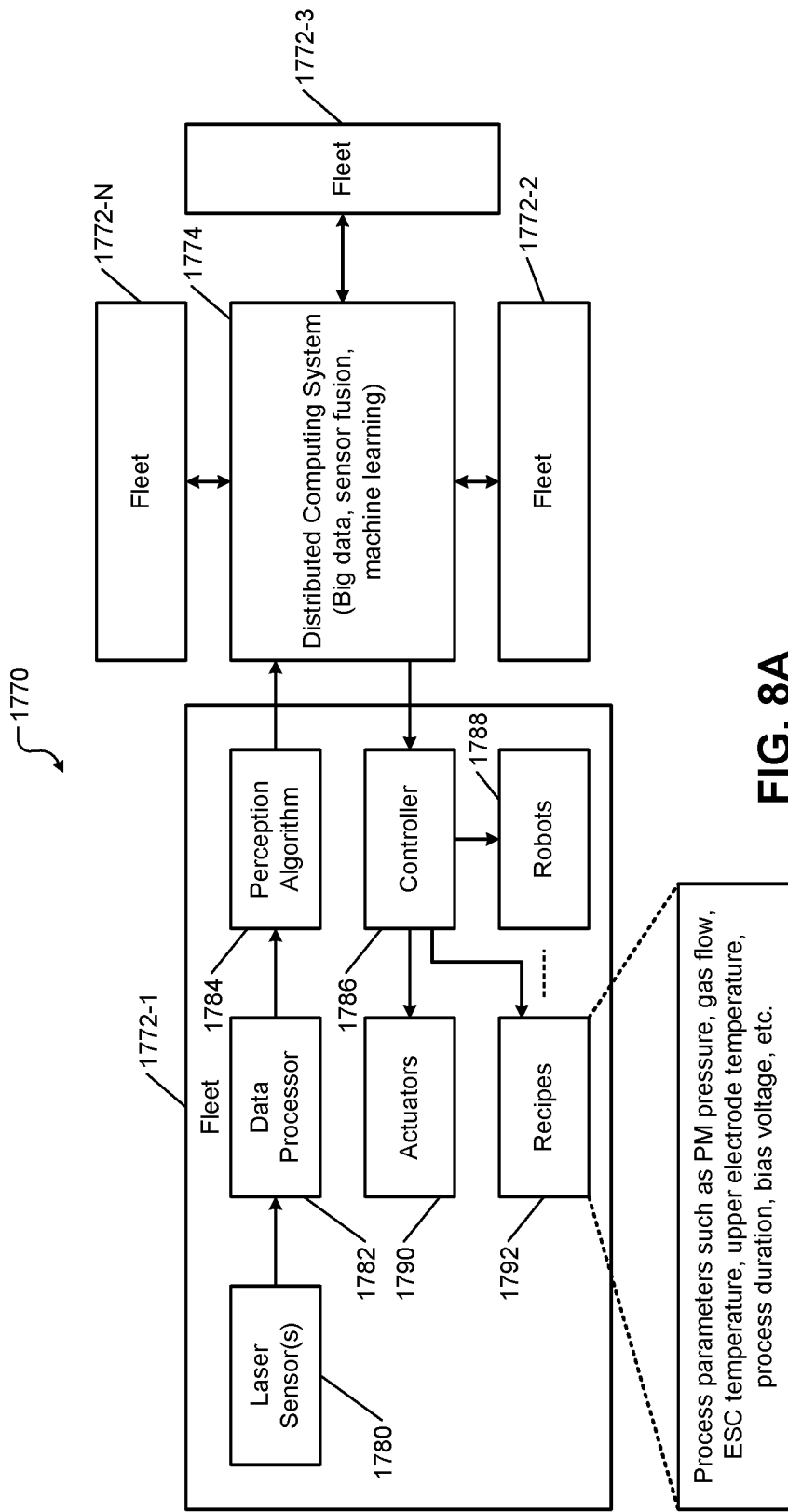
FIG. 8A shows a high level architecture of a measurement system for performing autonomous process optimization and matching for semiconductor equipment using light interferometry and reflectometry according to the present disclosure.
Figure 8B:
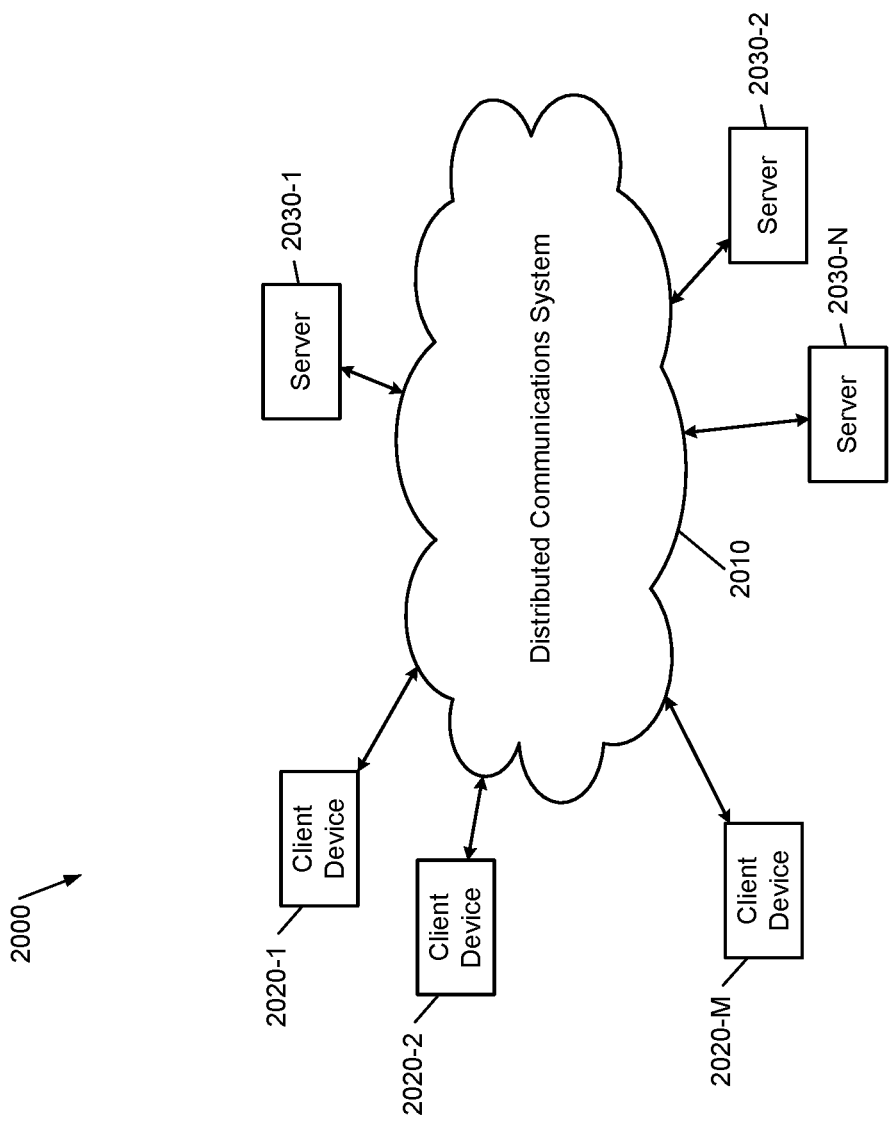
FIGS. 8B-8D show a client-server architecture for implementing the systems and methods of the present disclosure.
Figure 8C:
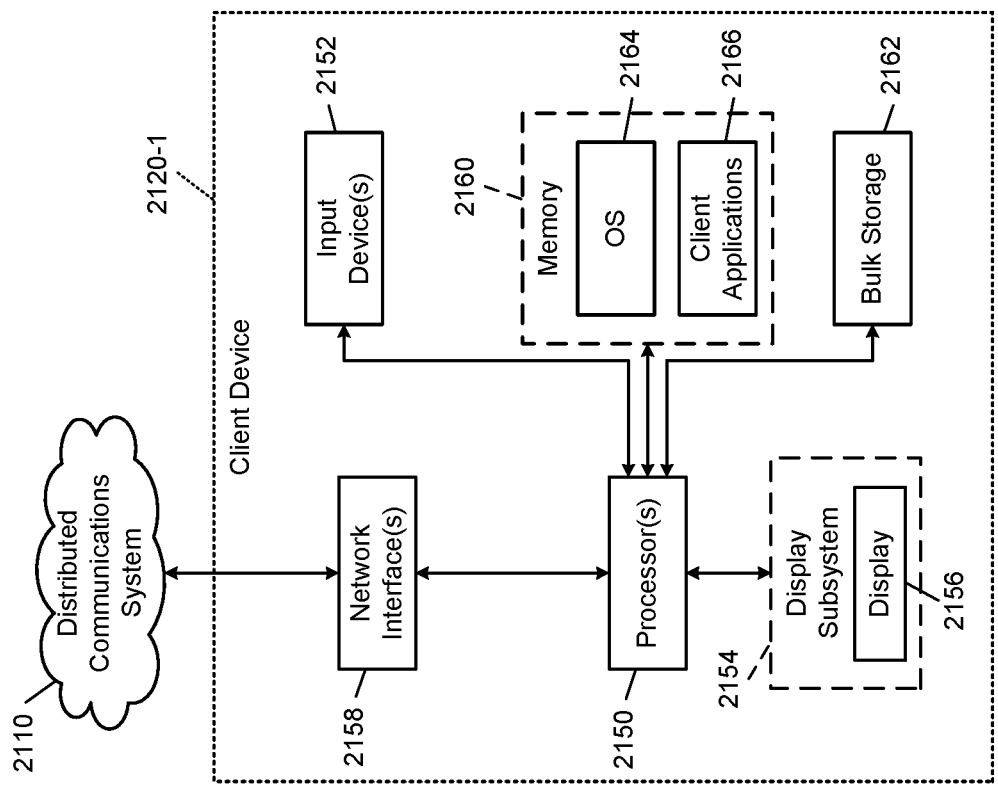
Figure 8D:
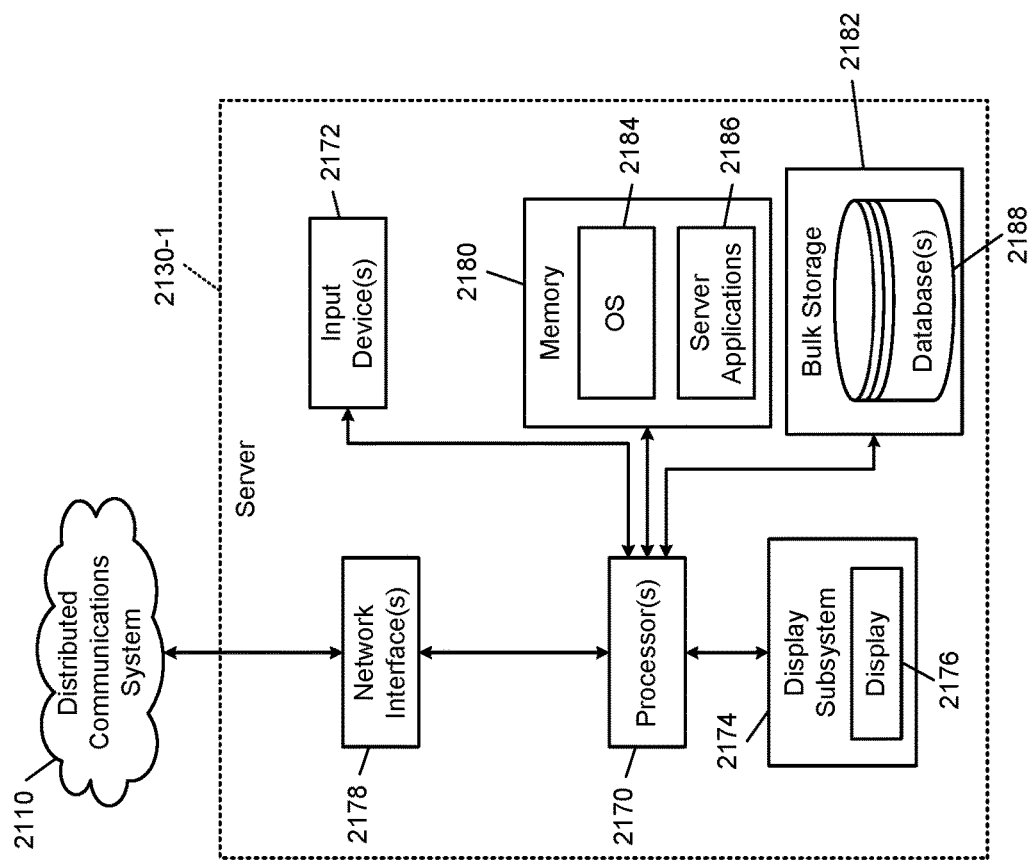
Figure 9A:
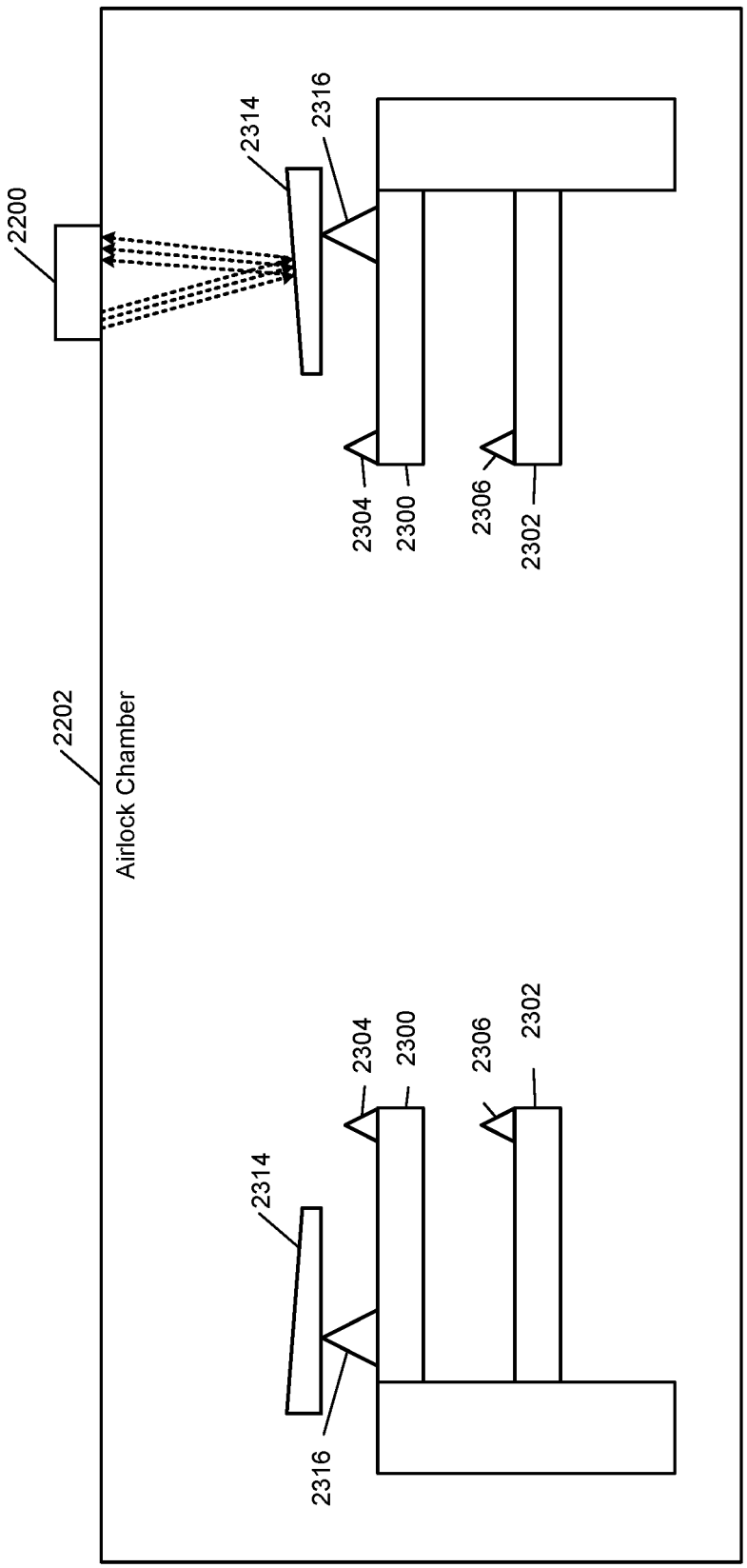
FIG. 9A shows an example arrangement of laser sensors used in the measurement system of the present disclosure.
Figure 10C:
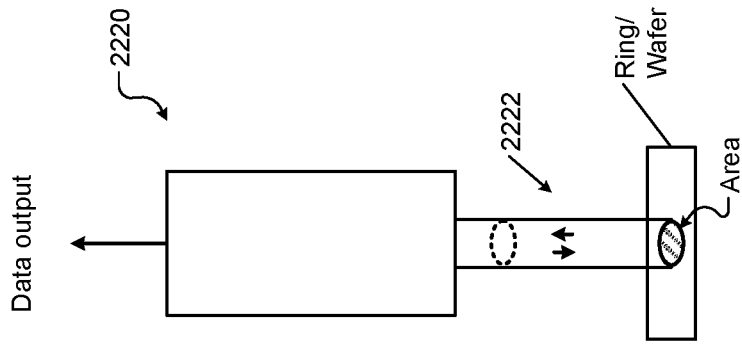
FIGS. 10A-10C show examples of the laser sensors used with 1D/2D reflectometry and 3D interferometry in the measurement system of the present disclosure.
Figure 10B:
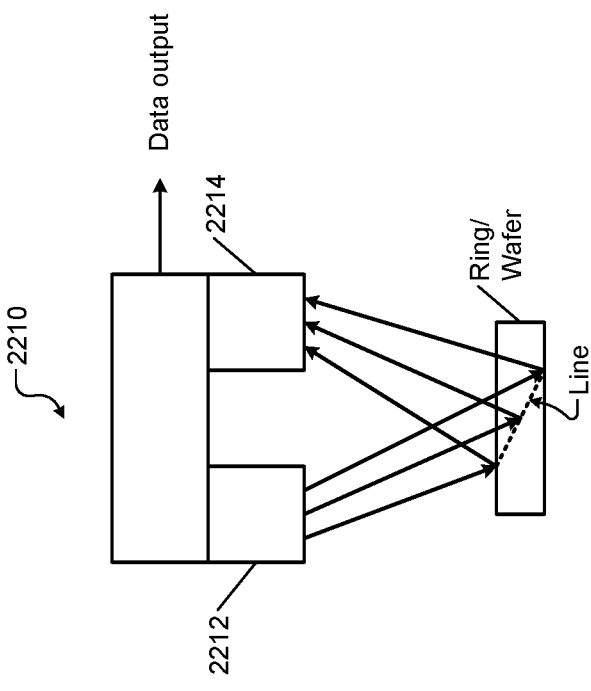
Figure 10A:
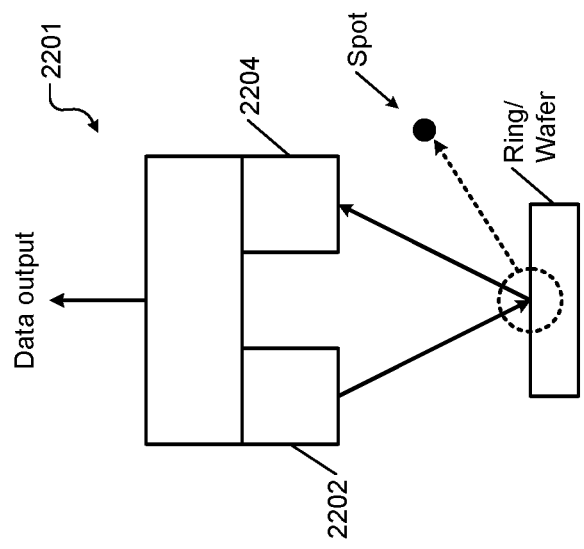
Figure 11:
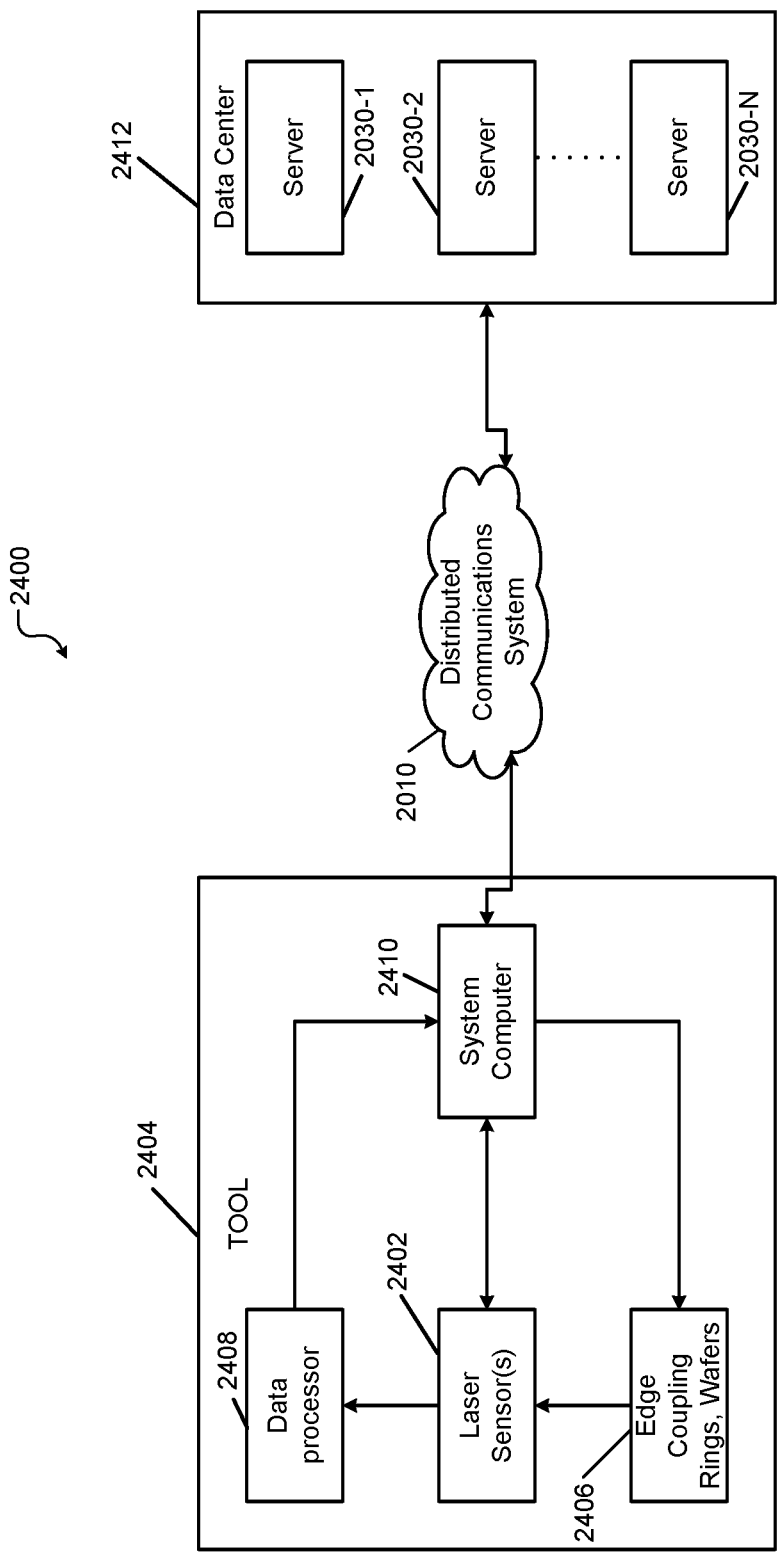
FIG. 11 is a block diagram of the measurement system implemented using the client-server architecture shown in FIGS. 8B-8D and using the laser sensors shown in FIGS. 9-10B.

FIG. 8A shows a high level architecture of a measurement system according to the present disclosure. FIGS. 8B-8D show a client-server architecture that can be used to implement the systems and methods of the present disclosure. FIG. 9A shows examples of locations in tools where one or more detectors such as the laser sensors of the measurement system of the present disclosure can be located. FIGS. 9B-9G show examples of edge coupling rings and wafers of which measurements are taken before and after processing according to the systems and methods of the present disclosure. FIGS. 10A-10C show examples of the 1D, 2D, and 3D laser sensors. FIG. 11 shows an example of the measurement system implemented using the client-server architecture of FIGS. 8B-8D and using one or more laser sensors as shown in FIGS. 9A-10C.

Figure 13:
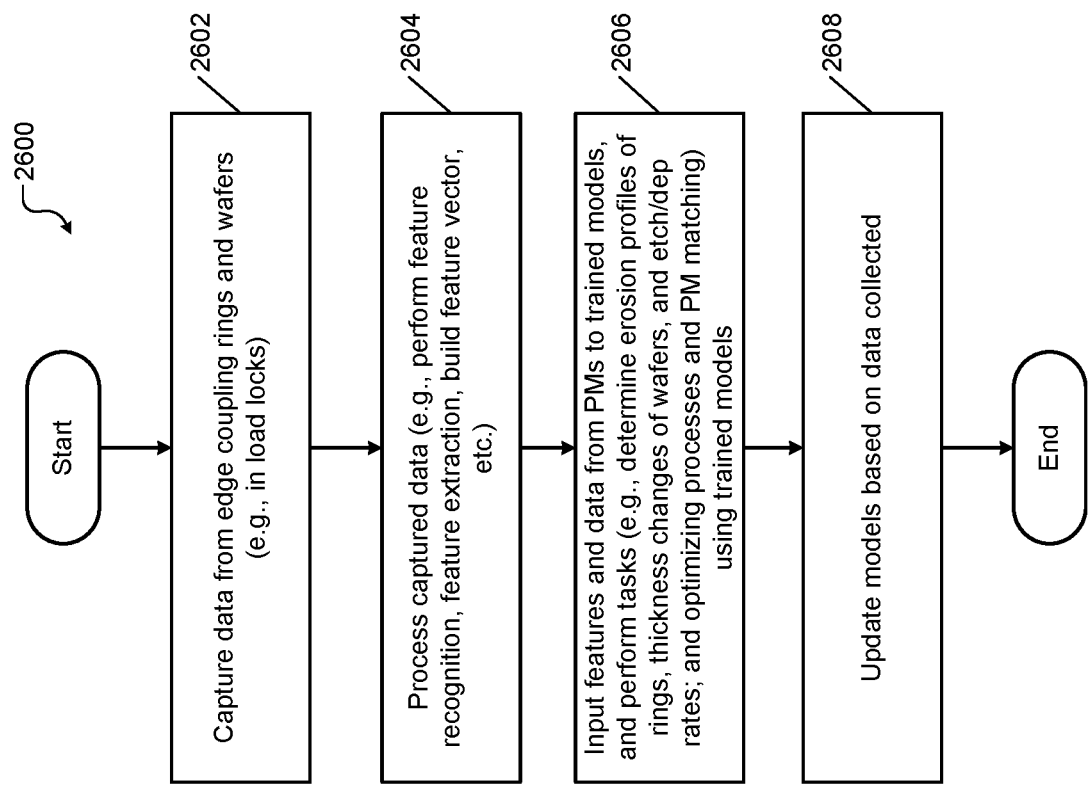
FIG. 13 is a flowchart of a method performed in a tool using the trained models based on data captured during production.
Figure 12:
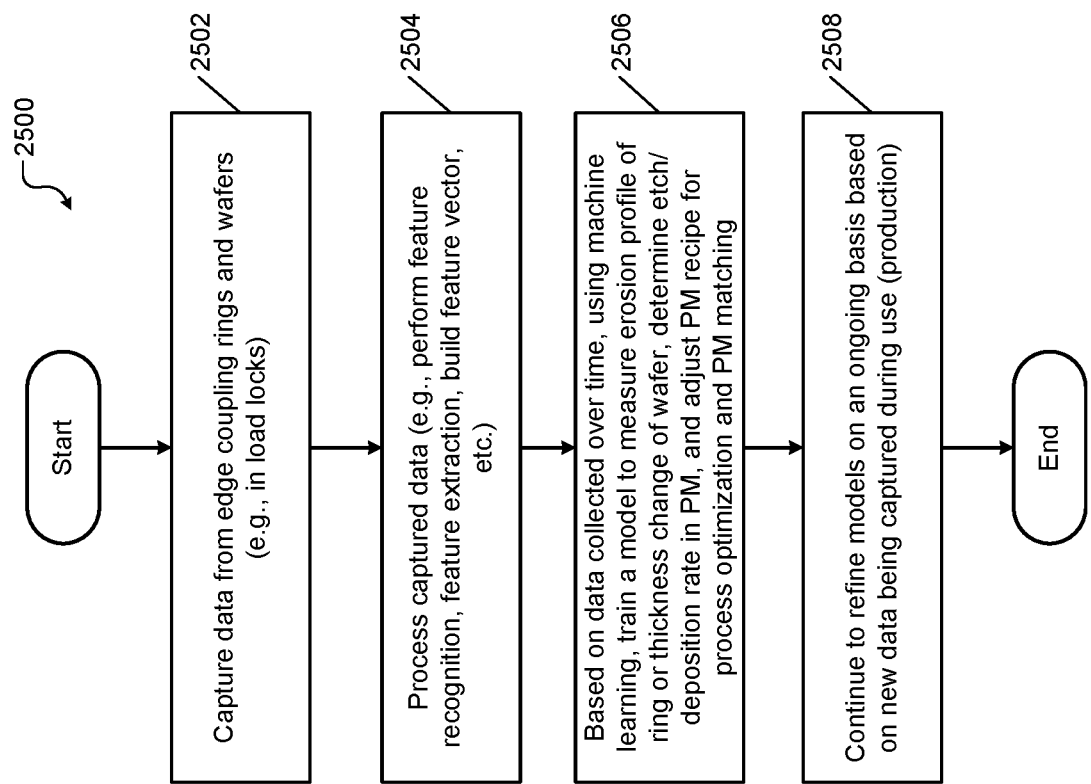
FIG. 12 is a flowchart of a method for training various models using machine learning based on data captured by the measurement system from various tools.

FIG. 12 shows an example of a method for training various models using machine learning based on the data captured by the measurement system from various tools. FIG. 13 shows an example of a method performed using the trained models based on the data captured in real time (i.e., on the fly, or when the tool is being used during production to process wafers). FIGS. 14A-14I show additional examples of model-based methods performed for improving operations of the tools by optimizing processes and PM matching across fleets using the systems and methods of the present disclosure. FIGS. 15A-16B show examples of methods for training models using machine learning.

Examples of Tools

Figure 1:
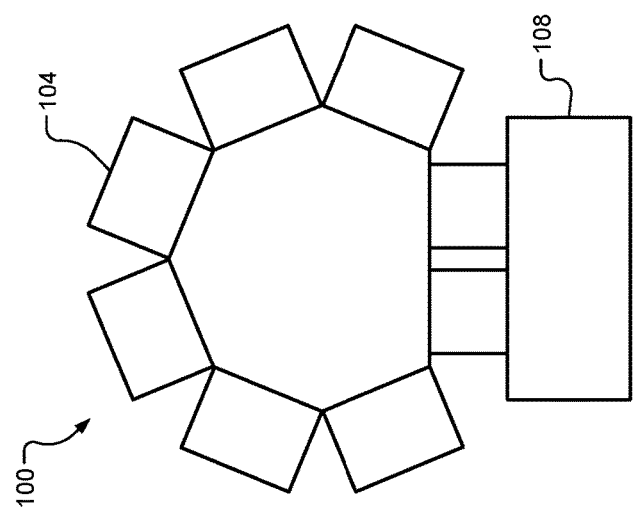
FIG. 1 shows an example of a substrate processing tool.

FIG. 1 shows a top-down view of an example of a substrate processing tool 100. The substrate processing tool 100 includes a plurality of process modules 104. For example only, each of the process modules 104 may be configured to perform one or more respective processes on a substrate. Substrates to be processed are loaded into the substrate processing tool 100 via ports of a loading station of an equipment front end module (EFEM) 108 and then transferred into one or more of the process modules 104. For example, a substrate may be loaded into each of the process modules 104 in succession.

FIG. 2 shows an example arrangement 200 of a fabrication room 204 including a plurality of substrate processing tools 208 such as the substrate processing tool 100. FIGS. 3A-3I show various examples of configurations in which the plurality of substrate processing tools 208 such as the substrate processing tool 100 can be arranged. In these examples, the wafers travel through varying paths. Accordingly, the configuration and operation of the robots used to transport the wafers through these paths vary. Further, a variety of sensors are used in these examples to sense various aspects of robots and the wafers. In addition, as will be explained in detail with reference to FIGS. 9-11, one or more detectors such as laser sensors of the measurement system can be placed anywhere in these examples.

Figure 3A:
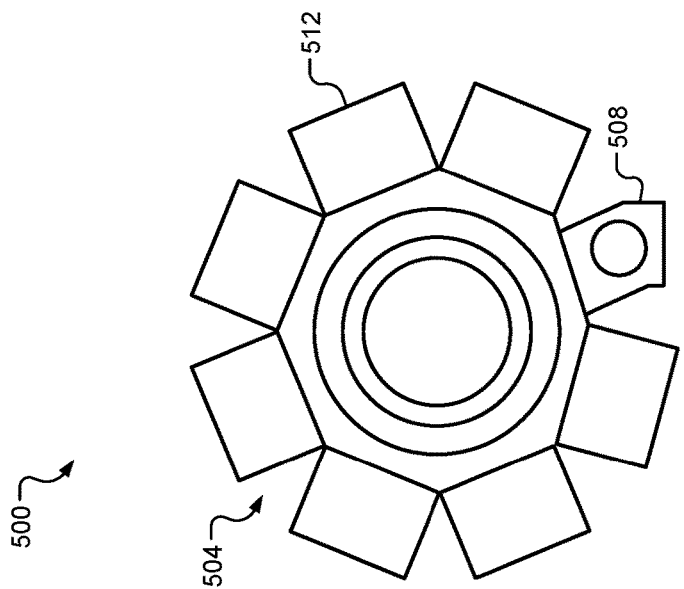

FIG. 3A shows a first example configuration 300 including a first substrate processing tool 304 and a second substrate processing tool 308 according to the principles of the present disclosure. The first substrate processing tool 304 and the second substrate processing tool 308 are arranged sequentially and are connected by a transfer stage 312, which is under vacuum. As shown, the transfer stage 312 includes a pivoting transfer mechanism configured to transfer substrates between a vacuum transfer module (VTM) 316 of the first substrate processing tool 304 and a VTM 320 of the second substrate processing tool 308. In other examples, the transfer stage 312 may include other suitable transfer mechanisms, such as a linear transfer mechanism.

For example only, a first robot (not shown) of the VTM 316 may place a substrate on a support 324 arranged in a first position, the support 324 is pivoted to a second position, and a second robot (not shown) of the VTM 320 retrieves the substrate from the support 324 in the second position. In some examples, the second substrate processing tool 308 may include a storage buffer 328 configured to store one or more substrates between processing stages. The transfer mechanism may also be stacked to provide two or more transfer systems between the substrate processing tools 308 and 304. Transfer stage 324 may also have multiple slots to transport or buffer multiple substrates at one time. In the configuration 300, the first substrate processing tool 304 and the second substrate processing tool 308 are configured to share a single equipment front end module (EFEM) 332.

Figure 3B:
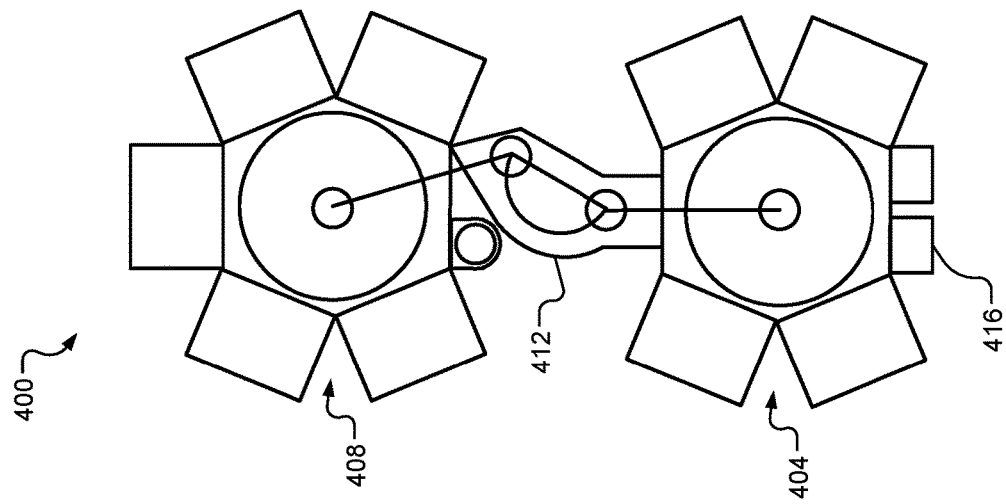

FIG. 3B shows a second example configuration 400 including a first substrate processing tool 404 and a second substrate processing tool 408 arranged sequentially and connected by a transfer stage 412. The configuration 400 is similar to the configuration 300 of FIG. 3A except that in the configuration 400, the EFEM is eliminated. Accordingly, substrates may be loaded into the first substrate processing tool 408 directly via airlock loading stations 416 (e.g., using a storage or transport carrier such as a vacuum wafer carrier, front opening unified pod (FOUP), etc., or other suitable mechanisms). The arrangement of laser sensors and other sensors in this configuration may correspondingly differ from configuration 300.

Figure 3C:
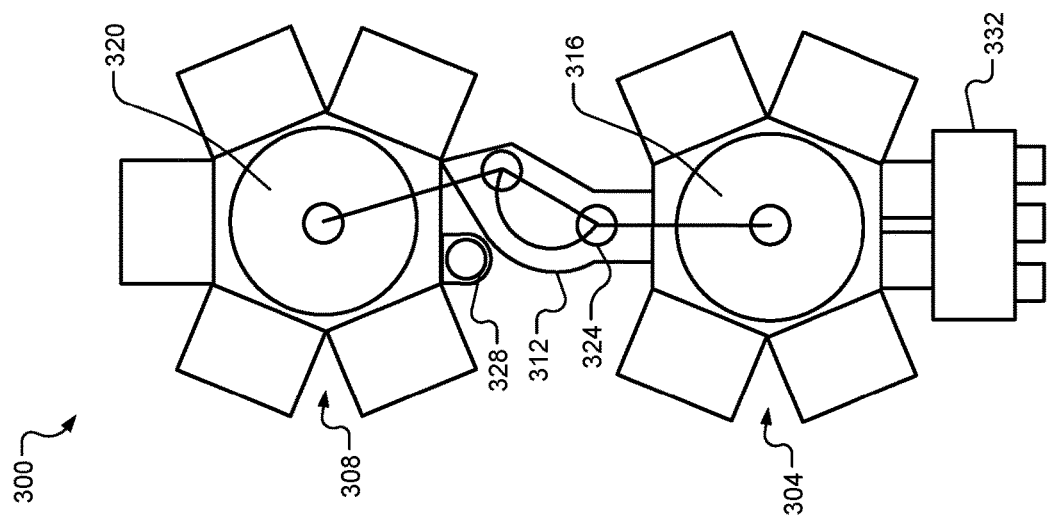

FIG. 3C shows a third example configuration 500 including a substrate processing tool 504. The configuration 500 eliminates the EFEM and uses only a single loading station 508, allowing for a greater number (e.g., 7) of process modules 512. At the loading station 508, substrates may be loaded into the second substrate processing tool 408 directly via airlock loading station 416 (e.g., using a storage or transport pod such as a Vacuum Wafer Carrier, front opening unified pod (FOUP), etc., or other suitable mechanisms). Accordingly, the arrangement of laser sensors and other sensors in this configuration may correspondingly differ from configurations 300 and 400.

FIG. 3D shows a fourth example configuration 600 including a first substrate processing tool 604 and a second substrate processing tool 608 sharing a single EFEM 612. More specifically, the first substrate processing tool 604 and the second substrate processing tool 608 are connected to respective ends of the EFEM 612 via respective loading stations 616 and 620. The loading stations 616 and 620 may each have a stacked configuration, which may include laser sensors and other suitable sensors.

FIG. 3E shows a fifth example configuration 700 including a first substrate processing tool 704 and a second substrate processing tool 708 sharing a single EFEM 712. The first substrate processing tool 704 and the second substrate processing tool 708 are connected to respective ends of the EFEM 712 via respective loading stations 716 and 720. The loading stations 716 and 720 may each have a stacked configuration, which may include laser sensors and other suitable sensors.

Figure 3F:
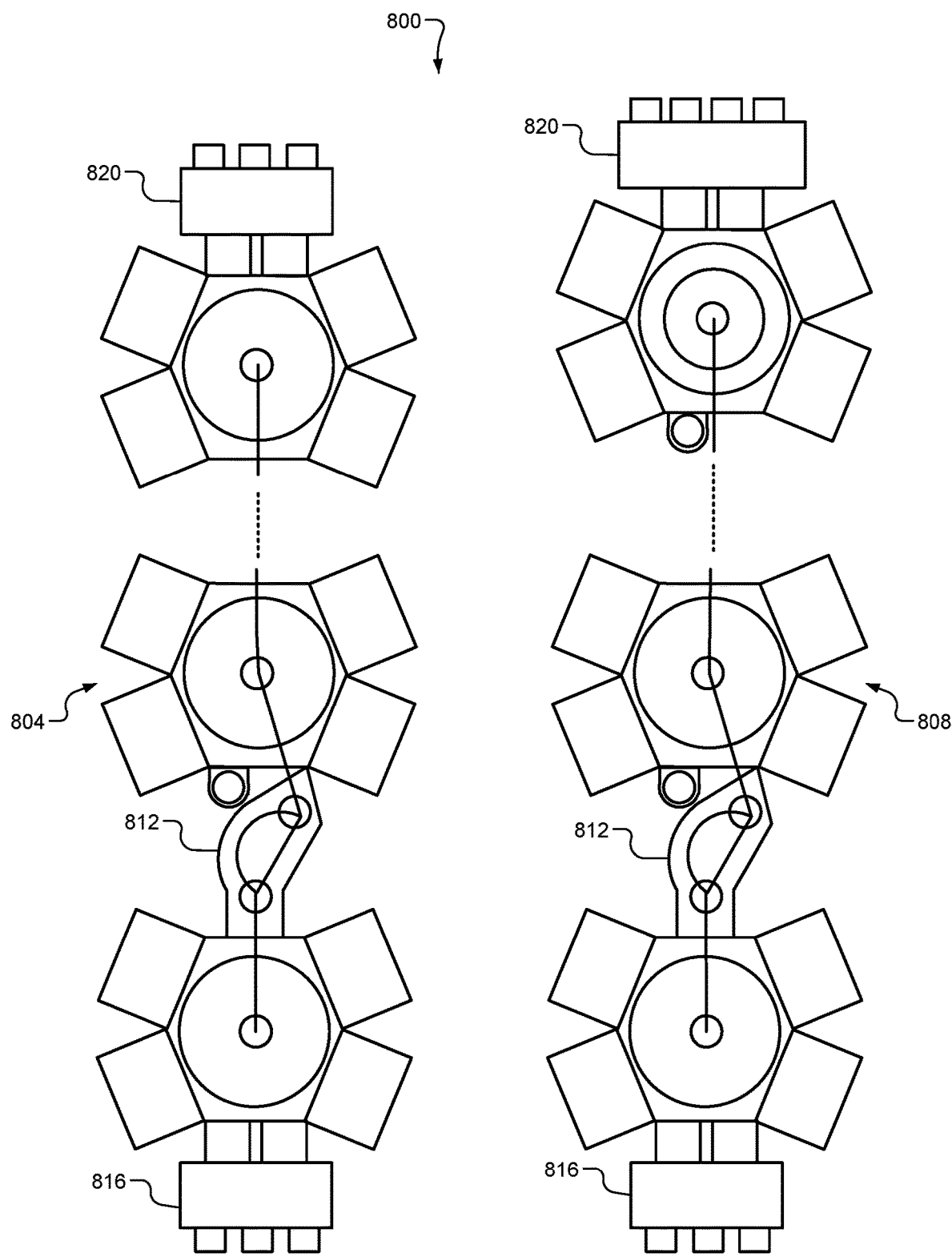

FIG. 3F shows a sixth example configuration 800 including one or more rows of sequentially arranged substrate processing tools 804, 808, etc. In the configuration 800, each row may include 3 or more substrate processing tools connected via respective transfer stages 812. The transfer stages 812 may include pivoting transfer mechanisms, linear transfer mechanisms, etc. A first EFEM 816 is provided at a first end of the row of substrate processing tools 804, 808 and a second EFEM 820 is provided at a second end of the row of substrate processing tools 804, 808. For example, substrates may be loaded at the first EFEM 816, processed and transferred sequentially through the various process modules of the substrate processing tools 804, 808, and then unloaded/retrieved from the second EFEM 820. In some examples, transfer mechanisms within the transfer stages 812 may be vertically stacked to provide two or more transfer systems between adjacent substrate processing tools. The transfer stages 812 may also have multiple slots to move or buffer multiple substrates at a time. As can be appreciated, the arrangement of laser sensors and other sensors in configuration 800 can be significantly different than in other configurations.

Figure 3H:
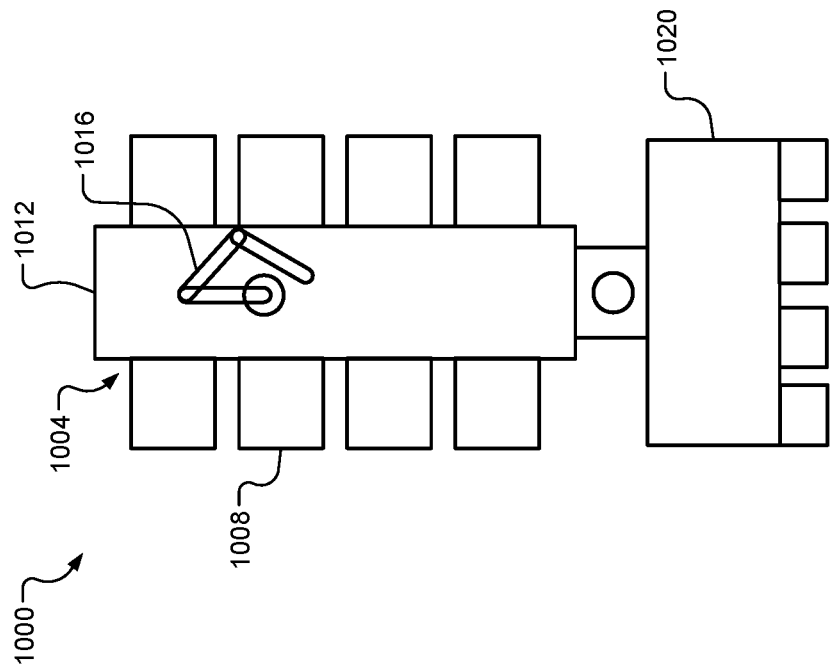
Figure 3G:
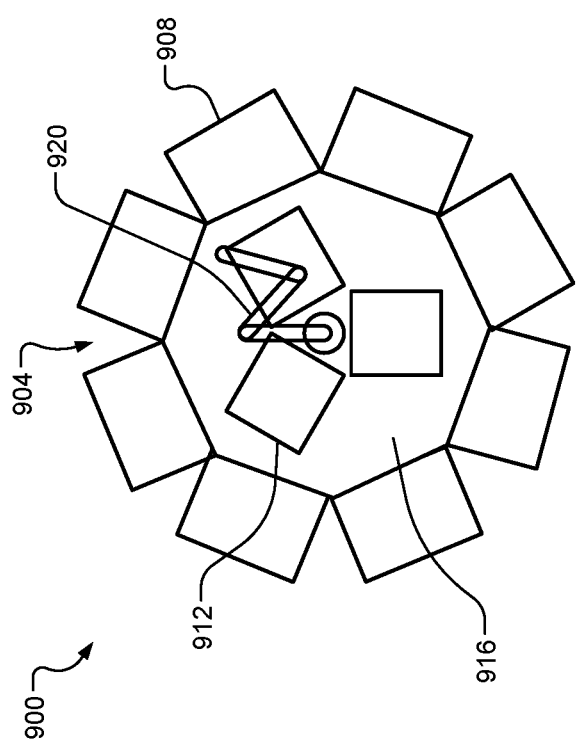

FIG. 3G shows a seventh example configuration 900 including a substrate processing tool 904. In the configuration 900, the substrate processing tool 904 includes, for example, 8 process modules 908 and eliminates both the EFEM and any exterior loading stations. Instead, one or more transport carriers (e.g., vacuum wafer carriers) 912 are provided in an interior 916 of the substrate processing tool 904. For example, the carriers 912 may be transported from above the substrate processing tool 904 using an automated transport system, such as an automated material handling system (AMHS). A robot 920 retrieves substrates from the carriers 912 and transfers the substrates to the process modules 908. As can be appreciated, the arrangement of laser sensors and other sensors in configuration 900 can be different than in other configurations.

FIG. 3H shows an eighth example configuration 1000 including a substrate processing tool 1004 having a plurality of process modules 1008. The substrate processing tool 1004 includes a linear VTM 1012 and robot 1016 configured to transfer substrates between EFEM 1020 and the process modules 1008. The VTM 1012 is configured to adjust a linear position of the robot 1016 relative to the process modules 1008 (i.e., adjust an end-to-end position of the robot 1016 relative to the VTM 1012).

Figure 3I:
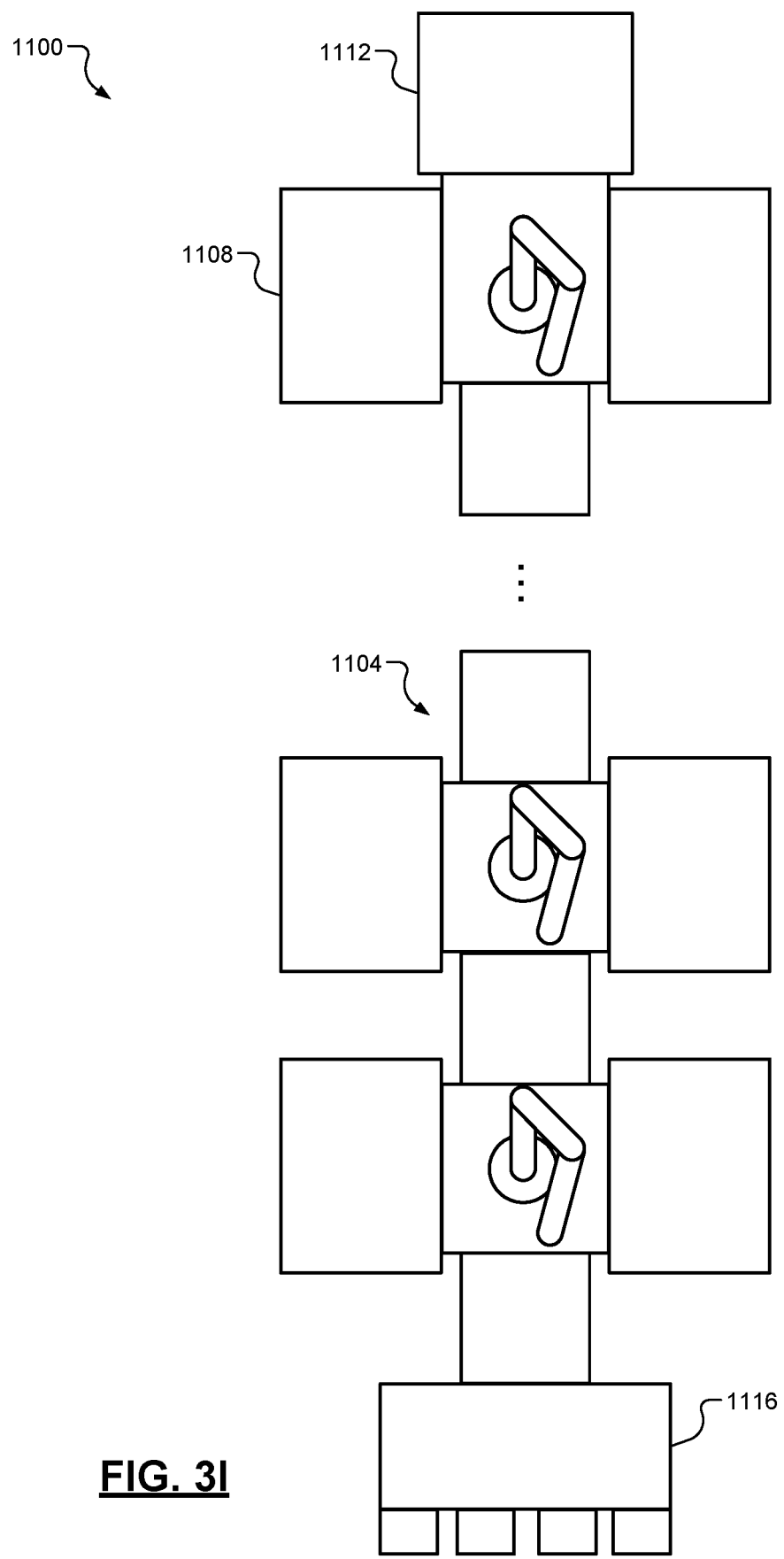
Figure 5A:
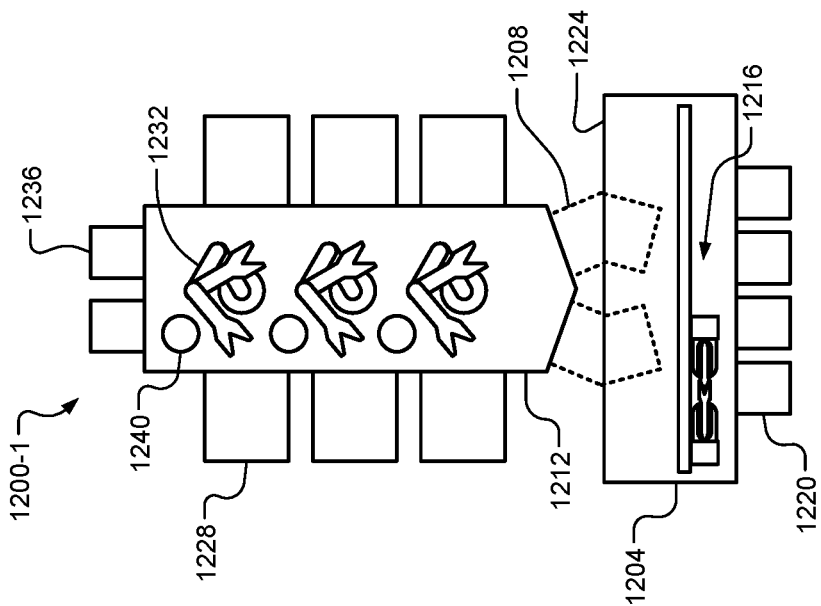

FIG. 3I shows a ninth example configuration 1100 including a substrate processing tool 1104. The substrate processing tool 1104 includes a cluster arrangement of process modules 1108, and an optional end process module 1112. The process modules 1108 share a single EFEM 1116. Again, the arrangement of laser sensors and other sensors in configurations 1000 and 1100 can differ from other configurations.

In some examples, any of the processing tools described herein may implement loading stations having a stacked configuration. For example, loadings stations 508, 716, 720, etc. as shown in FIGS. 3C and 3E may implement a stacked configuration. In other words, in a stacked configuration, a loading station may include two or more vertically stacked loading stations. In some examples, the stacked configuration may also include a process module or chamber (such as an integrated critical strip (ICS) chamber) vertically stacked with one or more loading stations. Additional laser sensors and other sensors can be used in these stacked configurations.

Additional Examples of Tools

Figure 4:
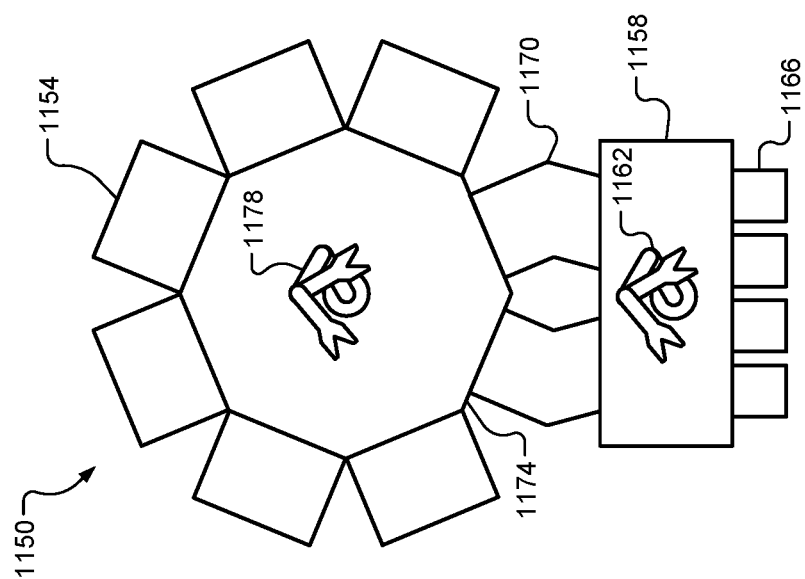
FIG. 4 shows another example of a substrate processing tool.

FIG. 4 shows a top-down view of yet another example of a substrate processing tool 1150. The substrate processing tool 1150 includes a plurality of process modules 1154. For example, each of the process modules 1154 may be configured to perform one or more respective processes on a substrate. Substrates to be processed are loaded into the substrate processing tool 1150 via ports of a loading station of an atmosphere-to-vacuum (ATV) transfer module, such as an equipment front end module (EFEM) 1158, and then transferred into one or more of the process modules 1154. For example, a transfer robot 1162 is arranged to transfer substrates from loading stations 1166 to airlocks, or load locks, 1170, and a vacuum transfer robot 1178 of a vacuum transfer module 1174 is arranged to transfer substrate from the load locks 1170 to the various process modules 1154.

For example, an equipment front end module (EFEM) of a substrate processing tool may include one or more transfer robots for transferring substrates between the EFEM and load locks arranged between the EFEM and a vacuum transfer module (VTM). An internal volume of the EFEM must be sufficient to accommodate the transfer robot. Accordingly, the load locks are typically located outside of a footprint of an equipment front end module (EFEM) between the EFEM and the VTM. In some examples, the EFEM may include a transfer robot having a configuration that allows the airlocks to be located at least partially within the EFEM. The fabrication room 204 shown in FIG. 2 may include a plurality of substrate processing tools 1150.

FIGS. 5A-6C show various examples of configurations in which the plurality of substrate processing tools such as the substrate processing tool 1150 can be arranged. In these examples, the wafers travel through varying paths. Accordingly, the configuration and operation of the robots used to transport the wafers through these paths vary. Further, a variety of sensors are used in these examples to sense various aspects of robots and the wafers. In addition, as will be explained in detail with reference to FIGS. 9A-11, one or more detectors such as laser sensors of the measurement system can be placed anywhere in these examples.

FIGS. 5A-5D show plan views of example configurations of a first substrate processing tool 1200-1, a second substrate processing tool 1200-2, and a third substrate processing tool 1200-3 (collectively substrate processing tools 1200). Each of the substrate processing tools 1200, similar to the substrate processing tool 1150, includes a modified equipment front end module (EFEM) 1204 configured to accommodate at least a portion of load locks 1208. In other words, instead of being located outside of the EFEM 1204 in a gap between the EFEM 1204 and a vacuum transfer module (VTM) 1212, the load locks 208 extend into an interior of the EFEM 1204.

Accordingly, the EFEM 1204 can be located closer to the VTM 1212, reducing the overall footprint and increasing the pitch of the substrate processing tools 1200. For example, a transfer robot 1216 of the EFEM 1204 is arranged closer to loading stations 1220 on a front wall (e.g., a first side) than a back wall 1224 (e.g., a second side) of the EFEM 1204 to provide space for the load locks 1208 to extend into the interior of the EFEM 1204. In some examples, the load locks 1208 may be configured as shown in an alternative arrangement of the substrate processing tool 1200-3 in FIG. 5D. For example only, the loading stations 1220 may correspond to front opening unified pods (FOUPs).

As shown, the substrate processing tools 1200 include six process modules 1228. However, other configurations of the substrate processing tools 1200 may include more than six of the process modules 228. For example, a length of the VTM 1212 may be extended to accommodate additional process modules 1228. Similarly, the VTM 1212 may include vacuum transfer robots 1232 having various configurations. For example, the substrate processing tool 1200-1 includes three vacuum transfer robots 1232 and the substrate processing tool 1200-2 includes two vacuum transfer robots 1232. In the substrate processing tools 1200-1 and 1200-3, the robots 1232 are aligned with a center lengthwise axis of the VTM 1212.

Conversely, the substrate processing tool 1200-3 includes a single vacuum transfer robot 1232 arranged off-center (i.e., shifted to the right or left toward the process modules 1228) relative to the center lengthwise axis of the 1VTM 212. In other words, a primary pivot point of the robot 1232 is off-center. Although shown as having one or two arms, each of the robots 1216 and 1232 may have configurations including one, two, or more arms. In some examples, the robot 1232 may include two end effectors 1234 on each of the arms as shown in FIGS. 5C and 5D.

The substrate processing tools 1200 may include one or more storage buffers 236 configured to store one or more substrates between processing stages. In some examples, storage buffers 1240 may be located within the VTM 1212. In some examples, one or more of the storage buffers 1236 may be replaced with process modules or other components.

In some examples, one or more of the EFEM 1204, the load locks 1208, the VTM 1212, and the process modules 1228 may have a stacked configuration. For example, each of the process modules 1228 may correspond to two process modules 1228 in a vertically stacked configuration (i.e., one process module 1228 arranged above/below the other), the VTM 1212 may correspond to two VTMs 1212 in the vertically stacked configuration, each of the load locks 1208 may correspond to two load locks 1208 in the vertically stacked configuration, and each of the loading stations 1220 may correspond to two loading stations 1220 in the vertically stacked configuration. A height of the EFEM 1204 may be increased to allow the robot 1216 to be raised and lowered to different levels within the EFEM 1204 to access multiple levels of the loading stations 1220 and the load locks 1208. As can be appreciated, the arrangement of laser sensors and other sensors in these configurations can vary correspondingly.

FIGS. 6A-6C show plan views of example configurations of another substrate processing tool 1600. The substrate processing tool 1600 includes a modified equipment front end module (EFEM) 1604 configured to accommodate at least a portion of one or more load locks 1608. In other words, instead of being located entirely outside of the EFEM 1604 in a gap between the EFEM 1604 and a vacuum transfer module (VTM) 1612, the load locks 1608 extend into an interior of the EFEM 1604. Accordingly, the EFEM 1604 can be located closer to the VTM 1612, reducing the overall footprint and increasing the pitch of a plurality of the substrate processing tools 1600.

As shown, the substrate processing tool 1600 includes ten process modules 1616. However, other configurations of the substrate processing tools 1600 may include more than ten of the process modules 1616. For example, a length of the VTM 1612 may be extended to accommodate additional process modules 1616. Similarly, the VTM 1612 may include vacuum one or more transfer robots 1620 (e.g., transfer robots 1620-1, 1620-2, 1620-3, 1620-4, and 1620-5) having various configurations. As shown, the transfer robots 1620 include one arm 1624 having three arm segments 1628 and one end effector 1632 in each of the configurations. In other configurations, the transfer robots 1620 may include one, two, or more arms 1624. In some examples, the robots 1620 may include two of the end effectors 1632 on each of the arms 1624.

In FIG. 6A, the substrate processing tool 1600 includes a single vacuum transfer robot 1620-1 arranged off-center (i.e., shifted to the right or left toward the process modules 1616) relative to the center lengthwise axis of the VTM 1612. In other words, a primary pivot point of the robot 1620-1 is off-center. The robot 1620-1 is positioned and configured to access each of the ten process modules 1616 and the load lock(s) 1608. In configurations where the substrate processing tool 1600 includes storage buffers 1636 and/or storage buffers 1640, the robot 1620-1 is also configured to access the storage buffers 1636/1640.

In FIGS. 6B and 6C, the substrate processing tool 1600 includes two vacuum transfer robot 1620-2 and 1620-3 or 1620-4 and 1620-5, respectively, arranged off-center (i.e., shifted to the right or left toward the process modules 1616) relative to the center lengthwise axis of the VTM 1612. The robots 1620-2 and 1620-4 are positioned and configured to access selected ones of the ten process modules 1616 and the load lock(s) 608. Conversely, the robots 1620-3 and 1620-5 are positioned and configured to access others of the ten process modules 1616. In configurations where the substrate processing tool 1600 includes storage buffers 1636 and/or storage buffers 1640, the robots 1620-3 and 1620-5 may also be configured to access the storage buffers 1636, while both of the robots 1620-2 and 1620-3 in FIG. 6B and both of the robots 1620-4 and 1620-5 in FIG. 6A are configured to access the storage buffers 1640.

For example, as shown in FIG. 6B, the robot 1620-2 is aligned with (e.g., centered on a horizontal axis of) a respective one of the process modules 1616 while the robot 1620-3 is arranged centered between adjacent ones of the process modules 1616. Conversely, as shown in FIG. 6C, each of the robots 1620-4 and 1620-5 is aligned with a respective one of the process modules 1616. As can be appreciated, the arrangement of laser sensors and other sensors in these configurations can vary significantly.

Examples of Chambers

Figure 7A:
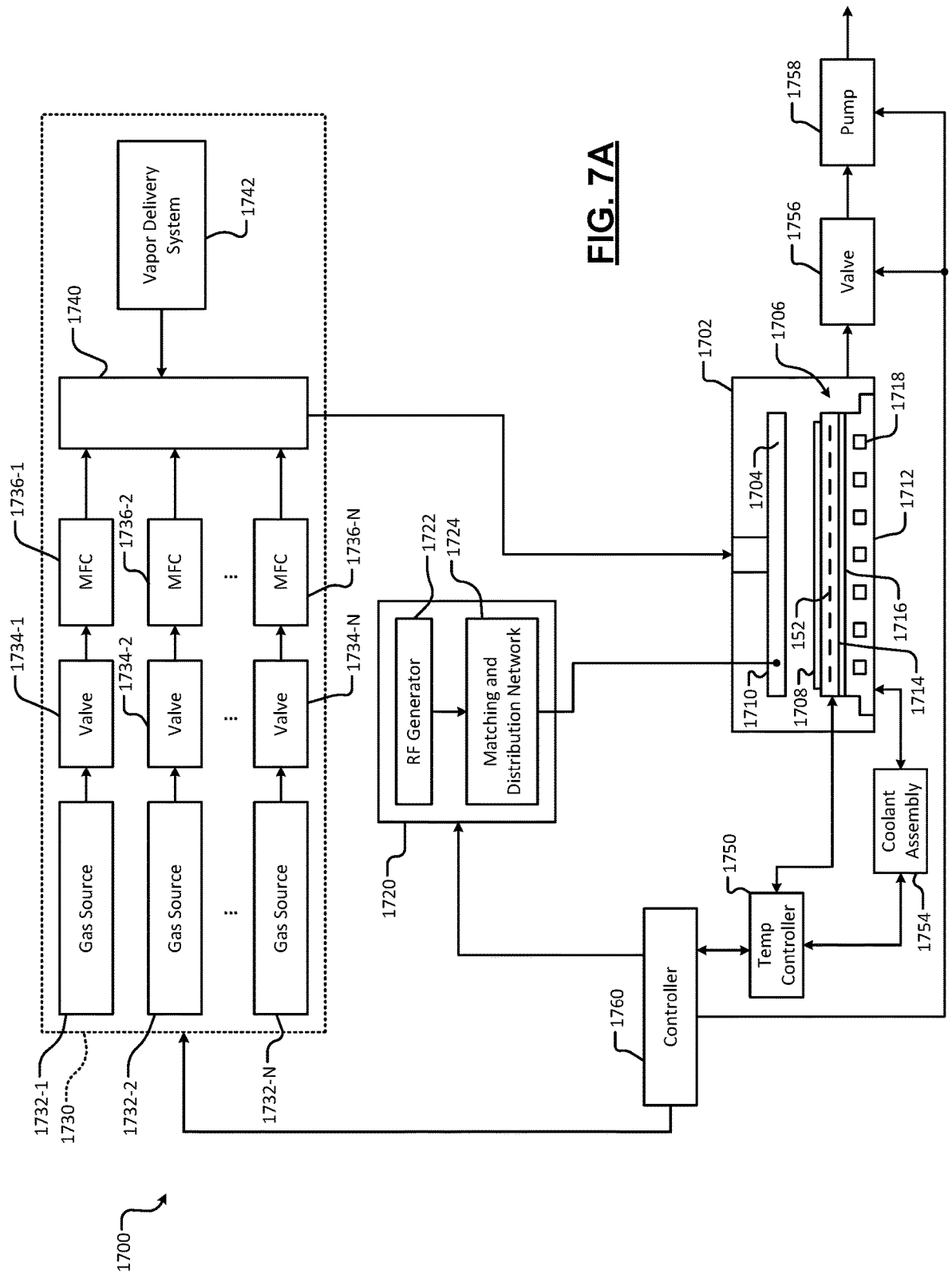
FIGS. 7A-7C show functional block diagrams of substrate processing systems comprising various processing chambers.
Figure 7B:
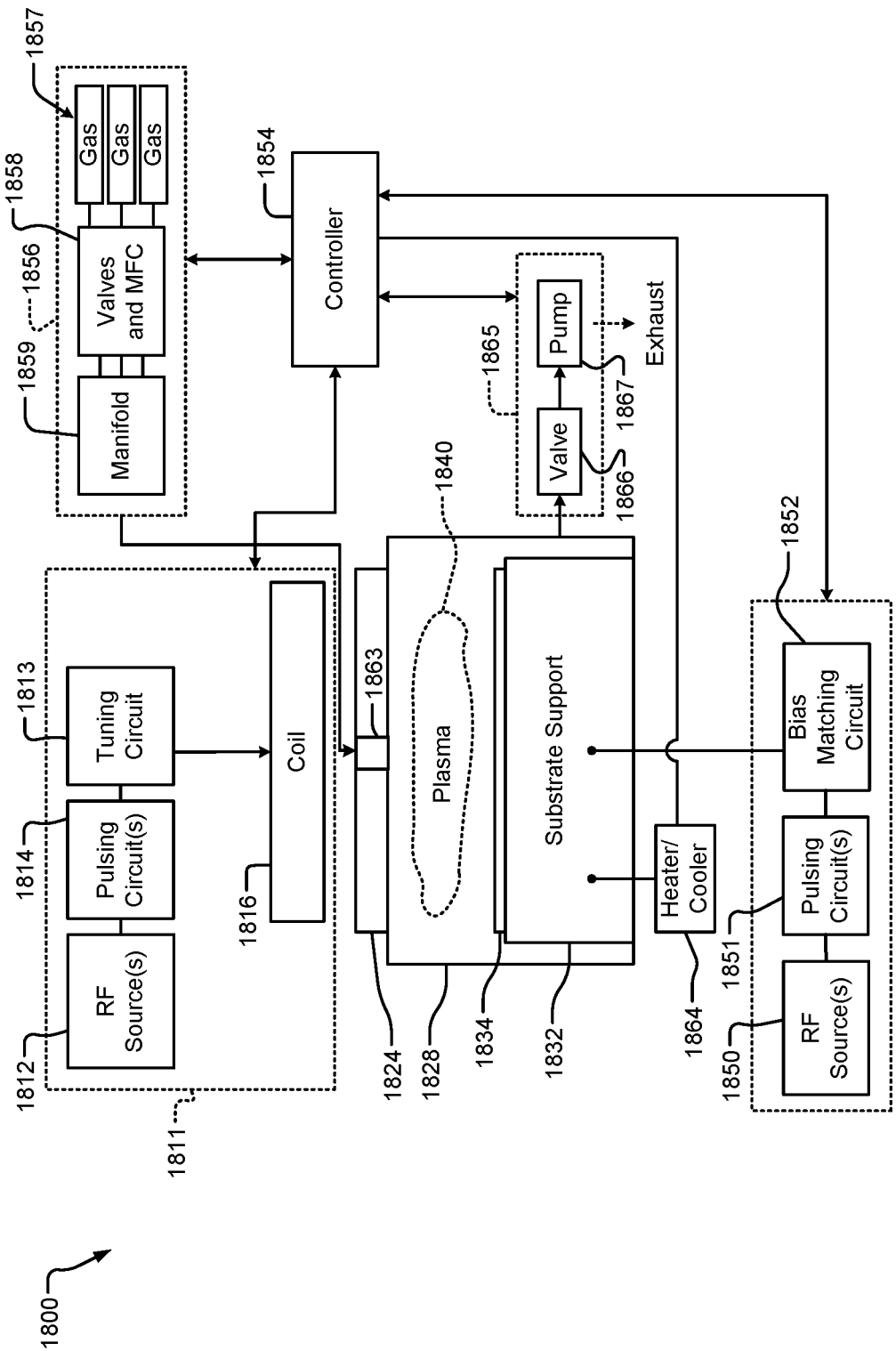
Figure 7C:
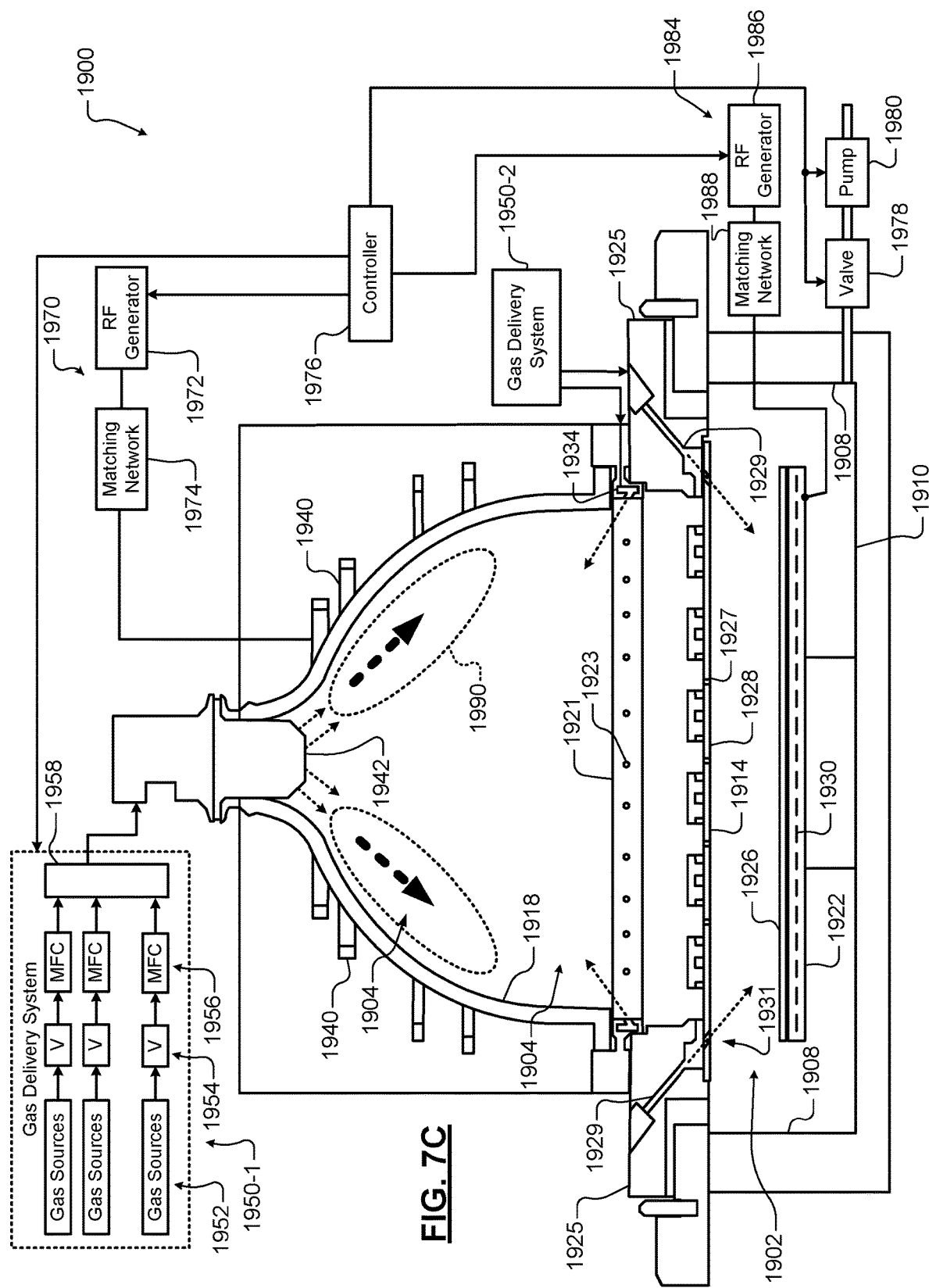

FIGS. 7A-7C show different examples of process modules (PMs) that can be used in the tools shown in FIGS. 1-6C. These process chambers may also be equipped with one or more cameras (not shown) that are placed outside a window of a PM are used to monitor in the interior of the PM. These cameras are part of the other sensors typically used to sense various operations of the PMs and the tool. The measurement system operates in tandem with these other sensors and cameras as will be explained below with reference to FIGS. 9-11. The controllers described in FIGS. 7A-7C may exchange data with the measurement system and may operate respective PMs based on data received from the measurement system as explained below with reference to FIGS. 9A-11.

FIG. 7A shows an example of a substrate processing system 1700 comprising a processing chamber 1702. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching processes. The system 1700 comprises the processing chamber 1702 that encloses other components of the system 1700 and contains an RF plasma (if used). The processing chamber 1702 comprises an upper electrode 1704 and an electrostatic chuck (ESC) 1706 or other substrate support. During operation, a substrate 1708 is arranged on the ESC 1706.

For example, the upper electrode 1704 may include a gas distribution device 1710 such as a showerhead that introduces and distributes process gases. The gas distribution device 1710 may include a stem portion including one end connected to a top surface of the processing chamber 1702. A base portion of the showerhead is generally cylindrical and extends radially outwardly from an opposite end of the stem portion at a location that is spaced from the top surface of the processing chamber 1702. A substrate-facing surface or faceplate of the base portion of the showerhead includes a plurality of holes through which vaporized precursor, process gas, or purge gas flows. Alternately, the upper electrode 1704 may include a conducting plate, and the process gases may be introduced in another manner.

The ESC 1706 comprises a baseplate 1712 that acts as a lower electrode. The baseplate 1712 supports a heating plate 1714, which may correspond to a ceramic multi-zone heating plate. A thermal resistance layer 1716 may be arranged between the heating plate 1714 and the baseplate 1712. The baseplate 1712 may include one or more channels 1718 for flowing coolant through the baseplate 1712.

If plasma is used, an RF generating system 1720 generates and outputs an RF voltage to one of the upper electrode 1704 and the lower electrode (e.g., the baseplate 1712 of the ESC 1706). The other one of the upper electrode 1704 and the baseplate 1712 may be DC grounded, AC grounded, or floating. For example, the RF generating system 1720 may include an RF generator 1722 that generates RF power that is fed by a matching and distribution network 1724 to the upper electrode 1704 or the baseplate 1712. In other examples, the plasma may be generated inductively or remotely.

A gas delivery system 1730 includes one or more gas sources 1732-1, 1732-2, . . . , and 1732-N (collectively gas sources 1732), where N is an integer greater than zero. The gas sources 1732 are connected by valves 1734-1, 1734-2, . . . , and 1734-N (collectively valves 1734) and mass flow controllers 1736-1, 1736-2, . . . , and 1736-N (collectively mass flow controllers 1736) to a manifold 1740. A vapor delivery system 1742 supplies vaporized precursor to the manifold 1740 or another manifold (not shown) that is connected to the processing chamber 1702. An output of the manifold 1740 is fed to the processing chamber 1702.

A temperature controller 1750 may be connected to a plurality of thermal control elements (TCEs) 1752 arranged in the heating plate 1714. The temperature controller 1750 may be used to control the plurality of TCEs 1752 to control a temperature of the ESC 1706 and the substrate 1708. The temperature controller 1750 may communicate with a coolant assembly 1754 to control coolant flow through the channels 1718. For example, the coolant assembly 1754 may include a coolant pump, a reservoir, and one or more temperature sensors (not shown). The temperature controller 1750 operates the coolant assembly 1754 to selectively flow the coolant through the channels 1718 to cool the ESC 1706. A valve 1756 and pump 1758 may be used to evacuate reactants from the processing chamber 1702. A system controller 1760 controls the components of the system 1700.

FIG. 7B shows another example of a substrate processing system 1800. The substrate processing system 1800 includes a coil driving circuit 1811. In some examples, the coil driving circuit 1811 includes an RF source 1812, a pulsing circuit 1814, and a tuning circuit (i.e., matching circuit) 1813. The pulsing circuit 1814 controls a transformer coupled plasma (TCP) envelope of an RF signal generated by the RF source 1812 and varies a duty cycle of TCP envelope between 1% and 99% during operation. As can be appreciated, the pulsing circuit 1814 and the RF source 1812 can be combined or separate.

The tuning circuit 1813 may be directly connected to an inductive coil 1816. While the substrate processing system 1810 uses a single coil, some substrate processing systems may use a plurality of coils (e.g., inner and outer coils). The tuning circuit 1813 tunes an output of the RF source 1812 to a desired frequency and/or a desired phase, and matches an impedance of the coil 1816.

A dielectric window 1824 is arranged along a top side of a processing chamber 1828. The processing chamber 1828 comprises a substrate support (or pedestal) 1832 to support a substrate 1834. The substrate support 1832 may include an electrostatic chuck (ESC), or a mechanical chuck or other type of chuck. Process gas is supplied to the processing chamber 1828 and plasma 1840 is generated inside of the processing chamber 1828. The plasma 1840 etches an exposed surface of the substrate 1834. An RF source 1850, a pulsing circuit 1851, and a bias matching circuit 1852 may be used to bias the substrate support 1832 during operation to control ion energy.

A gas delivery system 1856 may be used to supply a process gas mixture to the processing chamber 1828. The gas delivery system 1856 may include process and inert gas sources 1857, a gas metering system 1858 such as valves and mass flow controllers, and a manifold 1859. A gas injector 1863 may be arranged at a center of the dielectric window 1824 and is used to inject gas mixtures from the gas delivery system 1856 into the processing chamber 1828. Additionally or alternatively, the gas mixtures may be injected from the side of the processing chamber 1828.

A heater/cooler 1864 may be used to heat/cool the substrate support 1832 to a predetermined temperature. An exhaust system 1865 includes a valve 1866 and pump 1867 to control pressure in the processing chamber and/or to remove reactants from the processing chamber 1828 by purging or evacuation.

A controller 1854 may be used to control the etching process. The controller 1854 monitors system parameters and controls delivery of the gas mixture; striking, maintaining, and extinguishing the plasma; removal of reactants; supply of cooling gas; and so on. Additionally, as described below, the controller 1854 may control various aspects of the coil driving circuit 1810, the RF source 1850, and the bias matching circuit 1852, and so on.

FIG. 7C shows a processing chamber 1900 for etching a layer of a substrate. The processing chamber 1900 includes a lower chamber region 1902 and an upper chamber region 1904. The lower chamber region 1902 is defined by chamber sidewall surfaces 1908, a chamber bottom surface 1910, and a lower surface of a gas distribution device 1914.

The upper chamber region 1904 is defined by an upper surface of the gas distribution device 1914 and an inner surface of a dome 1918. In some examples, the dome 1918 rests on a first annular support 1921. In some examples, the first annular support 1921 includes one or more spaced holes 1923 for delivering process gas to the upper chamber region 1904. In some examples, the process gas is delivered by the one or more spaced holes 1923 in an upward direction at an acute angle relative to a plane including the gas distribution device 1914, although other angles/directions may be used. In some examples, a gas flow channel 1934 in the first annular support 1921 supplies gas to the one or more spaced holes 1923.

The first annular support 1921 may rest on a second annular support 1925 that defines one or more spaced holes 1927 for delivering process gas from a gas flow channel 1929 to the lower chamber region 1902. In some examples, holes 1931 in the gas distribution device 1914 align with the holes 1927. In other examples, the gas distribution device 1914 has a smaller diameter, and the holes 1931 are not needed. In some examples, the process gas is delivered by the one or more spaced holes 1927 in a downward direction towards a substrate 1926 at an acute angle relative to the plane including the gas distribution device 1914, although other angles/directions may be used. In other examples, the upper chamber region 1904 is cylindrical with a flat top surface and one or more flat inductive coils may be used. In still other examples, a single chamber may be used with a spacer located between a showerhead and the substrate support.

A substrate support 1922 is arranged in the lower chamber region 1904. In some examples, the substrate support 1922 includes an electrostatic chuck (ESC), although other types of substrate supports can be used. The substrate 1926 is arranged on an upper surface of the substrate support 1922 during etching. In some examples, a temperature of the substrate 1926 may be controlled by a heater plate 1930, an optional cooling plate with fluid channels, and one or more sensors (not shown), although any other suitable substrate support temperature control system may be used.

In some examples, the gas distribution device 1914 includes a showerhead (for example, a plate 1928 having a plurality of spaced holes 1927). The plurality of spaced holes 1927 extend from the upper surface of the plate 1928 to the lower surface of the plate 1928. In some examples, the spaced holes 1927 have a diameter in a range from 0.4" to 0.75" and the showerhead is made of a conducting material such as aluminum or a non-conductive material such as ceramic with an embedded electrode made of a conducting material.

One or more inductive coils 1940 are arranged around an outer portion of the dome 1918. When energized, the one or more inductive coils 1940 create an electromagnetic field inside of the dome 1918. In some examples, an upper coil and a lower coil are used. A gas injector 1942 injects one or more gas mixtures from a gas delivery system 1950-1.

In some examples, the gas delivery system 1950-1 includes one or more gas sources 1952, one or more valves 1954, one or more mass flow controllers (MFCs) 1956, and a mixing manifold 158, although other types of gas delivery systems may be used. A gas splitter (not shown) may be used to vary flow rates of a gas mixture. Another gas delivery system 1950-2 may be used to supply an etch gas or an etch gas mixture to the gas flow channels 1929 and/or 1934 (in addition to or instead of etch gas from the gas injector 1942).

In some examples, the gas injector 1942 includes a center injection location that directs gas in a downward direction and one or more side injection locations that inject gas at an angle with respect to the downward direction. In some examples, the gas delivery system 1950-1 delivers a first portion of the gas mixture at a first flow rate to the center injection location and a second portion of the gas mixture at a second flow rate to the side injection location(s) of the gas injector 1942. In other examples, different gas mixtures are delivered by the gas injector 1942. In some examples, the gas delivery system 1950-1 delivers tuning gas to the gas flow channels 1929 and 1934 and/or to other locations in the processing chamber as will be described below.

A plasma generator 1970 may be used to generate RF power that is output to the one or more inductive coils 1940. Plasma 1990 is generated in the upper chamber region 1904. In some examples, the plasma generator 1970 includes an RF generator 1972 and a matching network 1974. The matching network 1974 matches an impedance of the RF generator 1972 to the impedance of the one or more inductive coils 1940. In some examples, the gas distribution device 1914 is connected to a reference potential such as ground. A valve 1978 and a pump 1980 may be used to control pressure inside of the lower and upper chamber regions 1902, 1904 and to evacuate reactants.

A controller 1976 communicates with the gas delivery systems 1950-1 and 1950-2, the valve 1978, the pump 1980, and the plasma generator 1970 to control flow of process gas, purge gas, RF plasma and chamber pressure. In some examples, plasma is sustained inside the dome 1918 by the one or more inductive coils 1940. One or more gas mixtures are introduced from a top portion of the chamber using the gas injector 1942 (and/or holes 1923), and plasma is confined within the dome 1918 using the gas distribution device 1914.

Confining the plasma in the dome 1918 allows volume recombination of plasma species and effusing desired etchant species through the gas distribution device 1914. In some examples, there is no RF bias applied to the substrate 1926. As a result, there is no active sheath on the substrate 1926 and ions are not hitting the substrate with any finite energy. Some amount of ions will diffuse out of the plasma region through the gas distribution device 1914. However, the amount of plasma that diffuses is an order of magnitude lower than the plasma located inside the dome 1918. Most ions in the plasma are lost by volume recombination at high pressures. Surface recombination loss at the upper surface of the gas distribution device 1914 also lowers ion density below the gas distribution device 1914.

In other examples, an RF bias generator 1984 is provided and includes an RF generator 1986 and a matching network 1988. The RF bias can be used to create plasma between the gas distribution device 1914 and the substrate support or to create a self-bias on the substrate 1926 to attract ions. The controller 1976 may be used to control the RF bias.

An edge coupling ring can be used to adjust an etch rate and/or etch profile of the plasma near a radially outer edge of the substrate. The edge coupling ring is typically located on the pedestal around the radially outer edge of the substrate. Process conditions at the radially outer edge of the substrate can be modified by changing a position of the edge coupling ring, a shape or profile of an inner edge of the edge coupling ring, a height of the edge coupling ring relative to an upper surface of the substrate, a material of the edge coupling ring, etc.

Figure 7D:
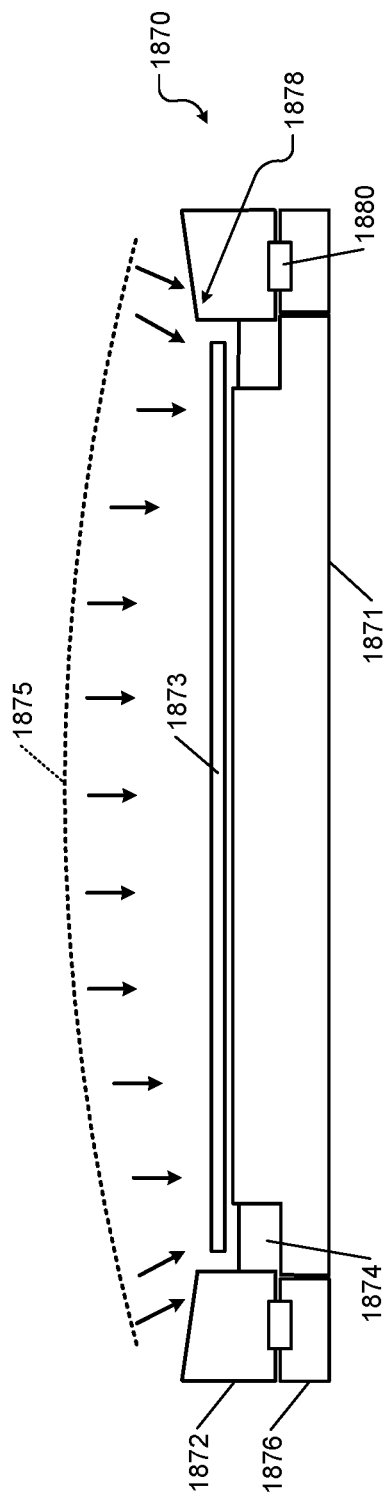
FIG. 7D shows an example of an edge coupling ring in a processing chamber.

FIG. 7D shows an example of an edge coupling ring 1870 surrounding a pedestal 1871. The edge coupling ring 1870 may include a single portion or two or more portions. In the example shown, the edge coupling ring 1870 includes a first annular portion 1872 arranged radially outside of a substrate 1873. A second annular portion 1874 is located radially inwardly from the first annular portion 1872 below the substrate 1873. A third annular portion 1876 is arranged below the first annular portion 1872. During use, plasma 1875 is directed at the substrate 1873 to etch the exposed portions of the substrate 1873. The edge coupling ring 1870 is arranged to help shape the plasma such that uniform etching of the substrate 1873 occurs. After the edge coupling ring 1870 has been used, an upper surface of a radially inner portion of the edge coupling ring 1870 may exhibit erosion (e.g., at 1878). As a result, plasma 1875 may tend to etch a radially outer edge of the substrate 1873 at a faster rate than etching of radially inner portions thereof, and non-uniform etching of the substrate 1873 may occur near a radially outer edge of the substrate 1873. In some implementations, the edge coupling ring is located on 3 or more lift pins that transport the ring up gradually as its top surface gets eroded, to maintain an optimal value for edge coupling ring height above the ESC during the ring's lifetime.

One or more portions of an edge coupling ring 1870 may be moved vertically and/or horizontally relative to a substrate or pedestal 1871. The movement changes an edge coupling effect of the plasma 1875 relative to the substrate 1873 during etching or other substrate treatment without requiring the processing chamber to be opened. An actuator 1880 may be arranged in various locations to move one or more portions of the edge coupling ring 1870 relative to the substrate 1873. For example only, the actuator 1880 can be arranged between the first annular portion 1872 and the third annular portion 1876 of the edge coupling ring 1870. In some examples, the actuator 1880 may include a piezoelectric actuator, a stepper motor, a pneumatic drive, or other suitable actuator. In some examples, one, two, three, or four or more actuators are used. In other examples, multiple actuators can be arranged uniformly around the edge coupling ring 1870. The actuators may be arranged inside or outside of the processing chamber.

The actuator 1880 is used to move one or more portions of the edge coupling ring 1870 to alter the position of the one or more portions of the edge coupling ring 1870. For example, the actuator 1880 may be used to move the first annular portion 1872 of the edge coupling ring 1870. In this example, the actuator 1880 moves the first annular portion 1872 of the edge coupling ring 1870 in an upward or vertical direction such that an edge of the first annular portion 1872 of the edge coupling ring 1870 is higher relative to the radially outer edge of the substrate 1873. As a result, etch uniformity near the radially outer edge of the substrate 1873 is improved.

The actuator 1880 may move in other directions such as horizontal, diagonal, etc. Horizontal movement of the portion of the edge coupling ring 1870 may be performed to center the edge coupling effect relative to the substrate 1873. For example, the actuator 1880 may be arranged radially outside of the edge coupling ring 1870. In addition, the actuator 1880 can move in a vertical (or an up/down) direction as well as in a horizontal (or side to side) direction. Horizontal repositioning may be used when etching of the substrates shows a horizontal offset of the edge coupling ring 1870 relative to the substrates. The horizontal offset may be corrected without opening the processing chamber. Likewise, tilting of the edge coupling ring 1870 may be performed by actuating some of the actuators differently than others of the actuators to correct or create side-to-side asymmetry.

Measurement System

As can be appreciated from the above description, there are various types of processes performed on various types of wafers. The wafers are processed in process modules arranged in tools having different configurations. Depending on the processes being performed and the configurations of the tools, the wafers and associated edge coupling rings often travel (i.e., are transported) to/from chambers. Various types of data is collected from these chambers and tools using sensors that are disposed at various locations in the chambers and tools. These sensors can include cameras arranged around a processing chamber to observe and provide additional data about various components within the processing chamber.

Additional cameras can be arranged elsewhere in the tools (e.g., above airlocks) and can be used to measure various parameters of edge coupling rings. However, determining a profile (3D model) of an edge coupling ring along X, Y, and Z axes typically needs at least two cameras arranged in a location where new/used edge coupling rings will pass through (e.g., airlock, aligner, robot arm, etc.). To obtain the profile with an accuracy of 1 micron or less, the cameras need to be of very high resolution and mounted on high precision machined brackets together with high quality lenses. Such camera systems are bulky and expensive. Further, to use cameras, lighting needs to be arranged in a consistent and repeatable manner. Furthermore, computer vision algorithms used for processing images captured by these cameras can be very complex and computationally expensive and yet may have some degree of uncertainties. All these issues make using cameras very challenging.

Instead, the present disclosure provides systems and methods for determining profiles of edge coupling rings and wafers along X, Y, and Z axes (e.g., thickness of edge ring in radial and tangential directions) using one or more laser (light) sensors. The laser sensors are smaller in size than the high resolution cameras. The laser sensors can measure the profile with an accuracy of 0.1 micron or less. The laser sensors are relatively less expensive than the high resolution cameras and lenses and can provide higher measurement accuracy. The laser sensors do not need additional lighting arrangement needed by the cameras. Further, the algorithms for processing the data captured by the laser sensors are robust, repeatable, and easy to implement.

The laser sensors can measure a wide range of variables (geometric parameters) of edge coupling rings and wafers. For example, the variables for edge coupling rings may include but are not limited to thickness, width, outer/inner diameter, warpage/flatness, 2D/3D shape, and surface roughness. For example, the variables for wafers may include but are not limited to thickness and warpage/flatness. A change in any of these parameters including the change in thickness of a new/used edge coupling ring is a tool for quantifying process characteristics (etch rate, etch uniformity, etc.) in a processing module. Similarly, a change in thickness etc. of a wafer is an indication of process characteristics (etch/deposition rate, etch/deposition uniformity, etc.) in a processing module. A measure of these changes across a fleet of tools can be used for autonomous process optimization and PM matching by adjusting (optimizing) process recipe parameters, controlling PM configuration (height of the edge coupling ring above ESC, upper/lower electrode gap/alignment/tilt, etc.) and auto-clean recipe/frequency in an automated and closed-loop manner.

By measuring flatness of a used edge coupling ring, non-uniform etch rate across tangential direction can be identified. This information can be used to tune PM parameters (e.g., spatial-dependent temperature distribution of ESC, adding artificial non-uniformity into height tuning of the edge coupling ring lift pins, etc.) to achieve PM matching, autonomous process optimization, uniform on-wafer results, etc. The PM control parameters can be determined using machine learning algorithms running on a distributed computing system overseeing the factory operation across the fleet (described below).

There are multiple sources for PM mismatch as well as non-optimal process results including upper/lower electrode assembly misalignment, variations in chamber parts tolerances and assembly tolerance stack-up, chamber subsystem malfunction (valves, actuators, sensors, heating/cooling mechanism, etc.), and variation in process by-products accumulation on chamber (chamber cleaning process quality). Any of these factors can change the plasma field uniformity in the PM and affect process results. Parameters such as changes in thickness in radial and tangential directions, top surface slope, inner diameter (ID), and surface roughness of an edge coupling ring pre/post-process, which can be extracted from 1D/2D/3D laser sensors data via reflectometry and interferometry, can indicate PM issues listed above. Once an issue is detected corrective actions can be identified on remote server and performed on the tool.

Throughout the present disclosure, references to autonomous process optimization and PM matching should be understood as referring to adjusting (optimizing) process recipe parameters, controlling PM configuration (height of the edge coupling ring above ESC, upper/lower electrode gap/alignment/tilt, etc.) and auto-clean recipe/frequency in an automated and closed-loop manner. Further, throughout the present disclosure, references to PM matching should be understood as rectifying multiple sources for PM mismatch as well as non-optimal process results including upper/lower electrode assembly misalignment, variations in chamber parts tolerances and assembly tolerance stack-up, chamber subsystem malfunction (valves, actuators, sensors, heating/cooling mechanism, etc.), and variation in process by-products accumulation on chamber (chamber cleaning process quality).

The corrective actions are performed for not only cleaning processes but other parameters as well. Non-limiting examples follow. Examples of corrective actions include tuning process parameters (e.g., gas flow, pressure, upper electrode temperature, ESC spatial dependent temperature distribution, bias voltage, etch/deposition rate, etch/deposition uniformity, etc.), upper/lower electrodes gap and alignment/tilt, edge ring height above ESC, cleaning process recipe and frequency, etc. Examples of cleaning mechanisms include Waferless Auto Clean (WAC), Cover Wafer Area Clean (CWAC), and so on. Collecting measurements of these parameters across the fleet can help tune the process parameters (e.g., etch/deposition rate, etch/deposition uniformity, etc.) as well as WAC/CWAC parameters, duration, frequency, etc. in a closed loop manner. Variations in ID edge shape/profile of an edge coupling ring pre/post-process can be an indication of PM issues which enables guided troubleshooting and automatic prompt for PM maintenance. Different thickness profile near ID edge determined based on measurements collected over time can help indicate a specific part/subsystem malfunction. Similarly, wafer measurements can also be used to assess variation in on-wafer process characteristics as well chamber as cleaning quality.

Further, cleaning processes used in different chambers can vary widely based on the type of processing (e.g., etching, deposition, etc.) being performed in those chambers. For example, some chambers may need to be cleaned after processing every wafer while another chamber may need to be cleaned after processing multiple wafers. Furthermore, the parameters of the cleaning process recipe may also vary. All these factors such as the type and frequency of the cleaning process recipe can be correlated to the measurements of the edge coupling rings and wafers. Models trained based on the correlations can then be used to automate the cleaning processes. For example, in use, based on the measurements of an edge coupling ring and/or a wafer, a trained model can select WAC recipe and frequency of the cleaning. Further, PM performance (e.g., etch rate, etch uniformity, auto-clean, etc.) can also be assessed using the measurements performed on an ongoing basis, and the PM performance parameters can be fine-tuned on the fly based on these assessments to achieve autonomous process optimization and PM matching.

Accordingly, the measurement system not only assesses the performance of cleaning process but also assesses on-wafer process results (e.g., etch rate and deposition rate uniformity). Further, as explained below with reference to FIG. 9A onwards, based on the measurements of an edge coupling ring and/or a wafer, the measurement system can use a trained model or models to autonomously tune process parameters (gas flow, pressure, upper electrode temperature, ESC spatial dependent temperature distribution, bias voltage, etc.), upper/lower electrodes gap and alignment/tilt, edge ring height above the ESC. Throughout the present disclosure the phrase "etch rate" used with reference to an edge coupling ring should be understood as "effective etch rate" and as "etch rate" when used with reference to wafer.

A distributed computing system composed of big data and machine learning platforms (described below) is used to implement these systems and methods according to the present disclosure. A majority of machine learning applications need an initial phase of data collection and data labeling to use for model training. Data labeling in this initial period—which could be 6 months to a few years for example—could be automated or manual. After models are trained using machine learning, the trained models are used in real time and their accuracy is improved by continued training based on the collected new data on an ongoing basis during use (i.e., production).

The geometric parameters of edge coupling rings and wafers can be measured using one or more laser sensors arranged, for example, on a lid or cover of an airlock chamber as follows. For example, a change in thickness profile of an edge coupling ring or a wafer can be measured using a laser sensor arranged above the airlock chamber as follows. Before using the edge coupling ring or the wafer in a PM, the laser sensor transmits a laser beam onto a top surface of the edge coupling ring or the wafer while the edge coupling ring or the wafer rests in the airlock chamber. The laser sensor senses a reflection of the laser beam from the top surface of the edge coupling ring or the wafer. Light interferometry measurement is performed based on the time of travel of the laser beam from the light source (emitter) in the laser sensor to the top surface of the edge coupling ring or the wafer and back to the sensing element of the laser sensor, a distance between the laser sensor and the top surface of the edge coupling ring or the wafer is calculated. After the edge coupling ring is used for a number of RF hours (or after the wafer is processed) in the PM, the same procedure is performed to obtain the distance between the laser sensor and the top surface of the edge coupling ring or the wafer. A difference between the two distance measurements represents a change in thickness of the edge coupling ring or the wafer. Additional description regarding measurements performed using reflectometry and interferometry follows with reference to description the laser sensors shown in FIGS. 10A-10C.

The edge coupling rings can be made of different materials. The wafers can also include multiple layers of different film materials. Particularly, the composition of the wafer material top film layer may change after etching and deposition. Some of these materials may be transparent to some frequencies of light while other materials may be opaque to some other frequencies of light. The sensor can include emitters that can emit and sense electromagnetic waves of different frequencies to perform measurements of edge coupling rings made of different materials or wafers comprising film different materials. These frequencies can be controlled during the measurements. For example, these frequencies can be changed depending on the material of the edge coupling ring or the wafer under measurement. Alternatively, white light which is composed of a wide range of frequency components can be used as emitter.

The overall data flow of the measurement system is as follows. The laser sensor sends data sensed from an edge coupling ring or the wafer to a system controller. The system controller may processes the data and sends the pre-/post-processed data to a host/cloud (e.g., a data center). For autonomous process optimization and PM-to-PM matching, measurements are performed on edge coupling rings or wafers in several tools and fleets of tools. Data from several tools and fleets of tools is collected at the host/cloud (e.g., data center). Models are trained based on the collected data at the host/cloud (e.g., data center) using machine learning.

In use, the models receive data from a tool and send responses to the tool based on the received data in real time or near real time to optimize the performance of the tool.

If etch rate in a PM varies and is spatial-dependent, different areas of an edge coupling ring can erode at different rates. The erosion of the edge coupling ring can be detected by measuring flatness of the edge coupling ring as follows. For example, depending on variation in the etch rate in a PM, location A, which could be a point/spot (1D), a line (2D), or an area (3D), on an edge coupling ring can erode faster or slower than point B on the edge coupling ring. This can be detected by measuring the thickness and slope of the edge coupling ring at points A and B. One way of measuring the thickness of the edge coupling ring at points A and B is to place the edge coupling ring in the airlock and perform the thickness measurement at point A. Then the edge coupling ring can be rotated (e.g., using an aligner in EFEM) or moved via the robot under the sensor and the thickness measurement can be performed at point B. If the thickness measurements are different at points A and B, the etch rate is spatial-dependent in the PM. The difference between the thickness measurements at points A and B can quantify an amount by which the etch rate is spatial-dependent in the PM.

This information can then be used to make adjustments in the processing chamber to make the etch rate uniform throughout the processing chamber. For example, based on the information, the spatial temperature profile of the chuck can be changed by controlling the matrix heaters in the chuck, the height/tilt of the edge coupling ring can be changed by controlling the pins used to adjust the height/tilt of the edge coupling ring, the alignment/tilt of upper/lower electrode assembly can be tuned and so on.

Similar procedure can be used to measure change in thickness of a wafer before and after processing in a PM, and the measurement can be used to determine etch rate/uniformity or deposition rate/uniformity and to adjust the process results by adjusting recipe parameters of the process being performed in the PM, adjusting the temperature profile of the chuck in the PM, and so on.

Two or more laser sensors can be used in an airlock chamber, for example. The uncertainty of the measurements can decrease in direct proportion to the number of sensors used to collect data from an edge coupling ring. However, increasing the number of sensors can also increase cost, complexity of data processing, and maintenance issues. Instead, using smaller number of sensors (e.g., two) coupled with robust data processing can provide sufficient accuracy.

The laser sensor can include a transmit element to emit an electromagnetic (EM) wave (e.g., light) and a receiving element to measure the reflected EM wave from the surface of the object (e.g., edge ring or wafer). The transmit element can include one or multiple arrays of emitters, and the receive element can include one or multiple arrays of receivers. For a point (1D) measurement, only one emitter may be used to transmit EM wave (e.g., light) onto a point on an edge coupling ring or a wafer. For a line (2D) measurement, a single or a line of emitters may be used to transmit light onto a portion of an edge coupling ring or a wafer. For making an area (3D) measurement, one or multiple array of emitters may be used to transmit light onto an area of an edge coupling ring or a wafer. Alternatively, a sensor with a broadband EM emitter (e.g., light source) and a plurality of receivers may be used to perform these measurements. One or multiple lens(es) and mirror(s) may be used to direct the generated/received EM beam(s) in a parallel path towards the desired location on the object or sensing elements. Examples of laser sensors are shown and described below with reference to FIGS. 10A-10C.

Over time, as more and more data is collected and analyzed, signatures or patterns of erosion of the edge coupling rings and thickness changes of the wafers can be recorded and correlated to corrective actions/adjustments needed in a PM. This can significantly simplify process optimization and enable guided troubleshooting and predictive maintenance. For example, data collected from an edge coupling ring or a wafer using the laser sensor can be transformed into a signature (feature vector) and transmitted to a trained model. The trained model can compare the received data signature to signatures and associated corrective actions stored in a database. Based on the comparison, the trained model can return an output indicating required modifications to PM operating conditions, process recipe, and required service on specific assembly or subassembly in the PM (e.g., auto-clean, valve maintenance, lift pin calibration, upper/lower electrode gap adjustment, etc.). In some instances, the corrective action may simply be adjusting a process parameter of the process being performed in the PM, altering the temperature profile of the chuck, the recipe used for automated cleaning (WAC/CWAC) or adjusting the height/tilt of the edge coupling ring in the PM, which can be automatically performed based on the signature comparison in a closed loop manner.

Thus, the measuring system of the present disclosure includes a hierarchical strategy for addressing problems and providing solutions to the problems. For example, each time data is collected from an edge coupling ring or a wafer and sent to the model in the form of a data signature, the model can perform the signature comparison and indicate a plurality of solutions or corrective actions that can be performed in an order. Then at the tool, the system controller can determine whether and which of the actions have already been performed, and perform the next action in the order based on the determination.

For example, in response to detecting a particular thickness signature pattern for an edge coupling ring, the suggestion from the trained model may be to perform the following actions in the order indicated (for example only): initially change a process parameter and/or change the spatial-dependent temperature profile of the chuck, change the height/tilt of the edge coupling ring if the temperature profile has been already changed, and ultimately replace the edge coupling ring if the height/tilt of the edge coupling ring has been already changed and cannot be changed further.

In response to detecting a particular signature pattern for a wafer, the suggestion from the trained model may be to perform the following actions in the order indicated (for example only): initially change the spatial-dependent temperature profile of the chuck, change a process recipe parameter if the temperature profile has been already changed, and change one or more items associated with the edge coupling ring as described above.

Additionally, the weight of the edge coupling ring or the wafer can also be monitored and used as an indication of the amount of erosion of the edge coupling ring or the wafer as well as the amount of material etched/deposited on the wafer. For example, a sensor for sensing the weight of the edge coupling ring and/or the wafer can be installed in the airlock chamber, e.g. embedded into wafer fingers, (or other suitable location in the tool). Alternatively, using sensor fusion algorithms, such as Bayesian or Kalman filter methods, the measurements from the laser sensor can be combined with the weight measurements of the edge coupling ring and the wafer in order to reduce the uncertainty of the measurement.

Using these systems and methods of the present disclosure, the wafers can be monitored before and after processing and the edge coupling rings can be monitored periodically (e.g., daily), and the PM parameters can be adjusted and/or the recipes in the PMs can be fine-tuned (optimized). These and other features of the systems and methods of the present disclosure are now described in further detail.

A wide range of sensor hardware can be used to measure different geometric parameters of edge coupling rings and wafers. The data collected from the edge coupling rings and wafers by the laser sensors can be used to verify whether the processes in the PMs are being carried out correctly, whether the processes and/or any components in the PMs/tools need to be altered/adjusted in any way, whether any preventive maintenance (e.g., PM cleaning) needs to be performed or any component in the PMs/tools needs to be serviced or replaced, etc.

In sum, the measurement system of the present disclosure comprises one or more detectors such as laser sensors placed at one or more locations in a tool (e.g., on top of an airlock of a tool, on a robot arm, on an aligner, and so on). These laser sensors capture data from the edge coupling rings and wafers as the edge coupling rings and wafers are transported between different process modules of a tool. For example, these laser sensors capture data from the incoming/outgoing edge coupling rings and wafers. This allows for near in-situ inspection of the edge coupling rings and wafers, enabling PM-to-PM matching, autonomous process optimization, and predictive maintenance. The inspection is called near in-situ since the inspection is not performed while the edge coupling ring or the wafer is seated in a PM of a tool but is nonetheless performed when the edge coupling ring or the wafer is transported from the PM to an airlock of the tool (i.e., performed nearly contemporaneously in the vicinity of the PM).

The data collected by these laser sensors can be processed for feature extraction on a processor embedded in the laser sensor or on a printed circuit board external to the laser sensor or on the system computer. The extracted features or raw data are transmitted to and collected on a fleet-wide distributed computing and communication system capable of big data storage incoming from various tools in the fab. The measurement system uses machine learning to build and train models to correlate the data to achieve autonomous process optimization and PM-to-PM matching, and to perform near real-time closed-loop control of the tools across the fleet. The measurement system also enables autonomous operation and control of semiconductor tools across the fleet by automating various maintenance, troubleshooting, and tool control tasks.

For example, the measurement system can be used to monitor change in thickness and edge profile (inner diameter, slope in radial and tangential directions, etc.) of the edge coupling ring in the airlock to determine process characteristics (e.g., etch rate, etch uniformity, etc.) in a process module based on changes between edge erosion profiles of incoming/outgoing edge coupling ring. This data can be used to automatically adjust a recipe of a process module, the height of the edge coupling ring above the chuck via the lift pins, and/or to tune a temperature profile of the chuck by controlling one or more heaters in the chuck for autonomous process optimization and tool-to-tool process module matching. Similar procedures can be used with wafers as explained below in detail.

Environment

Below are simplistic examples of a distributed computing environment in which the systems and methods of the present disclosure can be implemented. Throughout the description, references to terms such as servers, client devices, applications and so on are for illustrative purposes only. The terms server and client device are to be understood broadly as representing computing devices with one or more processors and memory configured to execute machine readable instructions. The terms application and computer program are to be understood broadly as representing machine readable instructions executable by the computing devices.

FIG. 8A shows a high level architecture of a measurement system 1770 according to the present disclosure. The measurement system 1770 is described in detail with reference to FIG. 9A onwards. The measurement system 1770 comprises a plurality of fleets 1772-1, 1772-2, . . . , and 1772-N (collectively fleets 1772) communicatively connected to a distributed computing system 1774. For example, a fleet of tools can be similar to the arrangement of tools in a fabrication facility shown in FIG. 2. Each fleet 1772 comprises one or more detectors (e.g., laser sensors) 1780, a data processor 1782, a perception algorithm 1784, a controller 1786, robots 1788, actuators 1790, and recipes 1792.

An overview of the measurement system 1770 is presented below. Details of the measurement system 1770 are described subsequently with reference to FIG. 9A onwards. Briefly, the detectors 1780 include laser sensors that capture data from the edge coupling rings and wafers in the tools in the fleet 1772. The data processor 1784 processes the captured data. For example, the data processor 1784 may perform operations such as noise filtering, feature detection and extraction and so on.

The distributed computing system 1774 comprises a plurality of servers (e.g., see FIGS. 8B-8D and FIG. 11). The distributed computing system 1774 trains various models that can be used for automatically performing specific tasks in the fleet 1772. The distributed computing system 1774 trains the various models based on the data collected from the fleets 1172 over time. The distributed computing system 1774 trains the various models using perception, sensor fusion, and machine learning algorithms.

In use, during operation of the fleets 1772, captured data is sent to the trained models in the distributed computing system 1774. In response, the controller 1786 in the fleet 1772 receives as inputs the outputs of the trained models in real time to automatically carry out operations such as optimization of the processes and recipes used in the tools in the fleet 1772 and PM matching by performing adjustments, cleaning, servicing, guided troubleshooting and so on of the components of the PMs and tools in the fleet 1772, as described below in further detail with reference to FIG. 9A onwards.

FIG. 8B shows a simplified example of a distributed computing system 2000. The distributed computing system 2000 includes a distributed communications system 2010, one or more client devices 2020-1, 2020-2, . . . , and 2020-M (collectively, client devices 2020), and one or more servers 2030-1, 2030-2, . . . , and 2030-N (collectively, servers 2030). M and N are integers greater than or equal to one. The distributed communications system 2010 may include a local area network (LAN), a wide area network (WAN) such as the Internet, or other type of network. The client devices 2020 and the servers 2030 may be located at different geographical locations and communicate with each other via the distributed communications system 2010. The client devices 2020 and the servers 2030 connect to the distributed communications system 2010 using wireless and/or wired connections.

The client devices 2020 may include one or more tools, system computers controlling the tools, PMs, and controllers controlling the PMs. The client devices 2020 may also include smartphones, personal digital assistants (PDAs), tablets, laptop computers, personal computers (PCs), etc. used by operators of the tools. The servers 2030 may provide multiple services to the client devices 2020. For example, the servers 2030 may execute software and machine learning applications developed by one or more vendors. The servers 2030 may host multiple databases that are relied on by the software applications in providing services to users of the client devices 2020. The servers 2030 and the databases may be hosted in cloud, on premises, or both.

In some examples, one or more of the client devices 2020 or servers 2030 execute one or more applications that processes the data captured by the laser sensors installed on the tools. The applications also train one or more models based on the captures data using machine learning techniques. In addition, the applications receive and analyze data from various other sensors in the tools and PMs. The applications use the models to analyze data gathered from the laser sensors and from the other sensors, perform various functions such as optimizing processes running in the PMs, PM matching, and diagnostics and guided troubleshooting root causes of problems in the tools and PMs, predictive maintenance, and so on. The applications may be implemented as Software-as-a-Service (SaaS).

FIG. 8C shows a simplified example of the client device 2120-1. The client device 2120-1 may typically include one or more central processing unit (CPU), one or more graphical processing unit (GPU), and one or more tensor processing unit (TPU) (collectively shown as processor(s) 2150), one or more input devices 2152 (e.g., a keypad, touchpad, mouse, touchscreen, detectors or sensors such as cameras, etc.), a display subsystem 2154 including a display 2156, a network interface 2158, memory 2160, and bulk storage 2162.

The network interface 2158 connects the client device 2120-1 to the distributed computing system 2000 via the distributed communications system 2110. For example, the network interface 2158 may include a wired interface (e, an Ethernet, EtherCAT, or RS-485 interface) and/or a wireless interface (e.g., Wi-Fi, Bluetooth, near field communication (NFC), or other wireless interface). The memory 2160 may include volatile or nonvolatile memory, cache, or other type of memory. The bulk storage 2162 may include flash memory, a magnetic hard disk drive (HDD), and other bulk storage devices.

The processor 2150 of the client device 2120-1 executes an operating system (OS) 2164 and one or more client applications 2166. The client applications 2166 include an application that accesses the servers 2130 via the distributed communications system 2110. The client applications 2166 may include applications executed by system computers that control the tools. The client applications 2166 may also may include applications that process data captured by the laser sensors installed on the tools and applications that run a perceptron algorithm.

FIG. 8D shows a simplified example of the server 2130-1. The server 2130-1 typically includes one or more CPUs/GPUs/TPUs or processors 2170, a network interface 2178, memory 2180, and bulk storage 2182. In some implementations, the server 2130-1 may be a general-purpose server and may include one or more input devices 2172 (e.g., a keypad, touchpad, mouse, etc.) and a display subsystem 2174 including a display 2176.

The network interface 2178 connects the server 2130-1 to the distributed communications system 2110. For example, the network interface 2178 may include a wired interface (e.g., an Ethernet or EtherCAT interface) and/or a wireless interface (e.g., a Wi-Fi, Bluetooth, near field communication (NFC), or other wireless interface). The memory 2180 may include volatile or nonvolatile memory, cache, or other type of memory. The bulk storage 2182 may include flash memory, one or more magnetic hard disk drives (HDDs), or other bulk storage devices.

The processor 2170 of the server 2130-1 executes one or more operating system (OS) 2184 and one or more server applications 2186, which may be housed in a virtual machine hypervisor or containerized architecture with shared memory. The bulk storage 2182 may store one or more databases 188 that store data structures used by the server applications 2186 to perform respective functions. The server applications 2186 may include applications that process the data captured by the laser sensors installed on the tools, applications that run a perceptron algorithm, applications that train one or more models based on the captured data using machine learning techniques, and sensor fusion applications that receive and analyze data from various other sensors in the tools and PMs.

In some situations, only data captured by the laser sensors may not be sufficient to develop accurate models for autonomous process optimization, PM matching, predictive maintenance, and guided troubleshooting. Using sensor fusion applications, such as Bayesian or Kalman filter methods, data from other sensors in the tool can be used in conjunction with the data captured by the laser sensors to determine the required changes in process recipe, PM configuration and details of the source or root cause of the issue with high certainty. The server applications 2186 may include applications that use the models to analyze data gathered from the laser sensors and other sensors, that optimize processes running in the PMs, control PM configuration, that perform PM matching, that determine root causes of problems in the tools and PMs for guided troubleshooting, and that use these data as feedback for closed-loop autonomous control of the tool, as described below in detail.

Block Diagrams

FIG. 9A shows an example of a laser sensor installed on an airlock chamber of a tool. For example only, a laser sensor 2200 is arranged on a viewing port of an airlock lid on an airlock chamber 2202. The laser sensor 2200 does not have to be placed in the airlock chamber 2202 and any other existing stations on the tool can be used for sensor installation. A dedicated station can be designed in the VTM or the EFEM to perform the measurement. It should be understood that one or more laser sensors can be arranged at any other location where new/used edge coupling rings and wafers will pass through (e.g., airlock, aligner, robot arm, VTM, etc.).

Figure 9B:
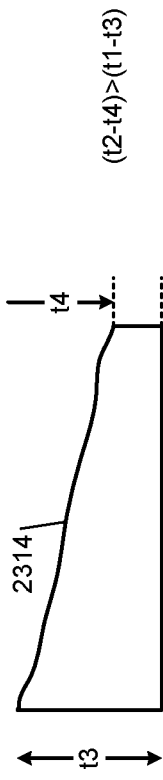
FIGS. 9B-9G show examples of thickness changes in edge coupling rings and wafers due to etch and deposition processes.
Figure 9C:
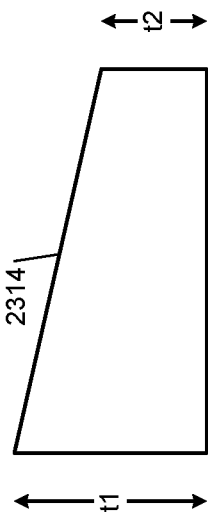

FIG. 9B shows a new edge coupling ring cross-section. Only a half portion of the edge coupling ring is shown for illustrating thickness change. FIG. 9C shows a used edge coupling ring cross-section with thickness changed due to erosion caused by processing. Again, only a half portion of the edge coupling ring is shown to illustrate thickness change. The thickness reduction along the radial direction is non-uniform. As shown, more thickness reduction may occur at the inner diameter (ID) than at the outer diameter (OD) of the edge coupling ring.

Figure 9D:
Figure 9E:
Figure 9F:
Figure 9G:

FIG. 9D shows a wafer before etch. FIG. 9E shows reduction in thickness of the wafer after etch. The thickness reduction can be non-uniform. FIG. 9F shows a wafer before deposition. FIG. 9G shows increase in thickness of the wafer after deposition. The thickness increase can be non-uniform. The thickness changes shown in FIGS. 9B-9G can be measured using the laser sensors as follows.

FIG. 9A shows a schematic representation of components located in the airlock chamber 2202. Airlock fingers 2300, 2302 respectively include finger pads 2304, 2306. A wafer (now shown) is transported by a robot into the airlock chamber 2202 and rests on the finger pad 2304. The robot's end effector 2310 has a pad 2312. An edge coupling ring 2314 is transported by the robot into the airlock chamber 2202 and rests on a pad 2316 located on the finger 2300.

The laser sensor 2200 located on the airlock lid emits (i.e., transmits) one or more electromagnetic wave (light/laser beams) onto the edge coupling ring 2314 and receives (i.e., senses or detects) the wave reflected from the edge coupling ring 2314 or a wafer (not shown). In addition to sensing a top surface of the edge coupling ring 2314 or a wafer, the laser sensor 2200 can sense other portions of the edge coupling ring 2314 or a wafer. For example, the laser sensor 2200 can sense the outer diameter (OD) of the edge coupling ring 2314 or a wafer, the inner diameter (ID) of the edge coupling ring 2314, surface roughness of the edge coupling ring and so on. More than one laser sensor may be used for sensing geometric parameters of the edge coupling ring 2314 and a wafer in X, Y, and Z dimensions. Further, the frequency of the electromagnetic wave emitted from the sensor 2200 can be controlled and changed depending on the material of the edge coupling ring 2314 and the wafer.

Based on the measurement of the edge coupling ring 2314 and the wafer before and after processing (e.g., etch or deposition), the changes in the geometric parameters of the edge coupling ring 2314 and the wafer such as those shown in FIGS. 9B-9G can be determined. Based on the changes, the processes in the PMs can be optimized and PM matching can be performed across fleets as explained below in detail with reference to FIG. 12 onwards.

FIGS. 10A-10C show non-limiting examples of the sensor 2200. FIG. 10A shows a laser sensor 2201 suitable for 1D (point/spot) height measurement of targets such as edge coupling rings and wafers using light reflectometry. The laser sensor 2201 comprises an emitter 2202 and a receiver (also called detector) 2204. The emitter 2202 may comprise of various optics components such as lens(es), mirror(s), and an intensity controller (not shown). The optical components can be used to lightly focus a laser spot while eliminating any beam irregularities to allow measurement of minute targets as the beam spot size is consistent. The receiver 2204 comprises lenses and filters to minimize effects of optical distortions, as well as arrays of sensing elements. The intensity controller refines the resolution of light emission time, which provides increased sensitivity in light intensity adjustments. The intensity controller can shift laser emission time and laser power with target reflectance. The measurement principle is based on triangulation. Given the known relative positions of the emitter and the detector, the position of the target can be calculated by determining the location of the reflected beam spot at the detector.

A translucent object causes a diffused reflection beneath the surface when the laser beam from the laser sensor 2201 penetrates inside the object and the received light wave pattern gently broadens. The laser sensor 2201 can perform the detection by canceling impact of the broadened wave patterns. For a transparent object, the laser sensor 2201 optimizes the laser intensity by sensing and adjusting to the reflected light for each layer of the transparent object. High accuracy is achieved since the measurement is unaffected by each layer's reflectivity. For metal surfaces, the laser sensor 2201 minimizes the influence of the roughness of a coarse target surface. Surfaces that may appear flat often contain minute projections and depressions. This microscopic surface roughness can often cause measurement errors with conventional sensors. In contrast, by using a wide beam spot, the laser sensor 2201 can average the effect of the uneven surface and obtain stable measurements of coarse targets.

FIG. 10B shows a laser sensor 2210 suitable for 2D (line) height profile measurement across a line using light reflectometry. The laser sensor 2210 includes an emitter 2212 and a receiver 2214 which may consist of one or multiple array(s) of receiving sensing elements. The sensing elements may be made of charged coupling devices (CCD) sensors or complementary metal oxide semiconductor (CMOS) sensors to convert light into electronics signal. The laser sensor 2210 can measure height data across a line on objects such as edge coupling rings and wafers. Typically, for measurements such as height differences and warpage, multiple sensors or moving a sensor is needed. Instead, the laser sensor 2210 can perform these measurements with a 2D laser. A sharp line beam is formed on a light receiving element by focusing a short wavelength laser with a 2D lens. The received light density for the laser can be increased to secure a greater level of received light intensity. This achieves stable and accurate measurements with all types of objects including edge coupling rings and wafers.

The laser sensor 2210 may employ a double polarization function that distinguishes and cancels multiple reflections of the light beam that acts as an obstacle to measurement. This function is especially beneficial in the measurement of materials with complex shapes and complicated areas such as edge coupling rings and wafers.

FIG. 10C shows a laser sensor 2220 suitable for 3D height measurement across an area of the object using white light interferometry. The light emitted from a light source in the laser sensor 2220 is split in two by a beam splitter. One beam reflects off the target (both incident and reflected beams are shown at 2222) and the other reflects off a reference mirror in the laser sensor 2220. Both beams then strike a light receiving element of the laser sensor 2220 as interfering light waves. These interfering light waves provide the highest level of interference when the lengths of their optical paths coincide. An optical unit comprising these components of the laser sensor 2220 moves up and down to obtain contrasting images. For each measurement point in these images, the laser sensor 2220 reads the position of the optical unit at the highest level of interference. This information is used to determine the distance to the target. Thus, the laser sensor 2220 captures 3D shapes of objects such as edge coupling rings and wafers precisely.

The laser sensor 2220 uses white light interferometry to overcome the issues that impede the accuracy of profile measurement, such as differences in target materials and colors as well as areas with dead zones that cannot be typically measured. The laser sensor 2220 emits light with a wide dynamic frequency range, which allows it to simultaneously measure targets with different reflectivity from a single captured image. Accurate shapes can be captured for targets made of translucent material since the process is unaffected by internal reflections. With a conventional triangulation method, the light returning to the senor can be blocked causing dead zones which cannot be measured. The laser sensor 2220 avoids this limitation using technique explained above.

In general, the laser sensors 2200 can sense and provide data that can be processed to determine overall shape measurements such as thickness, form, contour, flatness, and surface roughness analysis of the edge coupling ring 2314 and thickness of a wafer. For example, by combining measurements of the top and sides of the edge coupling ring 2314, the data sensed by laser sensors 2200, after processing, can provide measurements of undercuts and the overall thickness of the edge coupling ring 2314. Similar techniques can be used with wafers.

The emitting element of laser sensors may use a semiconductor laser. The laser light is focused through the emitting lens and projected on an object. At that time, some of the light beam that is reflected from the object produces a light spot on a position sensing device (PSD).

Some of the receiving elements use a linear image sensor, and not the PSD. The PSD can acquire information only about the center position based on the amount of light of the entire light spot. On the other hand, the emitting elements with the linear image sensor detect the amount of light received by each cell. Therefore, even when there are variations in the amount of light within the spot due to influences from the object's surface, accurate detection can be performed using the peak position of the light intensity. This significantly reduces errors due to the influence of variation in the objects' surfaces.

The following is an overview of various capabilities of the laser sensor 2200. The laser sensor 2200 can measure various parameters of the edge coupling ring 2314 and wafers as follows. Thickness and/or width of a target such as the edge coupling ring 2314 and a wafer can be measured in many ways. Although systems with two sensors are common, measurement with one sensor is possible. In confocal reflection method, thickness measurements are preformed using two sensors to sandwich the target. With a transparent target, the thickness can be measured directly with a single sensor on either side. In triangulation reflection method, thickness measurements are performed using two sensors to sandwich the target. With a transparent target, the thickness can be directly measured through exposure from only one side. In spectral reflection interference method, although systems with two sensors are common, if the position of one side is predetermined or if the target is transparent, measurement with one sensor is possible. Thickness measurement can also be performed by measuring the height of a target as a step height relative to a reference surface.

Height can also be measured by detecting the position of an object's top surface. For objects with bottom surfaces that are not fixed, shapes are directly measured by using two sensors or by projecting the laser in a horizontal line. In a light-cut method, the position of an object's top surface is detected. The ability to perform non-contact 2D profile measurements makes it possible to perform step measurement with respect to a reference plane on the target. In confocal reflection method, the position of an object's top surface is detected. Accordingly, stable measurement is possible even if the target moves. In optical thru-beam method, by capturing a shadow of a target's shape, the sensor can detect any position. Simultaneous measurement of multiple points is also possible.

Warpage or flatness is generally measured by detecting a target such as the edge coupling ring 2314 at three points. Measurement is also possible by moving and scanning the target under a point-type sensor, or by directly measuring the shape by projecting a laser in a horizontal line. In light cut method, shapes are directly measured by exposing the target to a line laser. Warpage or flatness is then measured using the measured waveform data. Also, by moving the target while scanning, 3D shape measurements are also possible. In confocal reflection method, using ultra-compact and light-weight sensors makes it possible to install multiple heads in parallel. By capturing height data at multiple locations on the target, warpage or flatness can be calculated. In triangulation reflection method, after scanning a target using the sensor, the warpage or flatness is measured using the height data of any three points.

The laser sensors 2200 can measure a target's shape by scanning over the target with a single-point optical sensor or using a laser line to generate a 2D profile of the surface, or a 3D height profiler. In confocal reflection method, profile measurement can be performed using a spot laser to scan the target. Targets can be measured regardless of material or color. In light cut method, the shape of a target's cross section is instantly measured using a line laser. The laser sensors can detect height, width, and cross sectional area of objects such as edge coupling rings and wafers.

The laser sensors 2200 can also measure a target's shape by scanning a target to measure a 2D shape or by directly measuring the shape of an object using a 2D line laser. In light cut method, a line laser is used to continuously scan the cross-sectional appearance. The waveform data is combined to create a three-dimensional appearance. In 3D interference method, height data for multiple (hundreds or thousands of) points is instantly acquired for a measurement area (e.g., see FIG. 10C). Utilizing a white light interference principle allows for micron-level high-precision measurements with no influence from the material type or color, and no blind spots. In 3D pattern projection, multiple stripe patterns can be projected at high speed in a pattern from two directions. The light reflected from the target is analyzed in real-time to create the 3D shape image of objects such as edge coupling rings and wafers.

FIG. 11 shows a measurement system 2400 that processes the data captured by one or more laser sensors 2402 installed in a tool 2404 (e.g., any tool shown in FIGS. 1-6C). While only one tool is shown for example only, the measurement system 2400 comprises a plurality of tools similar to the tool 2404. The laser sensors 2402, which can be any of the laser sensors 2200 shown in FIGS. 10A-10C, sense data from edge coupling rings 2406 (e.g., the edge coupling ring 2314) and wafers as described with reference to FIGS. 9A-9G above.

A data processor 2408 processes the data captured by the laser sensors 2402. For example, the data processor 2408 may clean and/or format the data. For example, the data processor 2408 may perform operations such as noise filtering, feature extraction, and so on. The data processor 2408 may be located on the laser sensor 2402 or may be external to the laser sensor 2402 (e.g., on a PCB).

A system computer 2410 controls the tool 2404. In one implementation, raw data from the laser sensor 2402 may be sent to a remote data center 2412 for processing and/or analysis. Alternatively, in another implementation, the raw data may be processed by the data processor 2408, which may be located on the laser sensor 2402 or on a PCB outside the laser sensor 2402, and only some of the analyzed data may be sent to the system computer 2410 and/or the remote data center 2412. The system computer 2410 may send the raw data to the remote data center 2412 in real time or in batches via the distributed communications system 2010 shown in FIGS. 8B-8D. In addition, the system computer 2410 may also send data collected by other sensors in the tool 2404 and by sensors in the PMs of the tool 2404 to the remote data center 2412 for training models as described below with reference to FIG. 12 onwards.

For example, the remote data center 2412 may comprise a plurality of the servers 2030 shown in FIGS. 8B-8D. At the remote data center 2412, using machine learning, several models are trained based on the data collected from the plurality of tools such as the tool 2404. The training and functions of the models are explained below in detail. Using the trained models received from the remote data center 2412, the system computer 2410 operates the tool 2404 based on new data collected by the laser sensor 2402 and by the other sensors during use (production) as explained below.

Briefly, the system computer 2410 performs various operations recommended by the trained models on the tool 2404. For example, the operations include measuring geometric parameters (e.g., thickness, width, OD/ID, warpage/flatness, 2D/3D shape, surface roughness, etc.) of the edge coupling rings and wafers; and based on the measurements, automatically adjusting (optimizing) parameters of a process in a PM, PM matching, recommending preventive maintenance (e.g., PM auto-cleaning), performing guided troubleshooting operations such as repair/replacement of parts/subassemblies, and so on.

For example, the system computer 2410 can measure parameters of edge coupling rings and determine effective etch rates (and can measure parameters of wafers and determine etch/deposition rates) in PMs and monitor their drift over time, and use this data to autonomously optimize processes in the PMs, to achieve PM matching, and to perform preventive/corrective operations to compensate for such drifts. For example, the system computer 2410 can fine tune the height of the edge coupling ring above the chuck by adjusting the lift pins. For example, the system computer 2410 can determine an optimal period in which wet clean, Waferless Auto Clean (WAC), Cover Wafer Area Clean (CWAC) procedure can be used.

Further, the system computer 2410 can perform various adaptations recommended by the trained models. The system computer 2410 can automatically adjust the recipe used in a PM based on reduction in thickness of an incoming and outgoing edge coupling ring and based on thickness changes of wafers. The system computer 2410 can determine an effective etch rate in a PM based on a detected change in inner diameter (i.e., change in edge erosion profile) or thickness of incoming/outgoing edge coupling rings. The system computer 2410 can determine an effective etch rate or a deposition rate in a PM based on a detected change in thickness of pre-/post-processed wafers. The system computer 2410 can automatically adjust a recipe for PM matching and autonomous process control and optimization. These and other functions performed by the measurement system 2400 based on the data captured by the laser sensor 2402 in a closed loop manner are now described in detail.

The measurement system 2400 can assist in PM matching. PMs are regularly cleaned after a certain number of wafers are processed. However, different wafer types could have different materials outgassed into PMs. In addition, different processes performed on wafers in a PM can leave different byproducts in the PM, which need to be cleaned. Using the same cleaning recipe for all incoming wafer types may not clean the chamber adequately to process the next wafer. The measurement system 2400 can leverage past data of PM configurations, cleaning processes performed on PMs, and how it affected the process results, learn from it, and assist the PM in selecting the proper recipe for auto-cleaning the PM so that the PM is in condition to process the next incoming wafer.

The measurement system 2400 can measure effective etch and deposition rates in different tools, monitor their drift over time, record their changes after maintenance (e.g., wet clean, CWAC), and create procedures to automatically adjust parameters of etch and deposition processes (e.g., recipe, ESC temperature, gas flow, time duration, etc.) in the PMs to correct for such changes. The measurement system 2400 can measure the thickness changes between a new edge coupling ring going into a PM and the same edge coupling ring leaving the PM at the end of its life or at any time in between (and/or thickness changes in pre-/post-processed wafers), and can automatically adjust process parameters of the PM (e.g., etch/deposition rate, etch/deposition uniformity, etc.) for autonomous process optimization and PM-to-PM matching. The laser sensor 2402 accurately measures thickness reduction in used edge coupling rings or thickness changes in processed wafers. Knowing the usage history of an edge coupling ring (e.g., the number of RF hours the edge coupling ring has been used in a PM, the process recipe, the chamber configuration) and its thickness reduction, an effective erosion rate of the PM can be determined. Similar techniques can be applied to etch and deposition processing of wafers. Thus, the measurement system 2400 can automate the measurements of in-/out-bound (new/used) edge coupling rings and wafers and can automate process optimization and PM-to-PM matching.

Not only the measurement system 2400 captures data from the edge coupling rings and wafers in regions of tools such as the airlocks, but the measurement system 2400 can operate in conjunction with other data collected by many other systems (e.g., sensors, cameras associated with PMs, etc.) located in the tool 2404. For the measurement system 2400 to be reliable, many factors such as orientation and leveling of the laser sensor 2402 need to be relatively constant. To allow for any variations in these factors, which may be inevitable sometimes, the data collected by the measurement system 2400 may be normalized using the data collected by these other systems to minimize or eliminate the effect of disparities in these factors. In-situ calibration of the laser sensor can be performed where measurements are performed on objects with known height and correction curves are created and applied on measurements during normal operation.

The location of the laser sensors 2402 can be varied and need not be restricted to the airlock. For example, a dedicated station can be designed in the VTM or the EFEM to make the measurements described below. The laser sensors 2402 can be arranged at other locations in the tool 2404. Further, the laser sensors 2402 can be arranged in tools across a fleet of tools. This can enlarge the database of the captured data, which can improve the training of the models built at the remote data center 2412 based on the captured data and can make the models more robust. The robust models can perform the functions of the measurement system 2400 with increased statistical confidence, which can improve the overall performance of the PMs, the tools, and the fleet of tools.

The tool 2404 can be optimized based on the data amassed by the measurement system 2400. For example, the number of cleaning cycles of the PMs in the tool 2404 can be optimized. For example, cleaning of a PM in the tool 2404, although recommended by another mechanism in the tool 2404, may be deferred or delayed based on the data captured by the laser sensors 2402. Notably, the data is instantly available and is analyzed in real time or near real time by the measurement system 2400. Accordingly, the optimization of the tool 2404 can be performed on the fly. Using the measurement system 2400, a model can be trained at the remote data center 2412 to receive as input the data captured by the laser sensors 2402 and to provide an output controlling when cleaning may be performed in the PM. It can be appreciated that the procedure fully automates PM cleaning via WAC or CWAC in a closed-loop manner.

The measurement system 2400 can analyze edge coupling rings and wafers as follows. An edge coupling ring is typically transferred from EFEM to airlock to PM, where it is placed around an ESC. The edge coupling ring has a particular thickness, inner diameter, and thickness profile across radial direction. These and other parameters of the edge coupling ring are observed by capturing data from the edge coupling ring before the edge coupling ring is transferred to the PM. In the PM, the edge coupling ring is exposed to the process performed on the wafer. As a result, one or more parameters of the edge coupling ring may change. The edge coupling ring is designed for use for a certain number of RF hours. Similar edge coupling rings may be used in PMs performing similar process for similar duration (i.e., number of RF hours).

Subsequently, when the edge coupling ring is fully used (or daily, without waiting for its end of life), it is transferred out of the tool via the robot to the load lock. Data from the outgoing edge coupling rings from these PMs is captured, and the geometrical parameters are measured and correlated by the measurement system 2400. For example, one edge coupling ring may exhibit more change than others. The change in the one edge coupling ring is analyzed, optionally along with other data (e.g., from other sensors in the tool 2404), to autonomously optimize processes and to achieve PM matching and optionally to identify the root cause for the change or to control operating conditions of the PM to achieve optimal on-wafer process quality.

For example, based on the analysis of the change, which indicates that one of the PMs is operating differently (i.e., producing different effects on the edge coupling ring) although the same process is performed in that PM as in the other PMs for the same number of RF hours, the recipe for the process performed in that PM may be adjusted using a model trained by the measurement system 2400. Alternatively, the positioning (height, tilt angle, etc.) of the edge coupling ring in that PM may be adjusted using a model trained by the measurement system 2400. Similar procedures can be used with wafers to measure changes in thickness before and after etch/deposition to achieve autonomous process optimization and PM matching.

Using the measurement system 2400, different models can be trained to perform these different functions. Once sufficiently trained, these models can receive data from the edge coupling rings and wafers as well as all other on-tool sensors as inputs and can provide outputs such as adjustments to be made to a recipe, to the height of the lift pins of an edge coupling ring, to the spatial-dependent temperature profile of the chuck, and so on. Ongoing training based on data acquired during use (i.e., production) can refine (i.e., improve the accuracy of) the outputs of these models. It can be appreciated that such a system allows for autonomous control of the tool for autonomous process optimization and PM matching by measuring geometric parameters of edge coupling rings and wafers as described above.

In sum, some edge coupling rings allow for better control of plasma field within etch PMs to achieve optimized on-wafer process results. These edge coupling rings can be automatically transferred from EFEM to PMs via a transfer module (TM), which makes it possible to achieve continuous production without the need to open the PM for a long time (e.g., up to a year). However, due to the difference in conditions of PMs within a tool or across different tools, on-wafer results are not always similar.

To achieve PM-to-PM matching and optimize process results, the measurement system 2400 provides techniques to measure effective etch or deposition rates across different tools, monitor their drift over time, record their change after maintenance, and create procedures to automatically adjust etch and deposition process parameters of PMs (e.g., recipe, ESC temperature, gas flow, time duration, bias voltage, etch/deposition rate, etch/deposition uniformity, etc.) to compensate for such changes. The measurement system 2400 allows for automated measurement of in-/out-bound (new/used) edge coupling ring parameters and pre-/post-processed wafer parameters and the corresponding system for autonomous process optimization and PM-to-PM matching.

In general, several control parameters of tools that can be monitored (observed) using the measurement system 2400. Based on the observed data about these parameters, the measurement system 2400 can train models to ascertain whether automatic process control loops employed in the tool 2404 are operating properly or not. The measurement system 2400 can use trained models to automatically adjust process parameters (e.g., etch/deposition rate, etch/deposition uniformity, etc.) for PM matching.

Flowcharts and Models

Initially, FIGS. 12 and 13 show broad and general examples of various methods performed by the servers 2030 and the system computer 2410 shown in FIG. 11. Subsequently, FIGS. 14A-14I show specific and detailed examples of various methods performed by the servers 2030 and the system computer 2410 shown in FIG. 11.

First, FIG. 12 broadly and generally shows a method performed by the servers 2030 to train various models using perception, sensor fusion, and machine learning algorithms based on data captured by the measurement system 2400 from various tools. Thereafter, FIG. 13 broadly and generally shows a method performed by the servers 2030 and the system computer 2410 using the trained models based on data captured in real time (i.e., on the fly, or when the tool is being used during production to process wafers). The details of model generation and training are described with reference to FIGS. 15A-16B.

FIG. 12 shows a method 2500 for capturing data from edge coupling rings and wafers from various tools and for training various models based on the captured data using perception, sensor fusion, and machine learning algorithms. At 2502, the method 2500 captures data from edge coupling rings and wafers at locations such as load locks in tools. At 2504, the method 2500 processes the captured data. For example, the captured data may be cleaned and formatted and transformed into signatures indicating patterns in the captured data. For example, the method 2500 may perform operations such as noise filtering, geometric transformations, feature extraction, and so on. Furthermore, features and signatures that can be used for determining erosion profiles of edge coupling rings, and determining thickness changes of wafers, determining effective etch/deposition rates in PMs, autonomously optimizing processes in the PMs, and PM matching may be recognized and extracted from the captured data and may be used to build feature vectors.

At 2506, the method 2500 trains various models for performing specific tasks based on the data collected by sensors in PMs and by the laser sensors over time (i.e., by using these data as inputs to the models) using perception, sensor fusion, and machine learning algorithms. For example, the tasks may include but are not limited to determining erosion profile of an edge coupling ring, determining thickness changes in wafers, determining effective etch/deposition rates in PMs, adjusting (optimizing) PM recipes, determining WAC recipe and frequency, and so on. The method 2500 establishes and stores in a database correlations between performance of these tasks and signatures and feature vectors generated based on the collected data. Thus, the method 2500 trains models for determining erosion profiles of edge coupling rings, determining thickness changes in wafers, determining etch/deposition rates in PMs, autonomously optimizing processes in the PMs, and PM matching based on the signatures and features. At 2508, the method 2500 continues to refine (i.e., further train) these models based on data captured and processed using the trained models on an ongoing basis.

FIG. 13 shows a method 2600 for capturing data during production from edge coupling rings and wafers from various tools and for using the trained models for determining erosion profiles of edge coupling rings, determining thickness changes in wafers, determining effective etch/deposition rates in PMs, autonomously optimizing processes in the PMs, and PM matching, and so on. At 2602, the method 2600 captures data during production from edge coupling rings and wafers at locations such as load locks. At 2604, the method 2600 processes the captured data. For example, the captured data may be cleaned and formatted and transformed into signatures indicating patterns in the captured data. For example, the method 2600 may perform operations such as noise filtering, geometric transformations, feature extraction, and so on. Furthermore, features that can be used for determining erosion profiles of edge coupling rings, determining thickness changes in wafers, determining etch/deposition rates in PMs, autonomously optimizing processes in the PMs, and PM matching may be recognized and extracted from the captured data.

At 2606, using various trained models, the method 2600 performs various tasks based on the collected data. For example, the method 2600 sends the signatures and features and data from PMs to the trained models and receives commands/data from the trained models that the tool uses to automatically perform various tasks. For example, the tasks may include but are not limited to determining erosion profiles of edge coupling rings, determining thickness changes in wafers, determining etch/deposition rates in PMs, autonomously optimizing processes in the PMs, PM matching, and so on. At 2608, the method 2600 updates (i.e., further trains) these trained models based on the data collected and processed using the trained models during production.

Additional Models

FIGS. 14A-14I show various additional examples of methods performed by the servers 2030 and the system computer 2410 using models trained based on data captured by the laser sensors 2402 near real time (i.e., on the fly, or when the tool is being used during production to process wafers). The models used by these methods can be trained using the measurement system 2400 and can be used to perform the operations described below. These are non-limiting examples. Additional use cases are contemplated.

In these examples, the training of the models using data from the PMs and data captured by the laser sensors 2402 to perform the described functions using perception, sensor fusion, and machine learning algorithms, including the ongoing updating of the trained models, is similar to the training of the models described above with reference to FIG. 12. The training of the models used in the following methods is therefore presumed and not described for brevity. In use, similar to the trained models described with reference to FIG. 13, these trained models receive data from the laser sensors 2402 as input, and the trained models output commands/data to tools for automatically performing operations such as autonomously tuning process parameters (e.g., etch/deposition rate, etch/deposition uniformity, etc.), performing PM matching, providing assistance in repairing/replacing parts or subassemblies, and so on.

FIG. 14A shows a method 2700 for optimizing process parameters (e.g., etch/deposition rate, etch/deposition uniformity, etc.) and controlling PM configuration across fleets of tools using a model trained using perception, sensor fusion, and machine learning algorithms. At 2702, the method 2700 captures and processes data regarding thickness changes in wafers and edge coupling rings in PMs across fleets of tools. At 2704, based on the thickness changes data, the method 2700 determines, using the trained model, variations in etch/deposition process characteristics (process rates, process uniformity, etc.) in PMs across the fleets of tools. At 2706, based on the variations in process characteristics, the method 2700 receives data from the trained model for automatically optimizing process parameters (e.g., etch/deposition rate, etch/deposition uniformity, etc.) and controlling PM configuration in the PMs across fleets. Thus, the method 2700 automatically optimizes process parameters (e.g., etch/deposition rate, etch/deposition uniformity, etc.) and controls PM configuration in the PMs across fleets in a closed loop manner.

FIG. 14B shows a method 2710 for measuring flatness of edge coupling rings and wafer thickness changes and performing PM matching based on the measured flatness of edge coupling rings and wafer thickness changes using a model trained using perception, sensor fusion, and machine learning algorithms. At start, the wafer/ring is presumed to be located in airlock. The ring could be new, will be sent to the PM for the first time, and will be measured as described in the following steps. Alternatively, the ring could be used for a period of time, and will be sent to the PM for further use following the steps below. The wafer could be unprocessed, will be sent to the PM for processing, and will be measured as described in the following steps. Alternatively, the wafer could be partly processed, and will be sent to the PM for further processing following the steps below.

At 2712, the method 2710 determines if an edge coupling ring/wafer is to be transported from the airlock to a PM. At 2714, if an edge coupling ring/wafer is to be transported from the airlock to a PM, the method 2710 collects data from the edge coupling ring/wafer using laser sensors before the edge coupling ring/wafer is transported to the PM in the pre-processed condition. At 2718, the method 2710 determines a geometric parameter (e.g., flatness, thickness, surface roughness, etc.) of the edge coupling ring/wafer based on the data collected by the laser sensor. At 2720, the method 2710 transports the edge coupling ring/wafer from the airlock to the PM.

At 2722, the method 2710 determines whether it is time to inspect the edge coupling ring again. For example, the inspection of a ring may be performed daily, after the edge coupling ring has been in use for a predetermined number of RF hours, or if triggered by an error event. For example, the inspection of a wafer may be performed after each processing (etch/deposition). At 2724, if it is time to inspect the edge coupling ring/wafer, the method 2710 transports the edge coupling ring/wafer from the PM to the airlock. At 2726, the method 2710 collects data from the edge coupling ring/wafer using laser sensors. At 2730, the method 2710 determines the geometric parameter (e.g., flatness, thickness, etc.) of the edge coupling ring/wafer based on the data collected by the laser sensors.

At 2732, the method 2710 determines thickness change of the edge coupling ring/wafer based on the geometric parameter values determined at 2718 and 2730. At 2734, the method 2710 sends the thickness change to a trained model from which a determination of process characteristics of the PM is received. At 2736, the method 2710 automatically adjusts one or more process parameters of the PM (e.g., etch/deposition rate, etch/deposition uniformity, etc.) and/or PM configurations (e.g., upper/lower electrode gap/alignment/tilt, ring height above ESC) based on the thickness change and the process characteristics (erosion/deposition rate, uniformity, etc.) determination. For example, the method 2710 can automatically adjust these parameters in a closed loop manner based on values for the parameters received from the trained model based on the thickness change data.

FIG. 14C shows a method 2740 for determining change in geometric parameters pre/post-process (e.g., thickness, surface roughness and ID edge shape/profiles) of edge coupling rings across a fleet of tools and tuning PM operation based on the surface roughness and ID edge shape/profiles using a model trained using perception, sensor fusion, and machine learning algorithms. At 2742, the method 2740 collects data from edge coupling rings across the fleet using laser sensors. At 2744, the method 2740 determines change in geometric parameters pre/post-process (e.g., thickness, ID, surface roughness) of the edge coupling rings using the trained model. It can be thickness measurement at a point/spot (1D), across a line (2D), or over an area (3D). Surface roughness can be calculated only from 3D measurement and can be estimated via a 2D measurement. At 2748, the method 2740 determines the ID edge shape/profiles of the edge coupling rings using the trained model. At 2750, the method 2740 tunes PM operation using the trained model. For example, the method 2740 tunes auto-cleaning processes (WAC or CWAC) in the PMs based on the surface roughness and the ID edge shape/profiles of the edge coupling rings as well as the data from other PM sensors using the trained model. Similar method can be used to determine shapes and profiles of wafers, which in turn can be used to tune PM operations.

FIG. 14D shows a method 2760 for guided troubleshooting of PM issues in tools based on ID edge shape/profiles or top surface slope profile of edge coupling rings using a model trained using perception, sensor fusion, and machine learning algorithms. At 2762, the method 2760 collects data from edge coupling rings across the fleet using laser sensors. At 2764, the method 2760 determines change in geometric parameters pre/post-process (e.g., thickness, ID, surface roughness) of the edge coupling rings using the trained model. It can be thickness measurement at a point/spot (1D), across a line (2D), or over an area (3D). Surface roughness can be calculated only from 3D measurement and can be estimated via a 2D measurement. At 2766, the method 2760 determines the ID edge shape/profiles of the edge coupling rings using the trained model. The ID edge shape/profiles can be stored as signatures of the edge coupling rings in a database. The signatures are correlated to performance and/or malfunction of parts and/or subassemblies of the PMs.

Thus, a specific signature can indicate a specific performance and/or malfunctioning part and/or subassembly in a PM.

At 2750, the method 2760 sends to the trained model a signature of an edge coupling ring that is generated based on data captured from the edge coupling ring using the laser sensors. The method 2760 receives an indication identifying a problematic part or subassembly of the PM along with instructions regarding service/replacement of the problematic part or subassembly. Additionally or alternatively, in some situations, the method 2760 receives data from the trained model that automatically adjusts an operational parameter of the PM in a closed loop manner. For example, the data received from the trained model may be used to adjust the height of the edge coupling ring; or adjust the temperature profile of the ESC; or change the flow rate of the process gases; and so on. If all of these options have already been exercised, the data may indicate a final option of repairing or replacing a component of the PM. Thus, the method 2760 can automatically perform corrective actions and assist in guided troubleshooting issues with a PM in a hierarchical manner. Similar procedure can be adopted to use wafer profiles measurement based on thickness changes to troubleshoot PM issues based thereon, and the description is omitted for brevity.

FIG. 14E shows a method 2770 for tuning PM cleaning processes based on data collected by laser sensors from edge coupling rings/wafers using a model trained using perception, sensor fusion, and machine learning algorithms. At 2772, the method 2770 collects data from edge coupling rings/wafers across the fleet using laser sensors. At 2774, the method 2770 automatically selects recipe type and frequency of cleaning PMs based on data collected from the edge coupling rings/wafers using the trained model in a closed loop manner. At 2776, the method 2770 automatically selects values of parameters for PM operation using the trained model in a closed loop manner.

FIG. 14F shows a method 2780 for tuning PM configuration (e.g., auto-clean recipe, upper/lower electrodes gap and alignment/tilt, edge ring height above ESC, etc.) based on data collected by laser sensors from an edge coupling ring/wafer using a model trained using perception, sensor fusion, and machine learning algorithms. At 2782, the method 2780 collects data from the edge coupling ring/wafer using laser sensors. At 2784, the method 2780 determines PM performance based on the collected data (e.g., condition of the ring, drift of wafer thickness reduction (etch rate), or wafer thickness change uniformity, etc.). For example, sensor data collected after prior cleaning procedures is stored in a database as signatures of the edge coupling ring/wafer. Accordingly, correlations can be stored in a database between the signatures and the quality of the cleaning procedure performed in the PM. The data presently collected is converted into a signature (feature vector) that is input to the trained model. The trained model compares the input signature to the signatures stored in the database.

At 2786, based on the comparison, the trained model returns an assessment regarding the PM performance. At 2788, based on the comparison and/or the assessment, the trained model also provides parameters to fine-tune PM configuration (e.g., auto-clean recipe, upper/lower electrodes gap and alignment/tilt, edge ring height above ESC, etc.). Thus, the method 2780 automatically fine-tunes the PM configuration in a closed loop manner. When performed subsequently, the method 2780 verifies whether the fine-tuning in fact improved the PM performance. The result of the verification is used as feedback to continually refine the trained model.

Figure 14G:
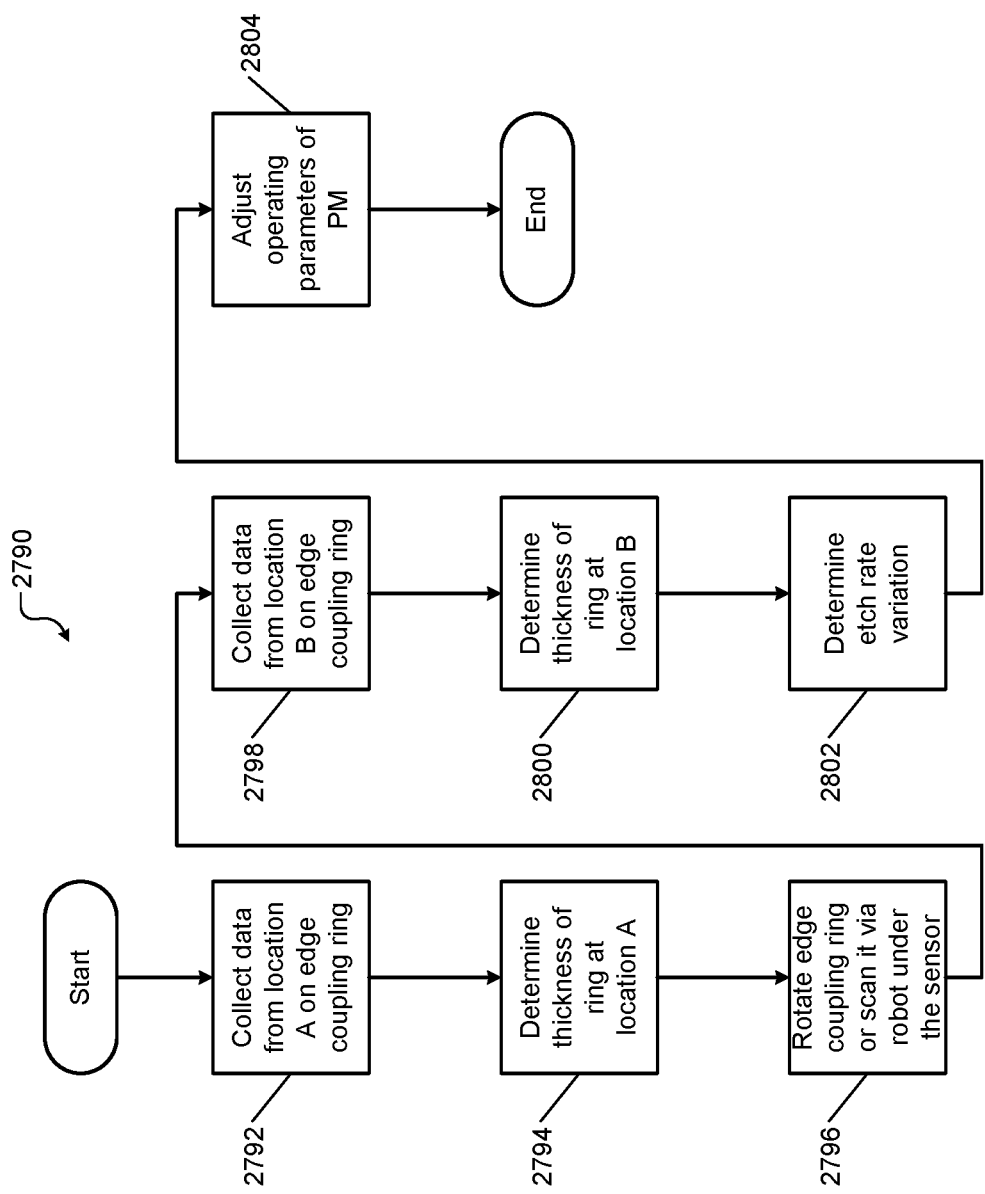

FIG. 14G shows a method 2790 for determining etch rate variation in a PM and adjusting operating parameters of the PM based on data collected by laser sensors from an edge coupling ring used in the PM, using a model trained using perception, sensor fusion, and machine learning algorithms. At 2792, the method 2790 transports the edge coupling ring from the PM to the airlock and collects data from location A on the edge coupling ring using the laser sensor. At 2794, the method 2790 determines the thickness of the edge coupling ring at location A using the trained model. At 2796, the method 2790 rotates the edge coupling ring or scans it via robot under the laser sensor. At 2798, the method 2790 collects data from location B on the edge coupling ring using the laser sensor. At 2800, the method 2790 determines the thickness of the edge coupling ring at location B.

At 2802, the method 2790 determines a variation in the effective etch rate based on the thicknesses at locations A and B. For example, the method 2790 sends the thicknesses at locations A and B as inputs to the trained model, and the trained model quantifies etch rate non-uniformity in the PM. Additionally, the trained model returns as output values for one or more operating parameters of the PM to be tuned. At 2804, the method 2790 automatically adjusts one or more process parameters (e.g., etch/deposition rate, etch/deposition uniformity, etc.) and/or operating parameters of the PM based on the measured etch rate non-uniformity in a closed loop manner. Similar method can be used with wafers for etch and deposition processing, where variations in etch/deposition rates and uniformities are ascertained based on thickness variations of wafers, and one or more process parameters (e.g., etch/deposition rate, etch/deposition uniformity, etc.) and/or operating parameters of the PM are automatically adjusted based on the etch/deposition rate variation in a closed loop manner.

Figure 14I:
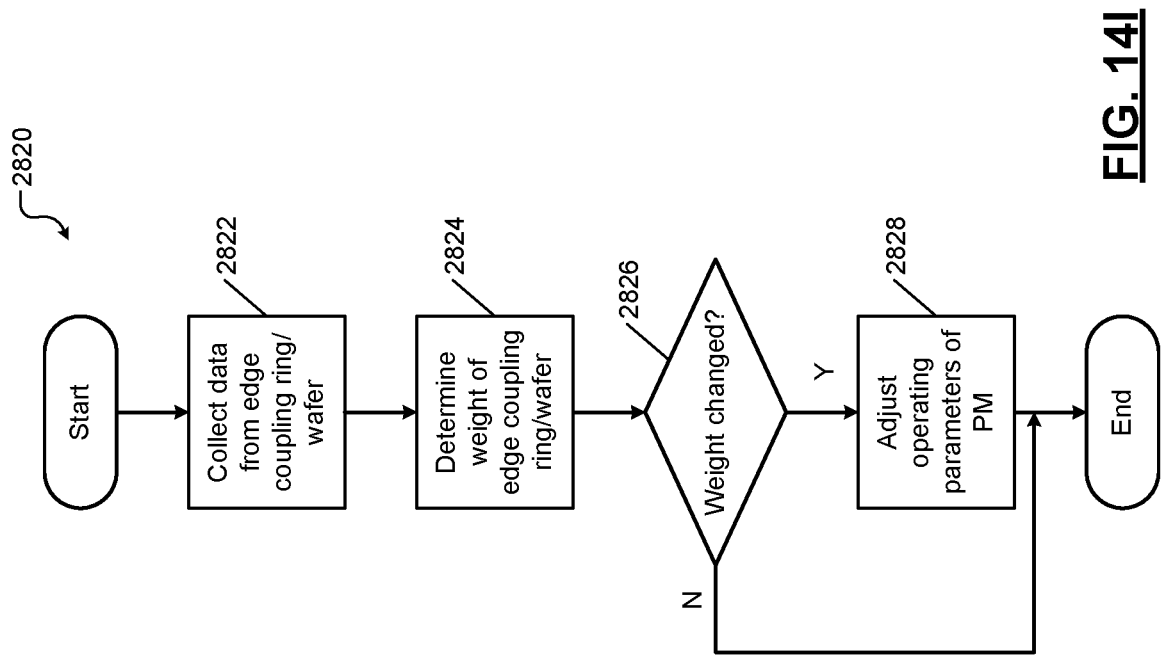
Figure 14H:
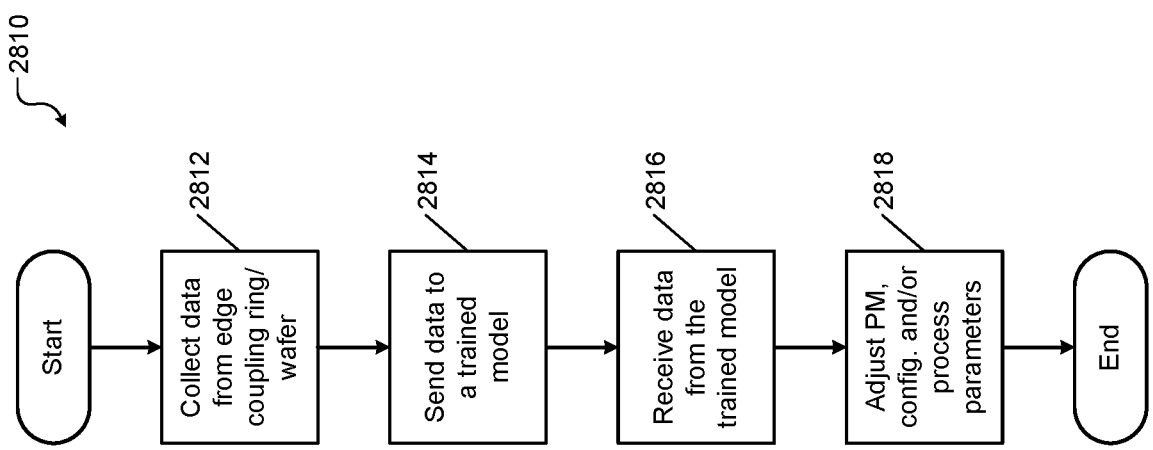

FIG. 14H shows a method 2810 for guided troubleshooting and correcting an issue in a PM based on data collected by laser sensors from an edge coupling ring/wafer used in the PM, using a model trained using perception, sensor fusion, and machine learning algorithms. At 2812, the method 2810 transports the edge coupling ring/wafer from the PM to the airlock and collects data from the edge coupling ring/wafer using the laser sensors. At 2814, the method 2810 sends the collected data to the trained model. For example, the method 2810 converts the collected data into a signature (feature vector) and sends the signature as input to the trained model. The trained model returns one or more multiple outputs by comparing the signature to a variety of signatures that are correlated to properly operating as well as malfunctioning parts and subassemblies of PMs, and preventive/corrective actions. For example, one output may be for gas flow rate, another for ESC temperature distribution, another for PM pressure, etc. For example, an output may include a command for a preventive/corrective action to be automatically performed in the PM, or an indication indicating a repair or replacement of a part or a subassembly to be performed in the PM or the tool. At 2816, the method 2810 receives the data from the trained model. At 2818, the method 2810 automatically performs the operation indicated by the output to adjust PM configuration and/or process parameters in a closed loop manner or prompts that the repair or replacement be performed.

FIG. 14I shows a method 2820 for monitoring the weight of an edge coupling ring/wafer and adjusting process parameters (e.g., etch/deposition rate, etch/deposition uniformity, etc.) and/or operating parameters of a PM based on weight changes of the edge coupling ring/wafer pre/post-process. For example, the weight of the edge coupling ring/wafer may be monitored using a weight sensor and used together with data collected by laser sensors from an edge coupling ring/wafer as inputs to the model. The process parameters (e.g., etch/deposition rate, etch/deposition uniformity, etc.) and/or the operating parameters of the PM can then be adjusted based on the observed weight changes using a model trained using perception, sensor fusion, and machine learning algorithms.

At 2822, the method 2820 transports the edge coupling ring/wafer from the PM to the airlock and collects data from the edge coupling ring/wafer using a weight sensor or using the laser sensor(s). For example, if a weight sensor is used, the method 2820 can obtain the weight of the edge coupling ring directly from a weight sensor. Thus, at 2824, the method 2820 determines the weight of the edge coupling ring/wafer.

At 2826, the method 2820 determines if the weight of the edge coupling ring/wafer has changed, and if so, by what amount. For example, the method 2820 sends the data indicating the weight of the edge coupling ring/wafer as input to the trained model. The trained model determines a change in the weight of the edge coupling ring/wafer and returns an output based on the comparison. For example, a database referenced by the trained model may store correlations between weights or weight changes and process parameters tuning or preventive/corrective actions to be performed in the PMs based on the weights or weight changes. For example, the output may include a command for a preventive/corrective action to be automatically performed in the PM. For example, the preventive/corrective action may include changing the operating parameters of the PM and/or changing the parameters of the process including the cleaning process used in the PM. At 2828, if the weight of the edge coupling ring/wafer has changed, the method 2820 receives the data output by the trained model, and the method 2820 automatically performs the operation indicated by the output in a closed loop manner.

In some implementations, the measurement system 2400 may send raw data collected by the laser sensors from the tools to the remote data center, and all of the processing of the data and the training of the models may be performed in data center. Further, data processing and recommendations by the trained models during use of the tools may be performed in the data center. In such implementations, the measurement system 2400 may be deployed in the data center as Software-as-a-Service (SaaS).

Model Training and Verification

Figure 15B:
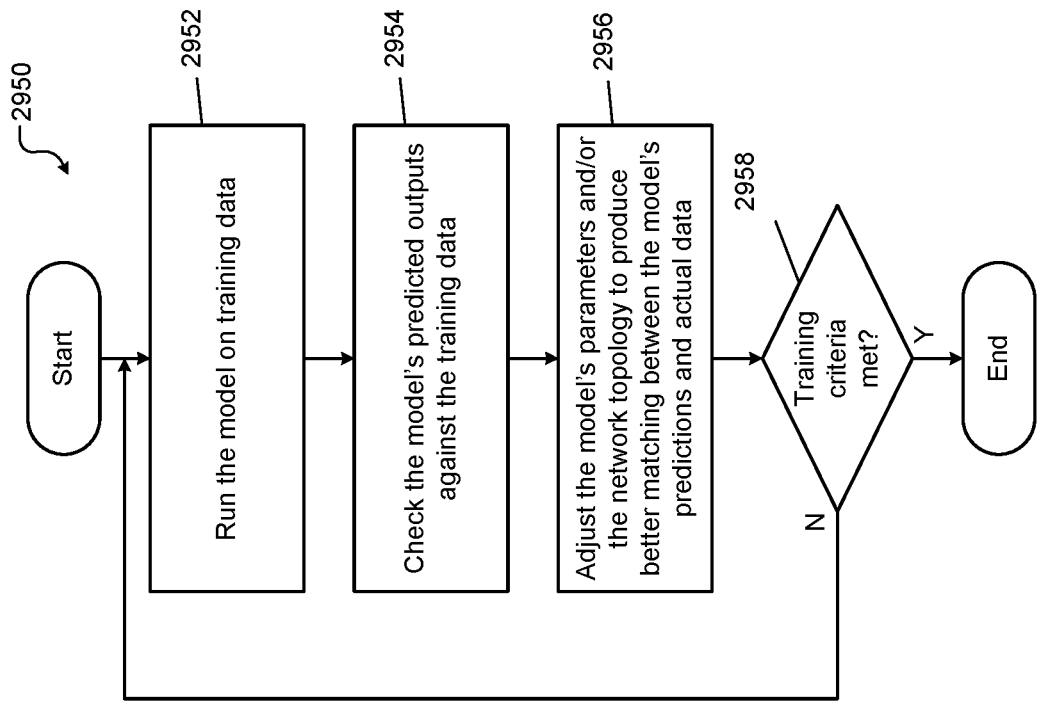
FIGS. 15A and 15B are flowcharts showing examples of methods for generating, training, and validating models.
Figure 15A:
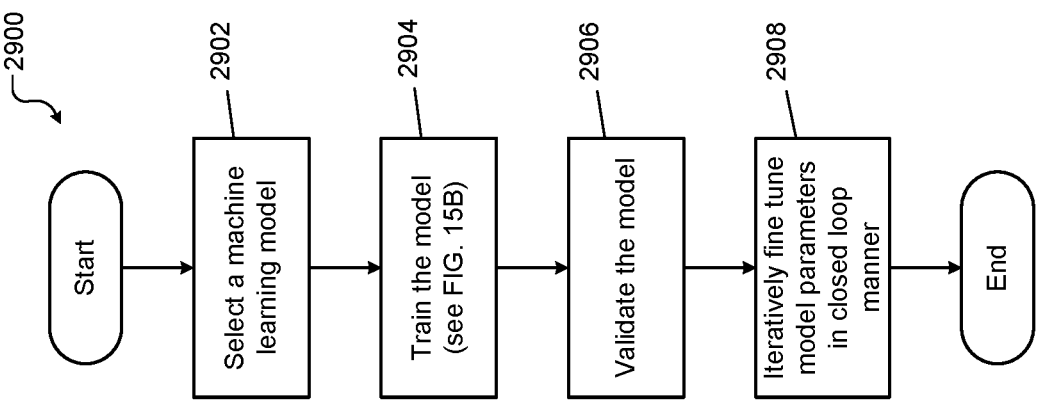

FIGS. 15A and 15B show examples of methods for generating, training, and validating models such as those described with reference to FIGS. 12A-14I above. These methods are performed by one or more applications executed by the servers 2030, which are referred to as control in the following description of the methods.

FIG. 15A shows a method 2900 for generating a model. At 2902, control selects a machine learning model (e.g., supervised or unsupervised classification or regression model, e.g. deep neural network, tensor flow, etc.) to define and build a model. The machine learning model need not be a neural network. Some examples of machine learning algorithms that can be used include K-nearest neighbor, support vector machines, K-means clustering, deep neural networks, linear or non-linear regression, and so on. For example, control may define the model by selecting a network topology for a neural network.

Figure 16A:
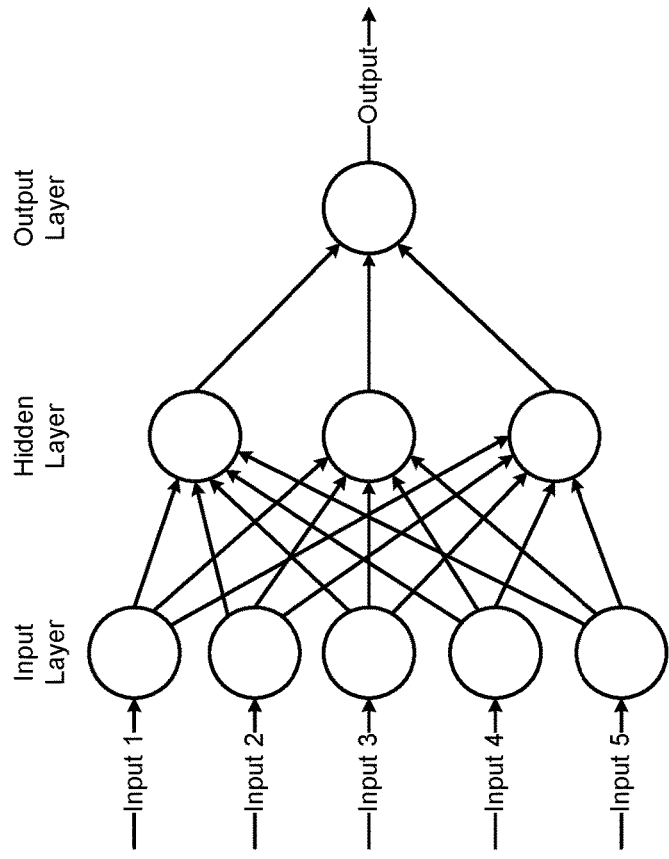
FIGS. 16A and 16B are graphical representations of example neural networks used to generate the models.
Figure 16B:
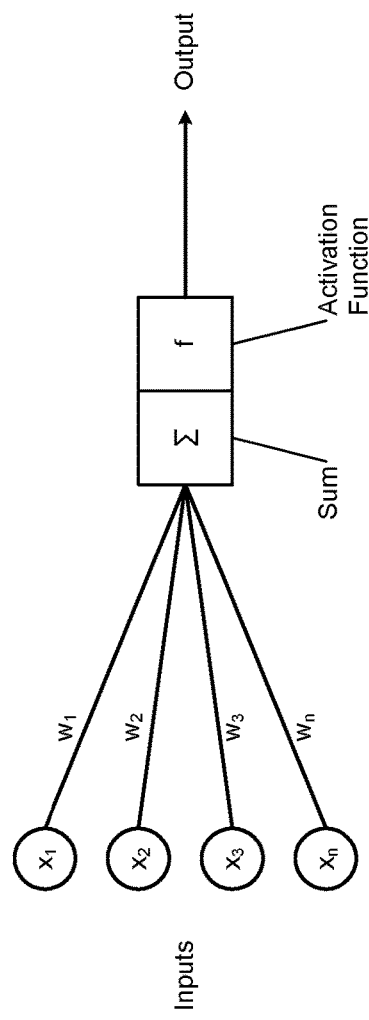

An example of a neural network is shown in FIG. 16A. For example, selecting a network topology includes selecting number of inputs, number of neurons, number of hidden layers, and number of outputs. FIGS. 16A and 16B and corresponding description below explain model generation in further detail. At 2904, control trains the model. FIG. 15B and corresponding description below explain model training in further detail. At 2906, control validates the model using any of the well-known validation methods such as K-fold cross-validation, leave-one-out cross-validation, re-substitution, bootstrapping, random subsampling, and so on. At 2908, control iteratively fine tunes model parameters in closed-loop manner.

FIG. 15B shows a method 2950 for training a model. At 2952, control runs the model on training data (e.g., data from laser sensors collected over a few months). At 2954, control checks the outputs predicted by the model against the labeled training data. At 2956, control adjusts the model's parameters and/or the network topology to produce better matching between the model's predictions and the actual data (e.g., to minimize the error between model predication and training data). At 2958, control determines whether the model meets some predetermined training criteria. Control returns to the 2952 if the model does not meet the predetermined training criteria. Control ends if the model meets the predetermined training criteria.

FIGS. 16A and 16B show an example of a neural network used to generate models such as those described above with reference to FIGS. 12A-14I using machine learning techniques. Machine learning is a method used to devise complex models and algorithms that lend themselves to prediction (e.g., predictions for tuning PM recipe parameters, scheduling service and replacement of components described above). The models generated using machine learning such as those described above with reference to FIGS. 12A-14I can produce reliable, repeatable decisions and results, and uncover hidden insights through learning from historical relationships and trends in the data.

The purpose of using the neural-network-based model and training the model using machine learning as described above with reference to FIGS. 12A-15B is to directly predict dependent variables without casting relationships between the variables into mathematical form. The neural network model includes a large number of virtual neurons operating in parallel and arranged in layers. The first layer is the input layer and receives input data. Each successive layer modifies outputs from a preceding layer and sends them to a next layer. The last layer is the output layer and produces output of the system.

FIG. 16A shows an example of a fully connected neural network, where each neuron in a given layer is connected to each neuron in a next layer. In the input layer, each input node is associated with a numerical value, which can be any real number. In each layer, each connection that departs from an input node has a weight associated with it, which can also be any real number (see FIG. 16B). In the input layer, the number of neurons equals number of features in a dataset. The output layer can have multiple continuous or discrete outputs.

Note that FIG. 16A shows only one non-limiting example of a neural network. The layers between the input and output layers are called hidden layers. The number of hidden layers can be one or more. For example, deep neural networks usually have many hidden layers. Further, while only one output neuron is shown for example only, multi-layer deep neural networks may have more number of output neurons.

The number of neurons can be optimized. At the beginning of training, a network configuration is more likely to have excess nodes. Some of the nodes may be removed from the network during training that would not noticeably affect network performance. For example, nodes with weights approaching zero after training can be removed (this process is called pruning). The number of neurons and layers should be chosen properly to avoid under-fitting (inability to adequately capture signals in dataset) or over-fitting (insufficient information to train all neurons; network performs well on the training dataset but not on the test dataset).

Various methods and criteria can be used to measure performance of a model. For example, root mean squared error (RMSE) measures the average distance between observed values and model predictions. Coefficient of Determination ($R^2$) measures correlation (not accuracy) between observed and predicted outcomes. This method may not be reliable if the data has a large variance. Other performance measures include irreducible noise, model bias, and model variance. A high model bias for a model indicates that the model is not able to capture true relationship between predictors and the outcome. Model variance can indicate whether a model is not stable (a slight perturbation in the data will significantly change the model fit).

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate.

The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

The program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein.

An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a laser sensor arranged in the substrate processing system, wherein the laser sensor is configured to:
capture first data and second data from a component used in a processing chamber of the substrate processing system at first and second times, respectively;
wherein the component includes at least one of a semiconductor substrate and an edge coupling ring used with the semiconductor substrate;
wherein the component is used in the processing chamber during a process performed in the processing chamber between the first and second times; and
a controller configured to:
receive the first data and the second data from the laser sensor;
measure a change in a geometric parameter of the component based on the first data and the second data;
transmit the measured change to a remote server via a network, wherein the remote server includes a model trained to recommend an adjustment to a parameter of at least one of the process and the processing chamber based on the measured change;
receive the adjustment to the parameter from the remote server via the network; and
initially adjust the parameter of the processing chamber and then adjust the parameter of the process, or initially adjust the parameter of the processing chamber and then adjust the parameter of the process.

2. The substrate processing system of claim 1 wherein the first data and the second data include a measurement performed at a point, along a line, or across an area of the component.

3. The substrate processing system of claim 1 wherein the geometric parameter includes thickness, flatness, or surface roughness of the component.

4. The substrate processing system of claim 1 wherein the controller is configured to determine a non-uniformity of at least one of an etch rate of the process and a deposition rate of the process based on the measured change, and wherein the adjustment minimizes the non-uniformity of the at least one of the etch rate of the process and the deposition rate of the process.

5. The substrate processing system of claim 1 wherein the parameter of the process is selected from a group consisting of gas flow, pressure, upper electrode temperature, substrate support temperature distribution, bias voltage, etch/deposition rate, and etch/deposition uniformity.

6. The substrate processing system of claim 1 wherein the parameter of the processing chamber is selected from a group consisting of a height of the edge coupling ring above a substrate support assembly in the processing chamber, tilt of the edge coupling ring, a gap between upper and lower electrodes of the processing chamber, alignment between the upper and lower electrodes, and tilt between the upper and lower electrodes.

7. The substrate processing system of claim 1 wherein the measured change indicates variation in quality of the process used to clean the processing chamber, wherein the adjustment to the parameter of the process minimizes the variation, and wherein the parameter includes one or more of a duration and a frequency of the process.

8. A substrate processing system comprising:
a laser sensor arranged in the substrate processing system, wherein the laser sensor is configured to:
capture first data and second data from a component used in a processing chamber of the substrate processing system at first and second times, respectively;
wherein the component includes at least one of a semiconductor substrate and an edge coupling ring used with the semiconductor substrate;
wherein the component is used in the processing chamber during a process performed in the processing chamber between the first and second times; and
a controller configured to:
receive the first data and the second data from the laser sensor;
measure a change in a geometric parameter of the component based on the first data and the second data;
transmit the measured change to a remote server via a network, wherein the remote server includes a model trained to recommend an adjustment to a parameter of at least one of the process and the processing chamber based on the measured change;
receive the adjustment to the parameter from the remote server via the network;
perform the adjustment to the parameter of the at least one of the process and the processing chamber;
determine a profile of an inner diameter of the edge coupling ring based on the first data and the second data, wherein the profile is indicative of a malfunction of an assembly of the processing chamber;
transmit the profile to the remote server;
receive an indication from the remote server to service the assembly based on the profile; and
generate a message to service the assembly based on the indication.

9. A system comprising:
a processor; and
memory comprising instructions which when executed by the processor configure the processor to:
receive first data and second data captured by a laser sensor from a component used in a processing chamber of the substrate processing system at first and second times, respectively; wherein the component includes at least one of a semiconductor substrate and an edge coupling ring used with the semiconductor substrate; and wherein the component is used in the processing chamber during a process performed in the processing chamber between the first and second times;

measure a change in a geometric parameter of the component based on the first data and the second data;

input the measured change to a model trained to recommend an adjustment to a parameter of at least one of the process and the processing chamber based on the measured change;

receive the adjustment to the parameter from the model; and initially adjust the parameter of the process and then adjust the parameter of the processing chamber, or initially adjust the parameter of the processing chamber and then adjust the parameter of the process.

10. The system of claim 9 wherein the first data and the second data include a measurement performed at a point, along a line, or across an area of the component.

11. The system of claim 9 wherein the geometric parameter includes thickness, flatness, or surface roughness of the component.

12. The system of claim 9 wherein the instructions further configure the processor to determine a non-uniformity of at least one of an etch rate of the process and a deposition rate of the process based on the measured change, wherein the adjustment minimizes the non-uniformity of the at least one of the etch rate of the process and the deposition rate of the process.

13. The system of claim 9 wherein the instructions further configure the processor to select the parameter of the process from a group consisting of gas flow, pressure, upper electrode temperature, substrate support temperature distribution, bias voltage, etch/deposition rate, and etch/deposition uniformity.

14. The system of claim 9 wherein the instructions further configure the processor to select the parameter of the process from a group consisting of a height of the edge coupling ring above a substrate support assembly in the processing chamber, tilt of the edge coupling ring, a gap between upper and lower electrodes of the processing chamber, alignment between the upper and lower electrodes, and tilt between the upper and lower electrodes.

15. The system of claim 9 wherein the measured change indicates variation in quality of the process used to clean the processing chamber, wherein the adjustment to the parameter of the process minimizes the variation, and wherein the parameter includes one or more of a duration and a frequency of the process.

16. The system of claim 9 wherein the instructions further configure the processor to:

determine a profile of an inner diameter of the edge coupling ring based on the first data and the second data, wherein the profile is indicative of a malfunction of an assembly of the processing chamber;

transmit the profile to the model;

receive an indication from the model to service the assembly based on the profile; and generate a message to service the assembly based on the indication.

* * * * *